United States Patent
Konishi et al.

(10) Patent No.: US 10,276,765 B2
(45) Date of Patent: Apr. 30, 2019

(54) SUBSTRATE FOR LIGHT EMITTING DEVICES, LIGHT EMITTING DEVICE, AND METHOD FOR PRODUCING SUBSTRATE FOR LIGHT EMITTING DEVICES

(71) Applicant: Sharp Kabushiki Kaisha, Osaka-shi, Osaka (JP)

(72) Inventors: Masahiro Konishi, Osaka (JP); Shin Itoh, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/104,649

(22) PCT Filed: Nov. 11, 2014

(86) PCT No.: PCT/JP2014/079848
§ 371 (c)(1),
(2) Date: Jun. 15, 2016

(87) PCT Pub. No.: WO2015/098322
PCT Pub. Date: Jul. 2, 2015

(65) Prior Publication Data
US 2016/0315235 A1    Oct. 27, 2016

(30) Foreign Application Priority Data

Dec. 27, 2013 (JP) .................................. 2013-273287
Apr. 23, 2014 (JP) .................................. 2014-089620

(51) Int. Cl.
*H01L 33/64* (2010.01)
*H01L 21/027* (2006.01)
(Continued)

(52) U.S. Cl.
CPC ................. *H01L 33/60* (2013.01); *C23C 4/10* (2013.01); *C23C 28/32* (2013.01); *C23C 28/345* (2013.01);
(Continued)

(58) Field of Classification Search
CPC ....................................................... H01L 33/34
(Continued)

(56) References Cited

U.S. PATENT DOCUMENTS

2009/0078455 A1    3/2009 Takakusaki et al.
2010/0072511 A1*   3/2010 Lin ........................ H01L 21/486
                                                           257/99
(Continued)

FOREIGN PATENT DOCUMENTS

CN     101404276 A     4/2009
JP     59-149958 A     8/1984
(Continued)

OTHER PUBLICATIONS

Official Communication issued in International Patent Application No. PCT/JP2014/079848, dated Jan. 6, 2015.

*Primary Examiner* — Moazzam Hossain
*Assistant Examiner* — Omar F Mojaddedi
(74) *Attorney, Agent, or Firm* — Keating & Bennett, LLP

(57) ABSTRACT

A substrate (5A) includes an aluminum substrate body (10), a reflection layer (12) that is formed between an electrode pattern (20) which obtains electrical connection with a light emitting element (6) and the aluminum substrate body (10) and that contains first ceramics which reflect light from the light emitting element (6), and an intermediate layer (11) that contains second ceramics which are formed by thermal spraying and reinforces dielectric strength performance of the reflection layer (12).

14 Claims, 23 Drawing Sheets

(51) Int. Cl.
  *H01L 33/60* (2010.01)
  *C23C 4/10* (2016.01)
  *C23C 28/00* (2006.01)
  *H01L 33/54* (2010.01)
  *H01L 33/62* (2010.01)

(52) U.S. Cl.
  CPC .............. *H01L 33/54* (2013.01); *H01L 33/62* (2013.01); *H01L 33/641* (2013.01); *H01L 2224/48137* (2013.01); *H01L 2224/48227* (2013.01); *H01L 2224/49113* (2013.01)

(58) Field of Classification Search
  USPC .......................................................... 257/98
  See application file for complete search history.

(56) References Cited

U.S. PATENT DOCUMENTS

| | | | | |
|---|---|---|---|---|
| 2010/0276001 A1* | 11/2010 | Sawada | ................... | C22C 1/002 136/260 |
| 2011/0241049 A1* | 10/2011 | Tanida | ................... | H01L 33/60 257/98 |
| 2012/0113650 A1 | 5/2012 | Inoue | | |
| 2012/0273034 A1* | 11/2012 | Sato | ................... | H01L 31/0392 136/252 |
| 2013/0187182 A1* | 7/2013 | Muramatsu | ............. | H01L 33/60 257/98 |
| 2014/0327024 A1* | 11/2014 | Ishihara | ................. | H01L 24/97 257/98 |
| 2015/0155459 A1 | 6/2015 | Ishihara et al. | | |
| 2015/0311043 A1* | 10/2015 | Sun | ....................... | C23C 14/221 428/335 |

FOREIGN PATENT DOCUMENTS

| | | |
|---|---|---|
| JP | 2000-174350 A | 6/2000 |
| JP | 2006-332382 A | 12/2006 |
| JP | 2007-317701 A | 12/2007 |
| JP | 2012-69749 A | 4/2012 |
| JP | 2012-102007 A | 5/2012 |
| JP | 2013-153068 A | 8/2013 |
| WO | 2013/183693 A1 | 12/2013 |

* cited by examiner

SUBSTRATE FOR LIGHT EMITTING DEVICES, LIGHT EMITTING DEVICE, AND METHOD FOR PRODUCING SUBSTRATE FOR LIGHT EMITTING DEVICES

TECHNICAL FIELD

The present invention relates to a substrate for light emitting devices that includes a substrate body formed of a metal material and an insulating layer which is formed to contain ceramics between an electrode pattern for obtaining electrical connection with a light emitting element and the substrate body and which reflects light from the light emitting element, a light emitting device that uses the substrate for light emitting devices, and a method for producing a substrate for light emitting devices, particularly to a substrate for light emitting devices that is preferably provided to light emitting devices, a light emitting device that uses the substrate for light emitting devices, and a method for producing a substrate for light emitting devices.

BACKGROUND ART

High reflectance, high heat dissipation, dielectric strength, and long-term reliability may be raised as characteristics that a substrate used for light emitting devices has to basically have. Particularly, a substrate for light emitting devices that is used for high luminance illumination has to have high dielectric strength.

In related art, as a substrate for light emitting devices, a ceramic substrate, a substrate that includes an organic resist layer as an insulating layer on a metal substrate body, or the like has been known. A description will be made about configurations of a ceramic substrate and a substrate that uses a metal substrate body.

(Ceramic Substrate)

For example, a ceramic substrate is fabricated by forming an electrode pattern on a plate-shaped ceramic substrate body. Accompanying the tendency of the output increase of light emitting devices, the improvement in brightness has been pursued by arranging a large number of light emitting elements on a substrate. As a result, the size of ceramic substrates has been increasing every year.

Specifically, in a case where a common LED light emitting device used at input power of 30 W is realized by arranging blue LED elements with dimensions of approximately 650 μm×650 μm or dimensions around those on one substrate that is categorized into a medium size, for example, approximately 100 blue LED elements are necessary. One example of the ceramic substrate in which the approximately 100 blue LED elements are arranged is a ceramic substrate in a plane size of 20 mm×20 mm or larger and with a thickness of approximately 1 mm.

Further, in a case where an attempt is made to realize a brighter LED light emitting device at input power of 100 W or more, technical development based on such a size increase of the ceramic substrate results in the necessity of a larger ceramic substrate at least in a plane size of 40 mm×40 mm or larger, on which 400 or more blue LED elements may together be installed.

However, even if an attempt is made to realize the ceramic substrate in an increased size on a commercial basis in response to the demand of the above-described size increase of the ceramic substrate, the realization on a commercial basis has been difficult due to three problems of the strength of the ceramic substrate, the production accuracy, and the producing cost.

Specifically, because a ceramic material is basically porcelain, a problem of strength occurs to the ceramic substrate in an increased size. In a case where the ceramic substrate is thicken to overcome the problem, new problems occur that the thermal resistance increases (the heat dissipation degrades) and at the same time the material cost of the ceramic substrate rises. Further, in a case where the size of the ceramic substrate is increased, not only the external dimensions of the ceramic substrate but also the dimensions of the electrode pattern formed on the ceramic substrate are likely to become inaccurate. This results in a problem that the production yield of the ceramic substrate decreases and the production cost of the ceramic substrate is likely to rise.

(Substrate Using Metal Substrate Body)

Further, for example, there is a case where a highly thermally conductive metal substrate body is used as a substrate that is used for a high-output light emitting device for the purpose of overcoming the above problems with the ceramic substrate. Here, in order to install a light emitting element on a metal substrate body, an insulating layer has to be provided on the metal substrate body to form an electrode pattern to be connected with the light emitting element. Further, the insulating layer has to have high light reflectivity in order to improve the light use efficiency in a substrate for high-output light emitting devices.

An organic resist is raised as a material used as the insulating layer in related art in the substrate for high-output light emitting devices. Further, a layer that serves as both of light reflection layer and insulating layer may be formed by using ceramic-based paint.

In a case of using an organic resist that is used as the insulating layer in related art in the substrate for high-output light emitting devices, sufficient thermal conduction, heat resistance, or light resistance may not be obtained, and dielectric strength necessary for the substrate for high-output light emitting devices may not be obtained either. Further, light that leaks toward the metal substrate body side via the insulating layer has to be reflected in order to improve the light use efficiency. However, sufficient light reflectivity may not be obtained in a configuration that uses an organic resist in related art as the insulating layer.

Differently, in a case where the layer that serves as both of light reflection layer and insulating layer is formed on the metal substrate body in the substrate for high-output light emitting devices by using ceramic-based paint, a substrate for light emitting devices that has proper reflectance, heat resistance, and light resistance may be realized. PTL 1 discloses a formation method of a layer that serves as both of light reflection layer and insulating layer, in which ceramic-based paint is coated onto a substrate body.

Further, although not limited to paint, for example, PTLs 2 to 4 disclose substrates for light emitting devices in which the layer that serves as both of light reflection layer and insulating layer and is formed of ceramics is formed on a metal substrate body by coating or spraying.

CITATION LIST

Patent Literature

PTL 1: Japanese Unexamined Patent Application Publication No. 59-149958 (laid open on Aug. 28, 1984)
PTL 2: Japanese Unexamined Patent Application Publication No. 2012-102007 (laid open on May 31, 2012)
PTL 3: Japanese Unexamined Patent Application Publication No. 2012-69749 (laid open on Apr. 5, 2012)

PTL 4: Japanese Unexamined Patent Application Publication No. 2006-332382 (laid open on Dec. 7, 2006)

PTL 5: Japanese Unexamined Patent Application Publication No. 2007-317701 (laid open on Dec. 6, 2007)

SUMMARY OF INVENTION

Technical Problem

However, the substrate for light emitting devices, in which the layer that serves as both of light reflection layer and insulating layer and is formed of ceramics is formed on the metal substrate body by coating or spraying paint having ceramic particles dispersed in a medium onto the metal substrate body, has a problem that reflectance, heat resistance, and light resistance are high but dielectric strength is low. For example, in a case where an attempt is made to realize a light emitting device for bright LED illumination at input power of 100 W or more by the substrate for light emitting devices, differently from a ceramic substrate, high dielectric strength necessary for the substrate for light emitting devices for use for high luminance illumination may not be secured. This is due to the following reasons.

In a high luminance type light emitting device that requests brightness, it is common to connect light emitting elements in series and cause them to emit light at a high voltage. In view of avoidance of short circuit and safety, such a light emitting device as a whole requests the dielectric strength of 4 to 5 kV or higher, for example, and equivalent dielectric strength is often requested for the substrate for light emitting devices.

Because the insulating layer of the ceramic substrate is thick, the dielectric strength adequate for an illumination device of the above high luminance type may easily be obtained. On the other hand, in a case of the substrate for light emitting devices in which the layer that serves as both of light reflection layer and insulating layer is formed on a surface of the metal substrate body by using the ceramic-based paint, it is difficult to form the layer that serves as both of light reflection layer and insulating layer, and it is thus difficult to reproduce the substrate for light emitting devices with stable dielectric strength.

A ceramic-based paint that uses a glass binder is raised as ceramic-based paint that is used on metal with a low melting point such as aluminum.

In this case, the sol-gel method is used, and a vitreous membrane may thereby be synthesized at a much lower temperature than the melting temperature of glass while the ceramic-based paint does not go through a molten state. That is, in a case where the ceramic-based paint is fired at a low temperature such as 200° C. to 500° C., a ceramic layer, actually, a mixed layer of ceramics and a vitreous material may be formed such that ceramic particles are covered by the vitreous material. However, a vitreous material in a gel state obtained by drying a glass raw material in a sol state is a porous membrane. Sintering allows considerable pores to disappear. However, pores may not completely be closed in a thin membrane even after sintering, and the mixed layer of ceramics and a vitreous material may have impaired dielectric strength.

Then, in a case where an attempt is made to stably secure necessary high dielectric strength by increasing the thickness of the layer that serves as both of light reflection layer and insulating layer, a problem then occurs that the thermal resistance becomes high and heat dissipation degrades. Further, in a case where an attempt is made to form a thick membrane of the layer that serves as both of light reflection layer and insulating layer by the sol-gel method, the membrane becomes subject to cracking, and the dielectric strength degrades as well.

In a method for synthesizing a ceramic layer covered by a vitreous material with using a method other than the sol-gel method, a mixture of ceramic particles and glass particles with a low melting point may be used. The glass particles with a low melting point are once molten and thereafter cured, and a glass layer that contains ceramic particles is thereby formed. However, because a temperature of approximately 800° C. to 900° C. is necessary even for glass with a low melting point, common metal with a low melting point such as aluminum may not endure the process.

PTL 5 discloses a substrate for a light source in which an insulating layer formed of ceramics such as alumina is formed on a metal substrate body by plasma thermal spraying. The substrate for a light source in which the insulating layer of alumina is formed by the plasma thermal spraying realizes a substrate for a light source with high electrical dielectric strength.

However, the substrate for a light source which is disclosed in PTL 5 and in which the insulating layer of alumina is formed by the plasma thermal spraying has high electrical dielectric strength, but the reflectance is approximately 82% to 85% even if the best alumina membrane is obtained. This leads to a problem that the reflectance is low for the substrate for light emitting devices that is used for high luminance illumination which requests reflectance of 90% or higher or even 95% or higher.

Further, as illustrated in FIG. 19, a surface of the ceramic layer of alumina or the like, which is laminated by the plasma thermal spraying, is likely to be unevenly formed. FIG. 19 is a schematic cross-sectional view of a substrate 200 in related art. In the substrate 200, a ceramic layer 201 is formed as an insulating layer on a substrate body 210 by the plasma thermal spraying, and a light emitting element 206 is installed further on the ceramic layer 201. In a case where the substrate body 210 is a metal substrate body, surface roughening of a surface of the substrate body 210 by sandblasting or the like as a pretreatment is necessary for increasing the adhesion of the ceramic layer 201 when the ceramic layer 201 is laminated on the substrate body 210 by thermal spraying. Unevenness on a border between the substrate body 210 and the ceramic layer 201 in FIG. 19 is an uneven surface that is formed by the surface roughening. Further, laminating ceramics by the thermal spraying is likely to result in an uneven surface of the ceramic layer 201. Thus, in addition to the presence of the uneven surface due to the pretreatment on the border between the substrate body 210 and the ceramic layer 201, the surface of the ceramic layer 201 becomes uneven as illustrated in FIG. 19. In a case where the light emitting element 206 is installed on such an uneven surface, the light emitting element 206 makes point contact with the insulating layer formed of the ceramic layer 201, a thermal resistance region is generated in a border portion, and thereby the temperature of the light emitting element 206 rapidly rises. Further, in a case where the light emitting element 206 is attached to such an uneven surface by a usual method, for example, by using a die bonding paste, sufficient adhesive strength may not be obtained, the light emitting element 206 is easily detached due to a thermal history in actual use conditions, and thus the thermal resistance further rises. As described above, the substrate 200 illustrated in FIG. 19 is insufficient as the substrate for light emitting devices for high luminance illumination because a high thermal resistance region easily emerges.

As described above, there is a problem that a substrate with low thermal resistance and high heat dissipation and with high reflectance and dielectric strength is not present at least in a form suitable for mass production, among substrates for light emitting devices in related art that use a metal substrate body.

Further, life shortening of the light emitting element in accordance with the difference in the linear expansion coefficient between the light emitting element and the substrate body may be raised as another problem of cases where the metal substrate body is used. For example, sapphire, gallium nitride, and so forth may be raised as representative materials of a substrate for forming a blue light emitting element. The linear expansion coefficients of those inorganic substances are smaller than metal such as aluminum or copper, and there is a large difference in the linear expansion coefficient between both of those. Thus, when a load due to a temperature cycle is applied, an output decrease, that is, shortening of life of the light emitting element occurs.

The present invention has been made in consideration of the above problems in related art, and an object thereof is to provide a substrate for light emitting devices that has long-term reliability with high reflectance, high heat dissipation, high dielectric strength, thermal resistance, and light resistance and further with high mass productivity, a light emitting device that uses the substrate for light emitting devices, and a producing method for producing the substrate for light emitting devices.

Solution to Problem

To solve the above problems, a substrate for light emitting devices according to one aspect of the present invention includes: a substrate body that is formed of a metal material; a first insulating layer that is formed between an electrode pattern which obtains electrical connection with a light emitting element and the substrate body and that contains first ceramics which reflect light from the light emitting element; and a second insulating layer that contains second ceramics which are formed by thermal spraying and reinforces dielectric strength performance of the first insulating layer. Further, to solve the above problems, a substrate for light emitting devices according to one aspect of the present invention includes: a substrate body that is formed of a metal material; a first insulating layer that is formed between an electrode pattern which obtains electrical connection with a light emitting element and the substrate body and that contains first ceramics which reflect light from the light emitting element; a second insulating layer that is formed of thermally sprayed second ceramics and reinforces dielectric strength performance of the first insulating layer, the second insulating layer covering a portion of the substrate body; and a protection layer that covers a remaining portion of or whole the substrate body.

Advantageous Effects of Invention

The present invention provides an effect of enabling provision of a substrate for light emitting devices that has long-term reliability with high reflectance, high heat dissipation, high dielectric strength, thermal resistance, and light resistance and further with high mass productivity.

BRIEF DESCRIPTION OF DRAWINGS

FIG. 12 is a diagram that explains a modification example 1 of the substrate according to the third embodiment of the present invention, in which FIG. 12(a) is a plan view of the modification example 1 of the substrate according to the third embodiment of the present invention, FIG. 12(b) is an arrow cross-sectional view thereof taken along line E-E, and FIG. 12(c) is a partially enlarged view of the cross section.

FIG. 20 is a diagram that explains a modification example of the substrate according to the first embodiment of the present invention, in which FIG. 20(a) is a plan view of the modification example of the substrate according to the first embodiment of the present invention, FIG. 20(b) is an arrow cross-sectional view thereof taken along line F-F, and FIG. 20(c) is a partially enlarged view of the cross section.

FIG. 21 is a diagram that explains a modification example of the substrate according to the second embodiment of the present invention, in which FIG. 21(a) is a plan view of the modification example of the substrate according to the second embodiment of the present invention, FIG. 21(b) is an arrow cross-sectional view thereof taken along line G-G, and FIG. 21(c) is a partially enlarged view of the cross section.

FIG. 22 is a diagram that explains a modification example 2 of the substrate according to the third embodiment of the present invention, in which FIG. 22(a) is a plan view of the modification example 2 of the substrate according to the third embodiment of the present invention, FIG. 22(b) is an arrow cross-sectional view thereof taken along line H-H, and FIG. 22(c) is a partially enlarged view of the cross section.

FIG. 23 is a diagram that explains another example of the modification example 2 of the substrate according to the third embodiment of the present invention, in which FIG. 23(a) is a plan view of the other example of the modification example 2 of the substrate according to the third embodiment of the present invention, FIG. 23(b) is an arrow cross-sectional view thereof taken along line I-I, and FIG. 23(c) is a partially enlarged view of the cross section.

DESCRIPTION OF EMBODIMENTS

Embodiments of the present invention will hereinafter be described in detail.

[First Embodiment]

Figure 1:
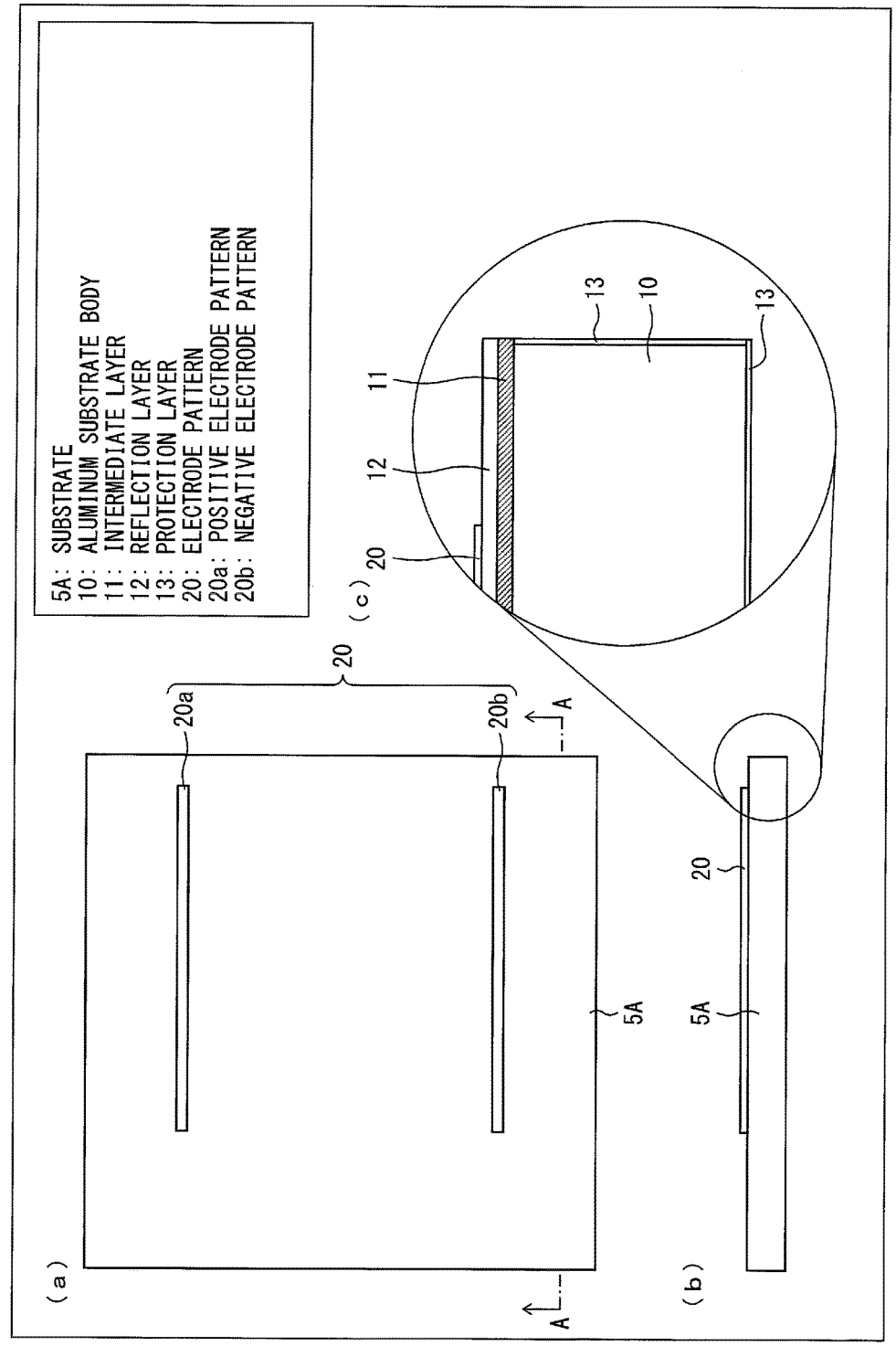
FIG. 1(a) is a plan view of a substrate according to a first embodiment of the present invention.
FIG. 1(b) is an arrow cross-sectional view thereof taken along line A-A.
FIG. 1(c) is a partially enlarged view of the cross section.
Figure 2:
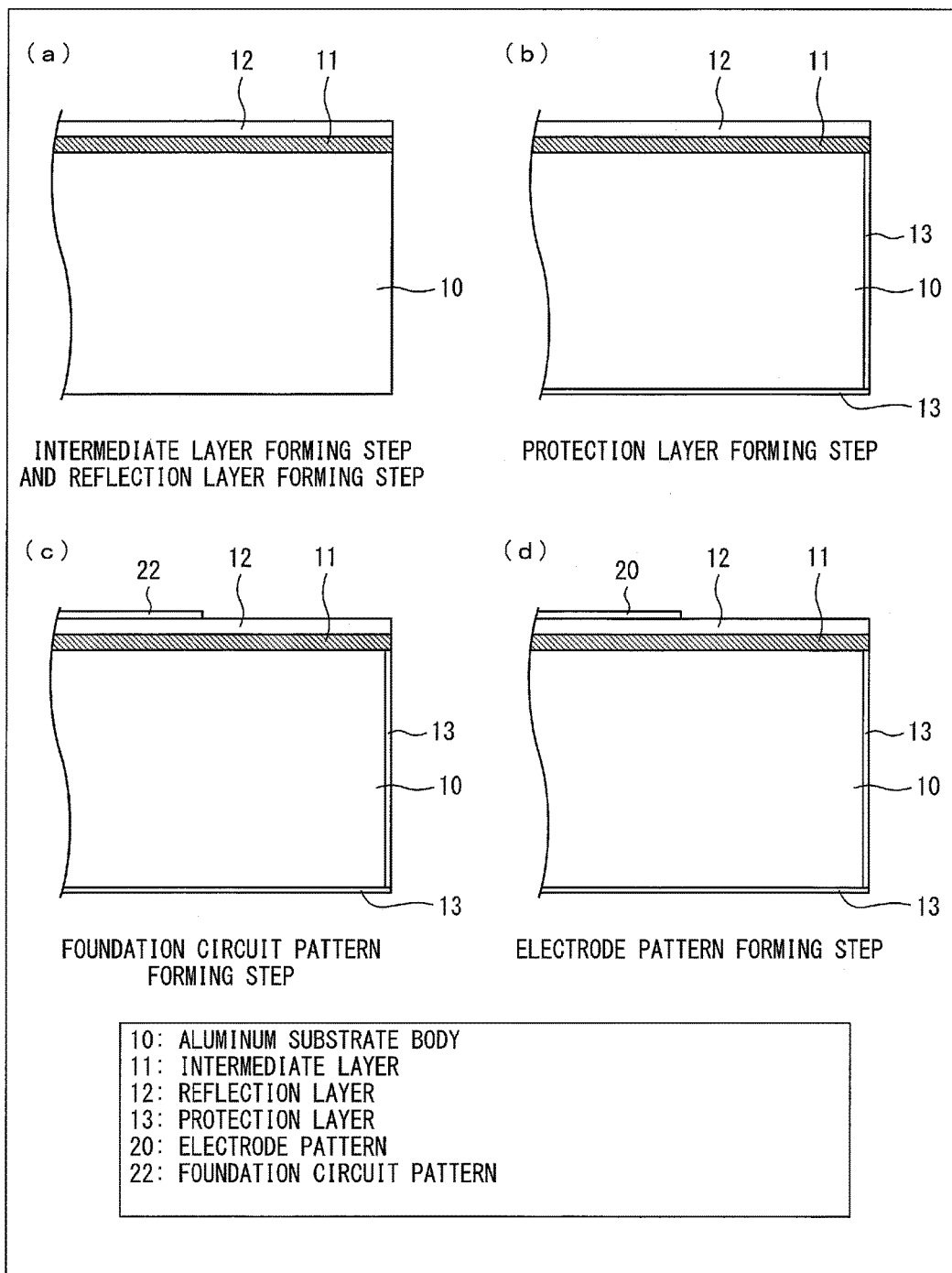
FIGS. 2(a) to 2(d) are schematic cross-sectional views that explain producing steps of the substrate according to the first embodiment of the present invention.

A first embodiment will be described below based on FIGS. 1 and 2.

(Structure of Substrate 5A)

A structure of a substrate 5A according to a first embodiment will be described with reference to FIG. 1. FIG. 1(a) is a plan view of the substrate 5A (a substrate for light emitting devices) according to this embodiment, and FIG. 1(b) is an arrow cross-sectional view of FIG. 1(a) taken along line A-A. Further, FIG. 1(c) is a partially enlarged view of FIG. 1(b).

Figure 16:
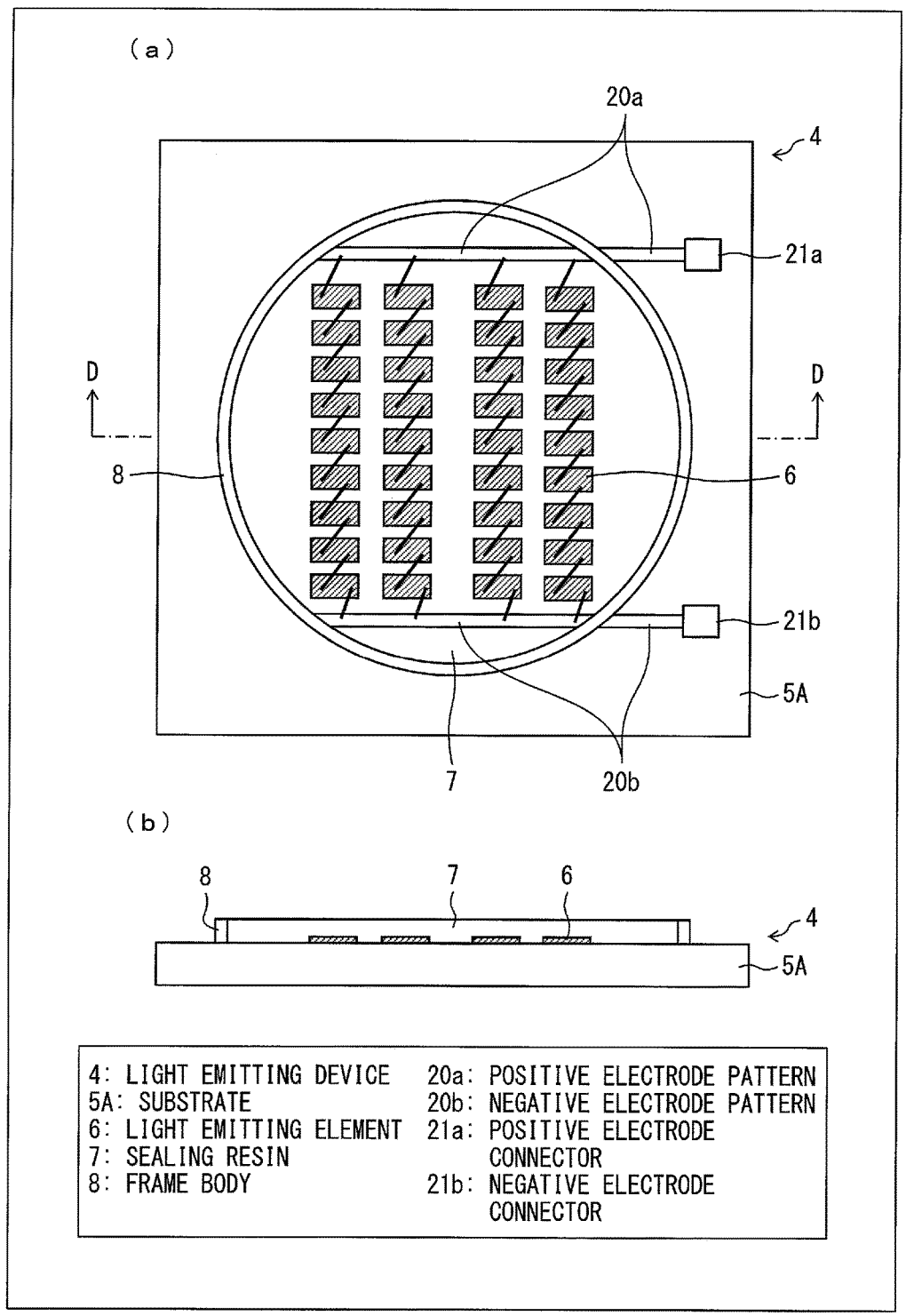
FIG. 16(a) is a plan view of a light emitting device according to a sixth embodiment of the present invention.
FIG. 16(b) is an arrow cross-sectional view thereof taken along line D-D.

The substrate 5A is used for a light emitting device 4 (see FIG. 16) in which a light emitting element 6 (see FIG. 16) is arranged on the substrate 5A. One example of the light emitting device 4 is illustrated in FIG. 16. In each of the drawings, dimensions, shapes, and numbers are not necessarily the same as actual substrate, light emitting element, and light emitting device. The light emitting device 4 that uses the substrate 5A will be described in a sixth embodiment.

As illustrated in FIG. 1(c), an intermediate layer 11 (second insulating layer), a reflection layer 12 (first insulating layer), and an electrode pattern 20 are formed in this order on a surface of an aluminum substrate body 10 (substrate body).

The intermediate layer 11 is formed to cover a front surface (with FIG. 1(c) being a reference) of the aluminum substrate body 10. The reflection layer 12 is formed on an upper surface of the intermediate layer 11 on the surface of the aluminum substrate body 10. In other words, the intermediate layer 11 is formed between the reflection layer 12 and the aluminum substrate body 10.

Further, a protection layer (aluminum anodic oxide coating) 13 is formed on a lower end surface (with FIG. 1(c) being the reference) of the aluminum substrate body 10 and side end surfaces (with FIG. 1(c) being the reference) of the aluminum substrate body 10. That is, the protection layer 13 is formed on the surfaces other than the surface on which the intermediate layer 11 is formed. In other words, a surface on the opposite side from the surface of the aluminum substrate body 10 on which the reflection layer 12 is formed (a surface opposed to the surface on the side on which the reflection layer 12 is formed) and the side end surfaces of the aluminum substrate body 10 are covered by the protection layer 13, and the surface other than the surface of the aluminum substrate body 10 on which the protection layer 13 is formed is covered by the intermediate layer 11.

The electrode pattern 20 is formed on the reflection layer 12. As illustrated in FIGS. 1(a) and 1(b), the electrode pattern 20 has a positive electrode pattern 20a and a negative electrode pattern 20b. The electrode pattern 20 is formed with a foundation circuit pattern (not illustrated) formed of a conductive layer and plating that covers the foundation circuit pattern. The electrode pattern 20 is wiring for obtaining electrical connection with the light emitting element 6 (see FIG. 16) arranged on the substrate 5A. As illustrated in FIG. 16, the light emitting element 6 is connected with the electrode pattern 20 by a wire, for example.

This embodiment has a characteristic that the intermediate layer 11 as a thermally conductive ceramic insulator and the reflection layer 12 as a light reflective ceramic insulator are formed as an insulating layer between the electrode pattern 20 and the aluminum substrate body 10. Further, the intermediate layer 11 is formed between the reflection layer 12 and the aluminum substrate body 10. The above configuration enables the substrate 5A to stably secure high dielectric strength performance. Each of the layers will specifically be described below.

(Aluminum Substrate Body 10)

As the aluminum substrate body 10, an aluminum plate with a vertical length of 50 mm, a horizontal length of 50 mm, and a thickness of 3 mmt may be used, for example. The light weight, high processability, and high thermal conductivity are raised as advantages of aluminum materials. The aluminum substrate body 10 may contain components other than aluminum to the extent that an anodic oxidation treatment for forming the protection layer 13 is not hindered.

Materials of the substrate body are not limited to the above. It is sufficient that the material is a metal material with a light weight, high processability, and high thermal conductivity. For example, a copper material may be used as a material for the substrate body.

(Protection Layer 13)

The protection layer 13 is an aluminum anodic oxide coating (anodized aluminum).

In producing steps of the substrate 5A, the protection layer 13 protects the aluminum substrate body 10 from a plating solution in a plating treatment necessary for forming the electrode pattern 20 and simultaneously functions as a protection layer that reduces deposition of extra plating. After the substrate 5A is completed, the protection layer 13 avoids corrosion of the aluminum substrate body 10 due to oxidation.

(Reflection Layer 12)

The reflection layer 12 contains light reflective ceramics (first ceramics) that reflect light from the light emitting element 6 (see FIG. 16) and has insulation characteristics. Thus, the reflection layer 12 reflects light from the light emitting element 6 (see FIG. 16). Further, the reflection layer 12 is formed between the electrode pattern 20 and the intermediate layer 11, in other words, between the electrode pattern 20 and the aluminum substrate body 10. Ceramic particles are mixed with a glass-based binder or a resin binder with light resistance and heat resistance, the binder is cured by drying, firing, or the like, and the reflection layer 12 is thereby formed in an outermost layer of the substrate 5A as an insulative reflection layer that contains ceramic particles. In this embodiment, the reflection layer 12 is a mixed layer of the light reflective ceramics and a vitreous material. The reflection layer 12 contains zirconia as the light reflective ceramics and is formed by sintering or the like by using the glass-based binder.

The glass-based binder is formed of a sol state substrate from which glass particles are synthesized by a sol-gel reaction. The resin binder is configured with epoxy resin, silicone resin, or fluororesin with high heat resistance, high light resistance, and high transparency. Because the glass-based binder has high heat resistance, high light resistance, and high thermal conductivity compared to the resin binder, the glass-based binder is preferably used.

The firing temperature of the glass-based binder used in a sol-gel method is relatively low 200° C. to 500° C. In a case where the glass-based binder is used for the reflection layer 12 and where an appropriate temperature is selected, the aluminum substrate body 10 or the intermediate layer 11 is not damaged in the producing steps. Further, also in a case where the resin binder is used for the reflection layer 12, the aluminum substrate body 10 or the intermediate layer 11 is not damaged, similarly.

As major light reflective ceramic materials used for the light reflection layer 12, titanium oxide particles, alumina particles, aluminum nitride particles, and so forth are raised other than zirconia particles. Further, other high reflective ceramic materials may be used.

The ceramic materials mentioned here are not limited to metal oxides but may be insulating materials that reflect light from the light emitting element 6 (see FIG. 16). For example, ceramics in a broad sense which include aluminum nitride and so forth, that is, general inorganic solid materials are included. An arbitrary substance among those inorganic solid materials may be used as the light reflective ceramic material of the reflection layer 12 as long as the substance is a stable substance with high heat resistance and thermal conduction and with high light reflection and light scattering. Thus, a material that absorbs light is not appropriate as the ceramic material for the reflection layer 12. For example, silicon nitride, silicon carbide, and so forth are generally black in color and are not appropriate for the ceramic material used for the reflection layer 12.

Further, the thickness of the reflection layer 12 is preferably set to approximately 50 μm or more to 100 μm or less, for example, in consideration of the reflectance of the substrate 5A. Because the thermal conductivity of the reflection layer 12 is low compared to the intermediate layer 11, the thickness of the reflection layer 12 is preferably set to a minimum necessary thickness that may secure a desired light reflection function. A thickness of 50 μm or more to 100 μm or less of the reflection layer 12 is appropriate for the thickness that achieves this purpose. However, in a case where unevenness is present in a surface of the intermediate layer 11, the reflection layer 12 may thickly be formed so that the reflection layer 12 covers the unevenness of the surface of the intermediate layer 11 to smooth a surface on which the light emitting element 6 is installed. Specifically, the reflection layer 12 may thickly be formed in consideration of the coverage for the unevenness of the surface of the intermediate layer 11. In this case, the thickness of the reflection layer 12 may be set to 110 μm or more to 160 μm or less in consideration of a fact that an extra thickness for the unevenness is about 60 μm or less.

(Intermediate Layer 11)

The intermediate layer 11 is formed by laminating a ceramic layer (second ceramics) on the aluminum substrate body 10 by thermal spraying and has insulation characteristics. In other words, the intermediate layer 11 contains ceramics formed by the thermal spraying. Further, as described above, it is possible that the reflection layer 12 has the minimum necessary thickness that may secure the light reflection function and thus has insufficient dielectric strength to meet the necessary dielectric strength for the substrate 5A. Accordingly, the intermediate layer 11 reinforces the dielectric strength, which is insufficient only with the reflection layer 12.

Specifically, the reflectance of the reflection layer 12 is saturated with a thickness about 10 μm or more to 100 μm or less although depending on the ceramic material that is mixed with the vitreous material or the resin and the amount of the ceramic material. Thus, the thickness of the intermediate layer 11 is preferably 50 μm or more to 500 μm or less although depending on formation conditions of the intermediate layer 11.

For example, in a case where the thickness of the intermediate layer 11 is 100 μm, only the intermediate layer 11 may secure dielectric strength of at least 1.5 to 3 kV or higher. In a case where the thickness of the intermediate layer 11 is 500 μm, only the intermediate layer 11 may secure dielectric strength of at least 7.5 to 15 kV. The thickness of the intermediate layer 11 may finally be decided such that the total dielectric strength of the dielectric strength of the reflection layer 12 and the dielectric strength of the intermediate layer 11 becomes desired dielectric strength. In this embodiment, the reflection layer 12 and the intermediate layer 11 are preferably configured such that the total dielectric strength becomes about 4 to 5 kV.

Further, alumina ($Al_2O_3$) that has both of proper thermal conductivity and dielectric strength and is suitable for formation of an electrical insulating membrane by the thermal spraying is most preferable for the ceramic material used for the intermediate layer 11. In this embodiment, alumina is used as the ceramic material used for the intermediate layer 11.

As the ceramic material used for the intermediate layer 11, aluminum nitride, silicon nitride, and so forth other than alumina are preferable because those have proper thermal conductivity and dielectric strength. For example, silicon carbide has high thermal conductivity, and zirconia and titanium oxide have high dielectric strength. Thus, silicon carbide, zirconia, or titanium oxide may selectively be used as the ceramic material used for the intermediate layer 11 in accordance with the purpose and use.

Ceramic materials mentioned here are not limited to metal oxides but include ceramics in a broad sense which include aluminum nitride, silicon nitride, silicon carbide, and so forth, that is, general inorganic solid materials. An arbitrary substance among those inorganic solid materials may be used as the ceramic material used for the intermediate layer 11 as long as the substance is a stable substance with high heat resistance and thermal conduction and with high dielectric strength.

The ceramic material used for the intermediate layer 11 preferably has higher thermal conductivity than the ceramic material used for the reflection layer 12. As described above, in this embodiment, the zirconia particles are used as the ceramic material of the reflection layer 12. Differently from the zirconia particles of the reflection layer 12, alumina is used for the intermediate layer 11. The thermal conductivity of alumina is higher than the thermal conductivity of zirconia. Thus, the thermal conductivity of the intermediate layer 11 may be increased compared to the reflection layer 12 while high dielectric strength is maintained.

Further, as described above, the intermediate layer 11 is formed by laminating a ceramic layer on the aluminum substrate body 10 by the thermal spraying. Aluminum is low melting point metal with a melting point of 660° C., and ceramics are usually sintered at a higher temperature than the melting point. Thus, a sintered body of ceramics may not directly be sintered on the aluminum substrate body 10.

However, for example, a thermal spraying scheme such as high velocity flame thermal spraying or plasma thermal spraying, which will be described later, is used, and a layer formed only of ceramics may thereby be easily formed (laminated) without sintering the sintered body of ceramics directly on the aluminum substrate body 10. Further, the substrate body temperature of the aluminum substrate body 10 in laminating is a maximum of approximately 200° C. in a case of the plasma thermal spraying and is a maximum of approximately 500° C. in a case of the high velocity flame thermal spraying. Thus, the ceramic layer may be laminated on the aluminum substrate body 10 at a sufficiently lower temperature than the melting point of 660° C. of aluminum. That is, the intermediate layer 11 formed only of ceramics may be formed on metal with a low melting point without using a binder that lowers the thermal conductivity such as the glass-based binder or the resin binder. Thus, the intermediate layer 11 has the same dielectric strength as a layer formed by using the glass-based binder or the resin binder while high thermal conductivity that the ceramic material such as alumina originally has is not impaired.

Further, the ceramic layer of the intermediate layer 11 is formed by the thermal spraying and thus becomes a fine ceramic layer whose porosity (the ratio of air pores in a formed membrane) used as an index of fineness of a layer (membrane) is low. Accordingly, the intermediate layer 11 may realize the insulating layer that stably secures high dielectric strength and simultaneously has high thermal conductivity with lower thermal resistance.

Specifically, the thermal conductivity of the ceramic layer (the intermediate layer 11) formed by the thermal spraying is close to the thermal conductivity of a ceramic substrate in related art, which is formed by sintering, and is a value of 10 to 30 W/(m·° C.), for example. On the other hand, the thermal conductivity of a layer formed by curing ceramic particles by using a glass or resin binder is usually approximately 1 to 3 W/(m·° C.) because of the influence of glass or resin whose thermal conductivity is low.

When the ceramic layer formed by using the thermal spraying is compared to the layer formed by curing ceramic particles by using the glass or resin binder, as described above, the thermal conductivity of the former (the ceramic layer formed by using the thermal spraying) is 10 times larger. Thus, the thermal resistance of the former is approximately 1/10 of the thermal resistance of the latter (the layer formed by curing ceramic particles by using the glass or resin binder), and the former with a layer thickness of 500 μm and the latter with a layer thickness of 50 μm are estimated to have the same thermal resistance. It may be considered that in a case where the dielectric strength performance for the thickness is the same, the heat dissipation is the same even if the former secures 10 times larger dielectric strength than the latter.

(Thermal Spraying)

The thermal spraying is a method in which molten particles obtained from a thermal spraying material that is heated to a molten state or a state close thereto is caused to collide with a substrate body surface at a high velocity and the molten particles are thereby laminated on the substrate body surface. The thermal spraying material is supplied to a thermal spraying device in a form of powder or a wire rod.

The thermal spraying is categorized into flame thermal spraying, arc thermal spraying, the plasma thermal spraying, the high velocity flame thermal spraying, and so forth in accordance with the method of heating the thermal spraying material for the thermal spraying. Cold spray in which a material is not molten and is caused to collide with a substrate material in a solid phase state by a supersonic flow together with inactive gas and a coating is thereby formed is categorized as one type of the thermal spraying. The high velocity flame thermal spraying, the plasma thermal spraying, and the flame thermal spraying are appropriate for the purpose of forming a ceramic layer on a metal substrate body. The high velocity flame thermal spraying, the plasma thermal spraying, and the flame thermal spraying will be described below.

(High Velocity Flame Thermal Spraying)

In the high velocity flame thermal spraying (high velocity oxygen fuel (HVOF)), for example, a fine alumina layer with high adhesion may be formed in a case where alumina is used as the thermal spraying material. Specifically, the porosity may be reduced to 1% or less, and high dielectric strength may stably be realized. The limit of the membrane thickness of a layer that may be obtained by this method is approximately 400 μm so far.

In the high velocity flame thermal spraying, oxygen and flammable gas are caused to burn in a combustion chamber at high pressure. Combustion flame is narrowed by a nozzle and rapidly expanded when the combustion flame comes out to the atmosphere. The molten thermal spraying material, for example, ceramic particles such as alumina, is contained in a high velocity air flow generated by rapid gas expansion due to the combustion flame coming out to the atmosphere, the thermal spraying material is projected at a high velocity onto a substrate body together with the high velocity air flow, and a layer of the thermal spraying material is thereby formed on the substrate body. As a result, a fine alumina layer may be formed, for example.

(Plasma Thermal Spraying)

In the plasma thermal spraying, working gas such as argon is ionized by arc discharge, and plasma is thereby generated. This plasma is used to heat and melt a thermal spraying material with a high melting point such as ceramic particles, for example, a plasma flow that spouts out from a nozzle and contains molten particles is accelerated and caused to collide with a substrate body at a high velocity, and a ceramic layer is thereby formed on the substrate body.

The temperature rise of the substrate body in forming the ceramic layer is a maximum of approximately 200° C.

Further, the porosity is approximately 1% to 5% and is slightly higher than the high velocity flame thermal spraying. Thus, in order to maintain the dielectric strength, attention has to be paid so that through-holes are not formed in the ceramic layer. For example, the ceramic layer may be thickly laminated until the through-holes are covered. Alternatively, thermal spraying conditions are adjusted by reducing a deposition rate or the like, and lamination may thereby be performed in a condition in which the through-holes are less likely to be generated.

(Flame Thermal Spraying)

In the flame thermal spraying, by using combustion flame of oxygen and flammable gas, molten ceramic particles, for example, are blown by compressed air and caused to collide with a substrate body, and a ceramic layer is thereby formed on the substrate body. The temperature rise of the substrate body in forming the ceramic layer is a maximum of approximately 100° C. and is low. However, the porosity is as high as 5% to 10%. Thus, in order to secure necessary dielectric strength, the layer has to be formed thicker than the ceramic layer formed by the high velocity flame thermal spraying or the plasma thermal spraying.

As described above, it may be considered that among the above-described three thermal spraying schemes, the ceramic layer is preferably formed by the high velocity flame thermal spraying or the plasma thermal spraying in order to form a fine ceramic layer with high dielectric strength.

(Method for Producing Substrate 5A According to First Embodiment)

A method for producing the substrate 5A according to the first embodiment will next be described with reference to FIG. 2. FIGS. 2(a) to 2(d) are schematic cross-sectional views that explain producing steps of the substrate 5A according to the first embodiment of the present invention.

As illustrated in FIG. 2(a), the intermediate layer 11 is first formed on the surface of the aluminum substrate body 10 (intermediate layer forming step). The intermediate layer 11 is formed by laminating an alumina layer on the aluminum substrate body 10 by the thermal spraying. Here, in order to enhance the adhesion between the aluminum substrate body 10 and the intermediate layer 11, it is preferable that the surface of the aluminum substrate body 10 is in advance formed uneven by a blasting treatment and the alumina layer is thereafter laminated by the thermal spraying.

As illustrated in FIG. 2(a), the reflection layer 12 is thereafter formed on the upper surface of the intermediate layer 11 on the surface of the aluminum substrate body 10 (reflection layer forming step). As for the reflection layer 12, ceramic particles are mixed with the glass-based binder or the resin binder with light resistance and heat resistance, the binder is cured by drying, firing, or the like, and the insulative reflection layer that contains ceramic particles is thereby formed as the reflection layer 12.

Further, in this embodiment, aluminum is used for the aluminum substrate body 10, and alumina is used for the ceramic layer of the intermediate layer 11. Thus, after the forming step of the intermediate layer 11, the firing temperature may be elevated for forming the reflection layer 12.

In the reflection layer forming step, ceramic paint that contains ceramic particles is coated onto the intermediate layer 11, and the reflection layer 12 is thereafter formed by synthesizing glass by the sol-gel method. The reflection layer forming step is performed while the firing temperature of the glass-based binder used in the sol-gel method is usually set to 200° C. to 500° C. However, in order to reduce pores in a porous membrane generated in a gel state of the vitreous material and to enhance the insulation characteristics, it is effective to perform the reflection layer forming step while the firing temperature is set to 400° C. to 500° C.

Thus, in this embodiment, the sol that is used for synthesizing the vitreous material in the sol-gel reaction is used as a binder for zirconia particles and is coated onto the intermediate layer 11 by screen printing. Subsequently, the glass-based binder is dried at 200° C. to 300° C. and fired at 400° C. to 500° C. to form the reflection layer 12.

As for a formation method of the reflection layer 12, other than the sol-gel method, there is a method in which glass particles with a low melting point that are cured by using an organic binder is remolten and a vitreous layer is thereby formed. At least a temperature of 800° C. to 900° C. is necessary for remelting the glass particles with a low melting point that are cured by using the organic binder. In this embodiment, the formation method of the reflection layer 12 that requests such a high-temperature step may be used because the ceramic layer, which is represented by alumina, is used for the intermediate layer 11.

However, such a temperature exceeds the melting point of 660° C. of aluminum used for the aluminum substrate body 10. Thus, an alloy material whose melting point is elevated by appropriately mixing impurities has to be used for the aluminum substrate body 10. Copper has a higher melting point of 1085° C. than aluminum. Thus, in a case of using copper for the substrate body, firing of glass with a low melting point is possible. It is matter of course that copper may be used while the melting point of the substrate body is elevated by appropriately mixing impurities.

Glass has high light resistance and heat resistance and is thus most preferable as the material for forming the reflection layer 12. However, instead of glass, a resin with high thermal resistance and light resistance, for example, silicone resin, epoxy resin, or fluororesin may be used as a binder for ceramic particles. Although the resin has lower heat resistance and light resistance than glass, the curing temperature of the resin is lower than the glass synthesis by the sol-gel reaction of a glass raw material, and the forming step of the reflection layer 12 becomes easy.

As illustrated in FIG. 2(b), the protection layer 13 is next formed to cover the lower end surface and the side end surfaces of the aluminum substrate body 10 (protection layer forming step).

In actual production, a sealing treatment is performed after an aluminum-anodizing treatment, and pores of a porous medium generated in the aluminum anodic oxide coating as the protection layer 13 are thereby closed. As described, the sealing treatment is further performed after the aluminum-anodizing treatment, and the aluminum anodic oxide coating that forms the protection layer 13 is then stabilized. Thus, the durability and corrosion resistance of the aluminum substrate body 10 are further secured by the protection layer 13.

Further, the formation of the protection layer 13 by the aluminum-anodizing treatment is further preferably performed after formation of the reflection layer 12. The firing temperature in a case where the vitreous material is synthesized by the sol-gel reaction to form the reflection layer 12 as in this embodiment is 200° C. to 500° C. Particularly, in a case where the firing is performed at a temperature of 250° C. or higher, cracks (fractures) are produced in the protection layer 13, and a function as a protection membrane of the substrate for light emitting devices thereby degrades. Further, the formation of the reflection layer 12 is first performed, and the reflection layer 12 that contains ceramic particles thereby serves as a mask against the aluminum-anodizing treatment in the forming step of the protection layer 13. Further, because the protection layer 13 is thereby formed after the intermediate layer 11 is formed, only portions on the aluminum substrate body 10, in which the aluminum material is exposed, except the intermediate layer 11 are covered by the protection layer 13.

The substrate 5A in which the aluminum substrate body 10 is covered by the intermediate layer 11, the reflection layer 12, and the protection layer 13 is produced by the above intermediate layer forming step, reflection layer forming step, and protection layer forming step. Next, the electrode pattern 20 is formed on the reflection layer 12 as described below.

As illustrated in FIG. 2(c), a circuit pattern as a foundation of the electrode pattern 20 is drawn on an upper surface of the reflection layer 12 by using metal paste formed of a resin that contains metal particles and by printing or the like and is dried, and a foundation circuit pattern 22 is thereby formed (foundation circuit pattern forming step). As illustrated in FIG. 2(d), metal for the electrode is deposited on the foundation circuit pattern by the plating treatment, and the electrode pattern 20 is thereby formed (electrode pattern forming step).

The aluminum substrate body 10 is already covered by the reflection layer 12 that contains ceramics and has high reflectance, the intermediate layer 11, and the protection layer 13 of the anodic oxide coating. This enables the metal for the electrode to be effectively deposited from the plating solution only on the foundation circuit pattern 22 while the aluminum substrate body 10 is not eroded by the plating solution used in the plating treatment in the electrode pattern forming step.

(Test Calculation of Thermal Resistance of Insulating Layer)

Here, a description will be made below based on FIGS. 3 to 7 about reasons why the substrate 5A according to this embodiment has low thermal resistance and high dielectric strength compared to other substrates that have a metal substrate body.

(Case of Insulating Layer with Thickness of 200 μm)

Figure 3:
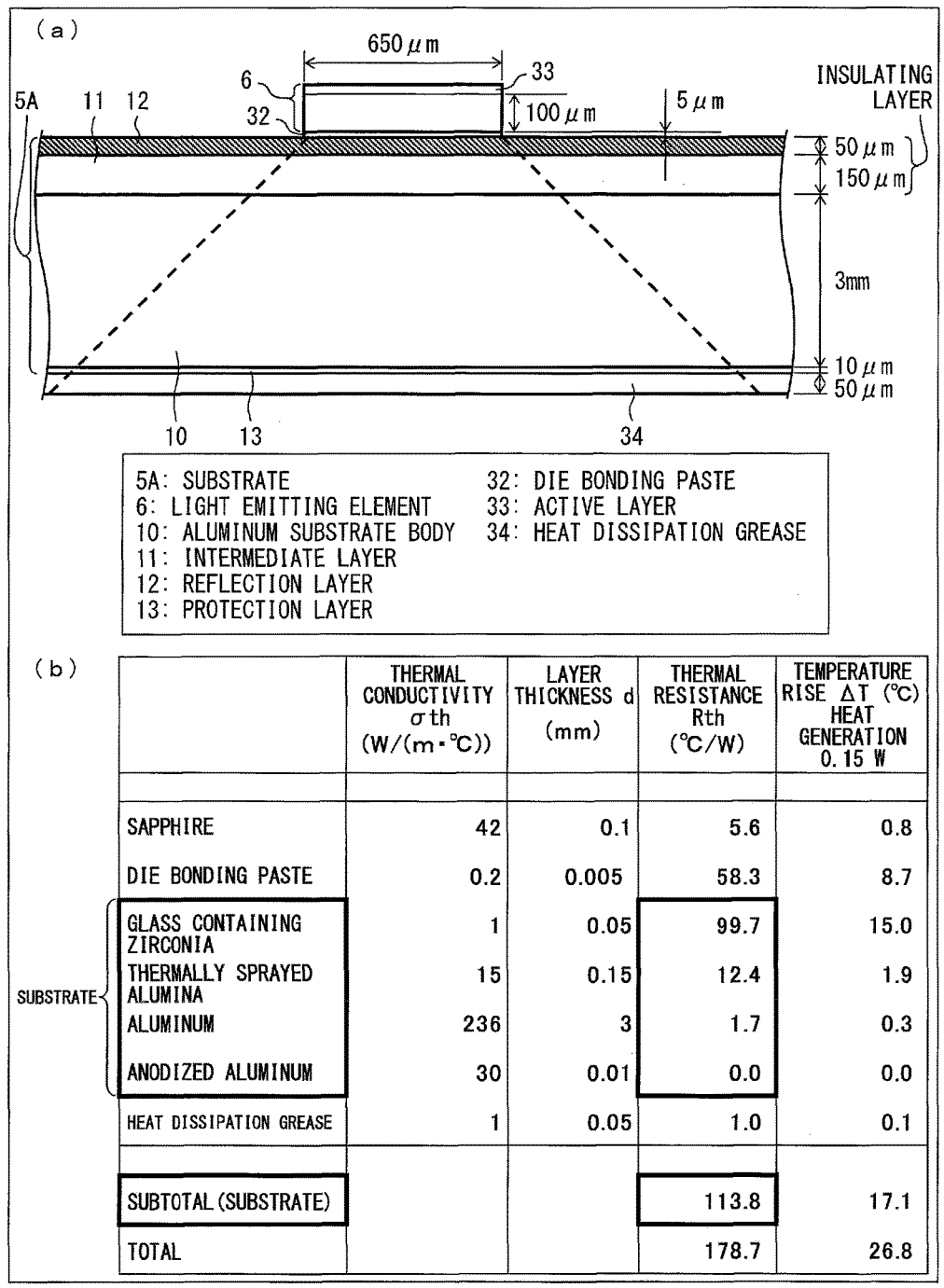
FIG. 3(a) is a schematic cross-sectional view of the substrate according to the first embodiment of the present invention.
FIG. 3(b) is a diagram that indicates thermal conductivity σth (W/(m·° C.)), layer thicknesses d (mm), thermal resistances Rth (° C./W), and temperature rises ΔT (° C.) of layers illustrated in FIG. 3(a).
Figure 4:
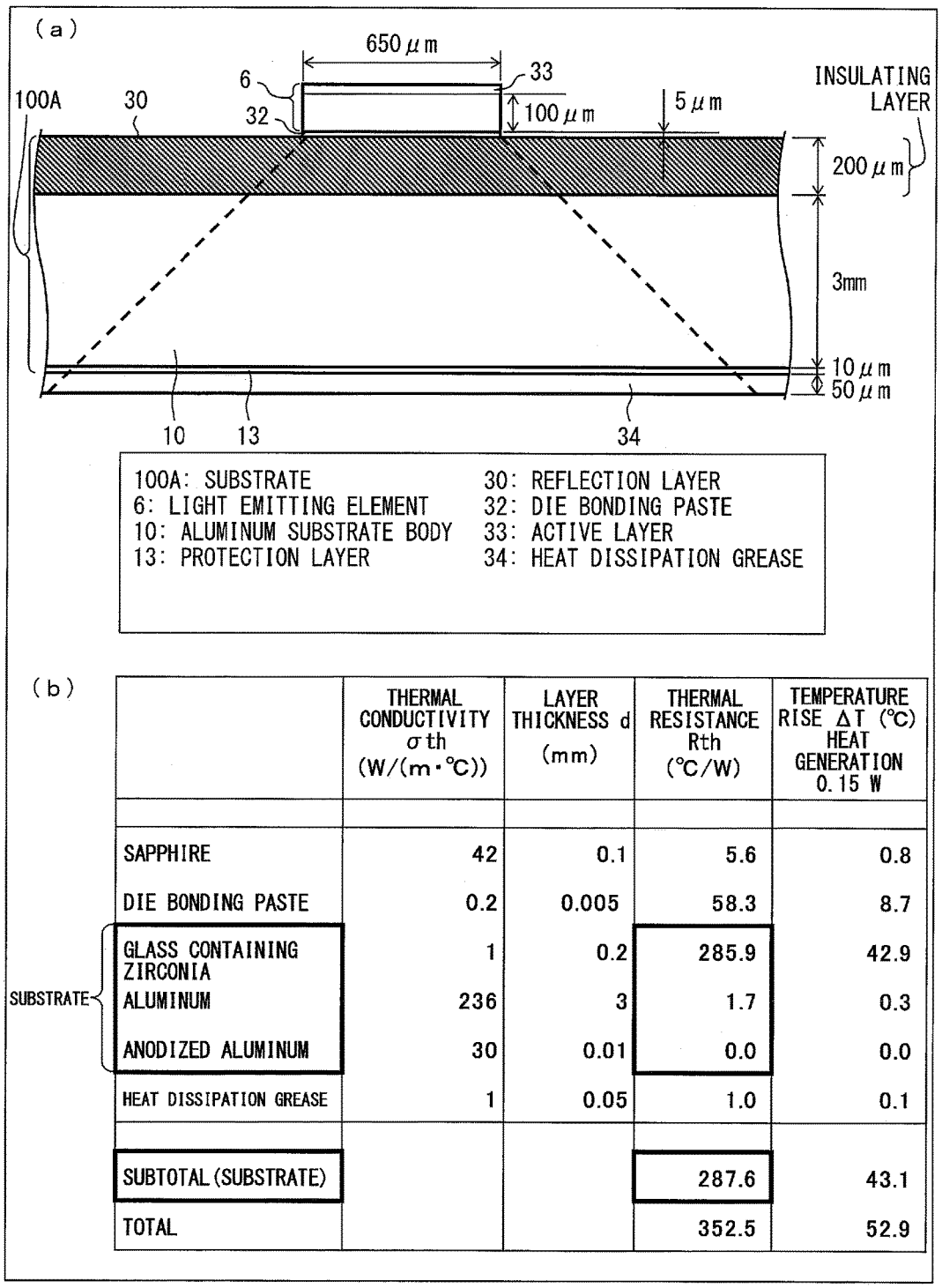
FIG. 4(a) is a schematic cross-sectional view of a substrate of comparison example 1.
FIG. 4(b) is a diagram that indicates thermal conductivity σth (W/(m·° C.)), layer thicknesses d (mm), thermal resistances Rth (° C./W), and temperature rises ΔT (° C.) of layers illustrated in FIG. 4(a).
Figure 5:
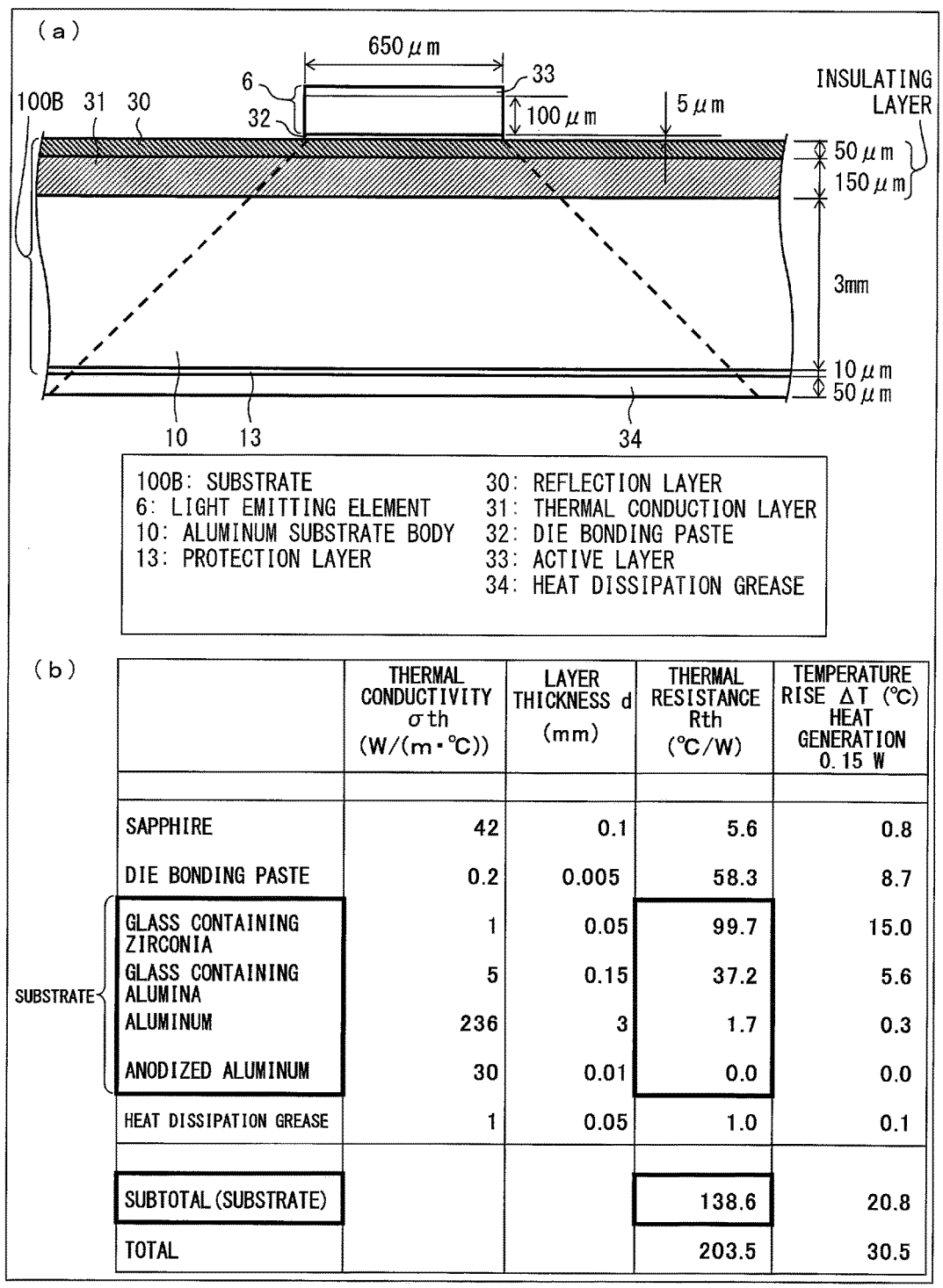
FIG. 5(a) is a schematic cross-sectional view of a substrate of comparison example 2.
FIG. 5(b) is a diagram that indicates thermal conductivity σth (W/(m·° C.)), layer thicknesses d (mm), thermal resistances Rth (° C./W), and temperature rises ΔT (° C.) of layers illustrated in FIG. 5(a).

Test calculation and comparison will be performed based on specific values for the thermal resistance of each of the three following substrates, the substrate 5A, a substrate 100A that has a metal substrate body as comparison example 1, and a substrate 100B that has a metal substrate body as comparison example 2. The substrate 5A, the substrate 100A, and the substrate 100B are different from each other in the structure of the insulating layer arranged between the light emitting element 6 and the aluminum substrate body 10. The above comparison will be described with reference to FIGS. 3 to 5. FIG. 3(a) is a schematic cross-sectional view of one example of the substrate 5A, and FIG. 3(b) indicates thermal conductivity σth (W/(m·° C.)), layer thicknesses d (mm), thermal resistances Rth (° C./W), and temperature rises ΔT (° C.) of layers illustrated in FIG. 3(a). FIG. 4(a) is a schematic cross-sectional view of the substrate 100A of comparison example 1, and FIG. 4(b) indicates thermal conductivity σth (W/(m·° C.)), layer thicknesses d (mm), thermal resistances Rth (° C./W), and temperature rises ΔT (° C.) of layers illustrated in FIG. 4(a). FIG. 5(a) is a schematic cross-sectional view of the substrate 100B of comparison example 2, and FIG. 5(b) indicates thermal conductivity σth (W/(m·° C.)), layer thicknesses d (mm), thermal resistances Rth (° C./W), and temperature rises ΔT (° C.) of layers illustrated in FIG. 5(a).

As illustrated in FIG. 3(a), the substrate 5A has the aluminum substrate body 10, the intermediate layer 11, the reflection layer 12, and the protection layer 13. The intermediate layer 11 and the reflection layer 12 have insulation characteristics, and the substrate 5A obtains desired dielectric strength by the insulating layer formed with two layers, which are the intermediate layer 11 and the reflection layer 12. The aluminum substrate body 10 is formed of aluminum with a thickness of 3 mm, and the intermediate layer 11 is formed on the surface of the aluminum substrate body 10. The intermediate layer 11 has a thickness of 150 μpm and is the alumina layer (ceramic layer) formed by the high velocity flame thermal spraying. The reflection layer 12 is formed on the upper surface of the intermediate layer 11. The reflection layer 12 has a thickness of 50 μm and is a glass-based insulating layer that contains zirconia. The reflection layer 12 is a glass-based insulating layer that is formed by firing the ceramic paint, which contains ceramics fired at a high temperature and a glass raw material, at 200° C. to 500° C. and contains zirconia particles as ceramics. Here, the intermediate layer 11 has more than half the dielectric strength of the dielectric strength of the substrate 5A. Further, an anodized aluminum layer with a thickness of 10 μm is formed as the protection layer 13 on the lower end surface of the aluminum substrate body 10.

Here, the protection layer 13 may further be thermally connected with a heat sink (heat dissipation material) 2 (see FIG. 17) with heat dissipation grease 34 interposed therebetween. The heat dissipation grease 34 may be formed with a thickness of 50 μm. In the above configuration, most heat generated in the light emitting element 6 is finally emitted from the heat sink 2 to the atmosphere in a case of an air-cooled type. For example, silicone oil is selected for a base material of the heat dissipation grease 34 used for an illumination device that uses a semiconductor device, an LED, or the like. The thermal conduction is often improved by combining powder of alumina, silver, or the like with high thermal conductivity with the silicone oil. Although the thermal conductivity of the base material of the heat dissipation grease 34 is generally around 0.2 W/(m·° C.), the thermal conductivity of the heat dissipation grease 34 becomes approximately 1 to 3 W/(m·° C.) as a result of the improvement in the thermal conductivity. In a case where the protection layer 13 only mechanically contacts with the heat sink 2, an air layer interposed therebetween works as a thermal insulation layer. Thus, the heat dissipation grease 34 is interposed for the purpose of thermally connecting both of those by removing the air layer. In the substrate 5A used for high luminance illumination as in the present invention, a heat dissipation path with the minimum distance is often provided from a front surface of the substrate 5A toward a back surface of the substrate 5A. In order to enhance the heat dissipation, it is preferable that the back surface of the substrate 5A is allowed to closely contact with the heat sink 2 by the heat dissipation grease 34 as described above. The heat dissipation grease 34 serves similarly to the substrate 5A in the substrate 100A and substrate 100B described later, and a description thereof will not be made.

As illustrated in FIG. 4(a), the substrate 100A has the aluminum substrate body 10, a reflection layer 30, and the protection layer 13. The reflection layer 30 has insulation characteristics, and the substrate 100A obtains desired dielectric strength by a glass-based insulating layer formed with one layer, which is the reflection layer 30. The aluminum substrate body 10 is formed of aluminum with a thickness of 3 mm, and the glass-based insulating layer with a thickness of 200 μm, which has a light reflecting function and a dielectric strength function, is formed as the reflection layer 30 on the surface of the aluminum substrate body 10.

Similarly to the reflection layer 12, the reflection layer 30 is a glass-based insulating layer that is formed by firing the ceramic paint, which contains ceramics fired at a high temperature and a glass raw material, at 200° C. to 500° C. and contains zirconia particles as ceramics. Further, an anodized aluminum layer with a thickness of 10 μm is formed as the protection layer 13 on the lower end surface of the aluminum substrate body 10.

As illustrated in FIG. 5(a), the substrate 100B has the aluminum substrate body 10, the reflection layer 30, a thermal conduction layer 31, and the protection layer 13. The reflection layer 30 and the thermal conduction layer 31 have insulation characteristics, and the substrate 100B obtains desired dielectric strength by a glass-based insulating layer formed with two layers, which are the thermal conduction layer 31 and the reflection layer 30. The aluminum substrate body 10 is formed of aluminum with a thickness of 3 mm, and a glass-based insulating layer that has a thickness of 150 μm and contains alumina is formed as the thermal conduction layer 31 on an upper end surface of the aluminum substrate body 10. A glass-based insulating layer that has a thickness of 50 μm and contains zirconia is formed as the reflection layer 30 on an upper surface of the thermal conduction layer 31. The thermal conduction layer 31 is formed by firing ceramic paint, which is formed of a glass raw material which contains alumina fired at a high temperature as particles, at 200° C. to 500° C. Further, an anodized aluminum layer with a thickness of 10 μm is formed as the protection layer 13 on the lower end surface of the aluminum substrate body 10.

Further, the light emitting element 6 is arranged on each of the substrate 5A, the substrate 100A, and the substrate 100B. The light emitting element 6 is connected with each of the substrate 5A, the substrate 100A, and the substrate 100B by die bonding paste 32 with a thickness of 5 μm. The light emitting element 6 has a plane size with a vertical width of 650 μm and a horizontal width of 650 μm. The thickness from the die bonding paste 32 to an active layer 33 of the light emitting element 6 is 100 μm. As for a light emitting element substrate, the light emitting element 6 uses a light emitting element substrate whose material is sapphire.

The test calculation of the thermal resistance is performed by the following procedures.

The values of the thermal resistances of the substrate 5A, the substrate 100A, and the substrate 100B depend on the position, dimensions, and so forth of the light emitting element 6. However, in the results of the thermal resistances Rth (° C./W) indicated in FIG. 3(b), the thermal resistances Rth (° C./W) of the layers are calculated on an assumption that the active layer 33 of the light emitting element 6 is the only heat source. In addition, in FIG. 3(b), the temperature rises ΔT (° C.) of the layers are obtained as well as the thermal resistances Rth (° C./W) of the layers. The temperature rise ΔT (° C.) is the value on an assumption that the heating value of the heat source is 0.15 W.

In the calculation of the thermal resistances Rth (° C./W) of the layers, the heat diffusion in the horizontal direction is taken into consideration. Specifically, as indicated by broken lines in FIG. 3(a), the thermal resistances Rth (° C./W) are obtained on an assumption that heat uniformly diffuses in the left and right 45° directions with respect to the vertical direction of the substrate 5A.

The thermal resistance Rth (° C./W) and the temperature rise ΔT (° C.) are obtained on such assumptions. In a case where a heat source in a square shape whose one side has a size a (m) is placed on the substrate 5A with the thermal conductivity σth (W/(m·° C.)) and the layer thickness d (m), the thermal resistance in this layer is approximated by Rth (° C./W)=d/(σth·a·(a+2d)), and the temperature rise in this layer is ΔT (° C.)=Rth·Q. Here, Q (W) is the heating value in the heat source.

The thermal resistances Rth (° C./W) and the temperature rises ΔT (° C.) of the layers, which are indicated in FIG. 3(b), are obtained by the test calculation by the above calculation methods. The test calculation is performed by the same calculation methods for FIG. 4(b) and FIG. 5(b).

As indicated in FIG. 3(b), FIG. 4(b), and FIG. 5(b), the test calculation results of the thermal resistances of the substrate 5A, the substrate 100A, and the substrate 100B are approximately 114° C./W for the substrate 5A, approximately 288° C./W for the substrate 100A, and approximately 139° C./W for the substrate 100B. Accordingly, the thermal resistance of the substrate 5A is the lowest among the substrate 5A, the substrate 100A, and the substrate 100B. Thus, the substrate 5A has the highest heat dissipation among the substrate 5A, the substrate 100A, and the substrate 100B.

Next, a description will be made about the differences in the thermal conductivity and the layer thickness among the insulating layers of the substrate 5A, the substrate 100A, and the substrate 100B.

The total thickness of the insulating layer is 200 μm in each of the substrate 5A, the substrate 100A, and the substrate 100B.

In the substrate 100A, whole the insulating layer with a thickness of 200 μm is the reflection layer 30. The reflection layer 30 is the glass-based insulating layer containing zirconia, which is formed by sintering sol-gel glass which contains zirconia as a ceramic material. The thermal conductivity σ1 of the reflection layer 30 is 1 W/(m·° C.).

The insulating layer of the substrate 100B has a laminated structure of the reflection layer 30 and the thermal conduction layer 31. The reflection layer 30 provided in an outer layer between the two layers has a thickness of 50 μm and is the glass-based insulating layer that contains zirconia. The thermal conduction layer 31 has a thickness of 150 μm and is a glass-based insulating layer containing alumina, whose thermal conductivity is higher than the reflection layer 30. The thermal conduction layer 31 is formed by sintering sol-gel glass in a state where the sol-gel glass contains alumina particles. The thermal conductivity σ2 of the thermal conduction layer 31 is 5 W/(m·° C.).

The insulating layer of the substrate 5A has a laminated structure of the reflection layer 12 and the intermediate layer 11. The reflection layer 12 is the glass-based insulating layer containing zirconia, which is the same as the reflection layer 30 of the substrate 100B. The intermediate layer 11 is the alumina layer (ceramic layer) formed by the high velocity flame thermal spraying (HVOF). The thermal conductivity σ3 of the intermediate layer 11 is 15 W/(m·° C.). The thermal conductivity of the reflection layer 12 is the same as the thermal conductivity of the reflection layer 30, and the thermal conductivity σ1 is 1 W/(m·° C.).

Both of the intermediate layer 11 of the substrate 5A and the thermal conduction layer 31 of the substrate 100A contain alumina as a material. However, the thermal conduction layer 31 uses glass as the binder and is thus influenced by glass with low thermal conductivity. It may be considered that the thermal conductivity σ2 of the thermal conduction layer 31 thus becomes a low value of 5 W/(m·° C.).

On the other hand, in the substrate 5A, the intermediate layer 11 is formed by the thermal spraying. Because alumina is heated to a molten state or a state close thereto and caused to collide with the aluminum substrate body 10 at a high velocity to form the intermediate layer 11, the intermediate layer 11 is deposited in a state close to alumina as ceramics. It may be considered that the thermal conductivity σ3 of the intermediate layer 11 thus becomes a high value of 15 W/(m·° C.).

Further, as described above, the test calculation results of the thermal resistances of the substrate 5A, the substrate 100A, and the substrate 100B are approximately 114° C./W for the substrate 5A, approximately 288° C./W for the substrate 100A, and approximately 139° C./W for the substrate 100B. Referring to the thermal resistances of the layers of the substrate 5A, the substrate 100A, and the substrate 100B, which are indicated in FIG. 3(b), FIG. 4(b), and FIG. 5(b), it is understood that a main factor that decides the thermal resistances of the substrate 5A, the substrate 100A, and the substrate 100B is the insulating layer arranged between the light emitting element 6 and the aluminum substrate body 10. The contribution from the aluminum substrate body 10 and the anodized aluminum layer (the protection layer 13) is a maximum of less than 2%.

(Insulating Layer Thickness Dependence)

Figure 6:
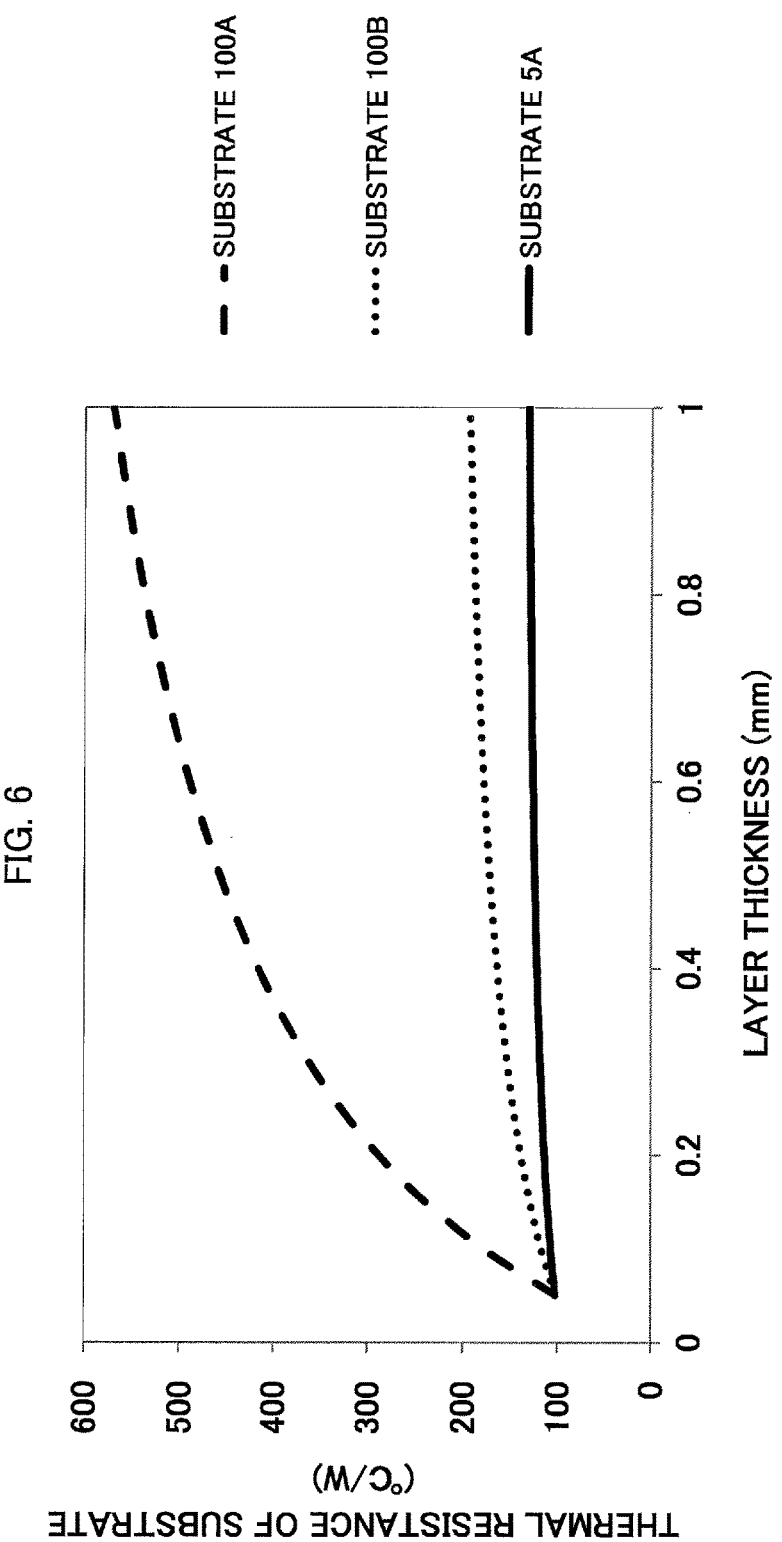
FIG. 6 is a graph that represents insulating layer thickness dependence of the thermal resistances of the substrates.
Figure 7:
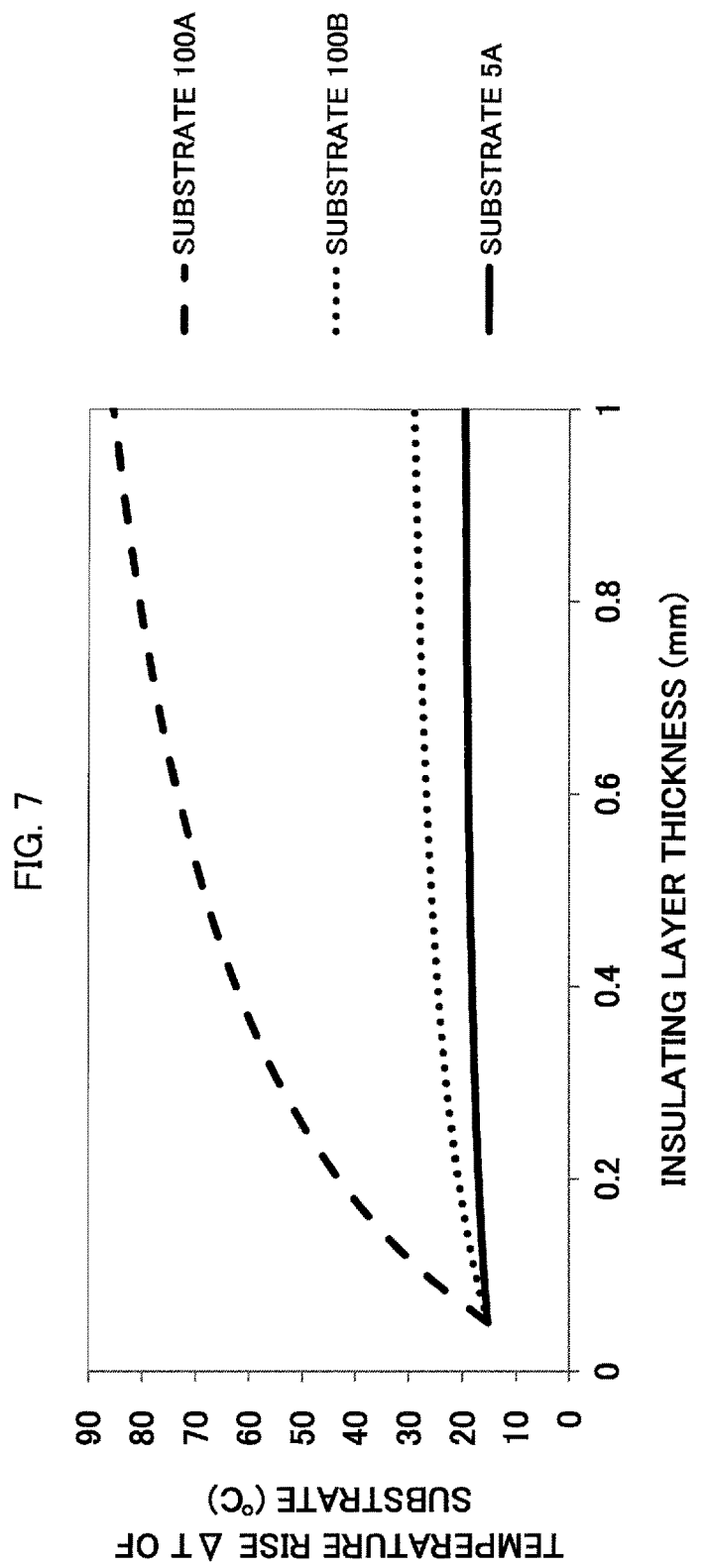
FIG. 7 is a graph that represents the insulating layer thickness dependence of the temperature rises of the substrates.

Next, a description will be made about the insulating layer thickness dependence of the thermal resistances and the temperature rises in the substrate 5A, the substrate 100A, and the substrate 100B with reference to FIGS. 6 and 7. FIG. 6 is a graph that represents the insulating layer thickness dependence of the thermal resistances in the substrate 5A, the substrate 100A, and the substrate 100B. In FIG. 6, the horizontal axis represents the insulating layer thickness (mm), and the vertical axis represents the thermal resistance (° C./W) of the substrate. FIG. 7 is a graph that represents the insulating layer thickness dependence of the temperature rises in the substrate 5A, the substrate 100A, and the substrate 100B. In FIG. 7, the horizontal axis represents the insulating layer thickness (mm), and the vertical axis represents the temperature rise (° C.) of the substrate.

In the above-described test calculation of the thermal resistances of the insulating layers, the test calculation and comparison are performed for the thermal resistances of the substrate 5A, the substrate 100A, and the substrate 100B in a case where the total insulating layer thickness is 200 μm. Differently, the graph illustrated in FIG. 6 represents how the thermal resistances of the substrate 5A, the substrate 100A, and the substrate 100B increase in accordance with the change in the total insulating layer thickness.

Specifically, the thermal resistance of the substrate is calculated by changing the insulating layer thickness in the following method.

(1) In the substrate 5A, the thickness of the reflection layer 12 (σ1: 1 W/(m·° C.)) is fixed to 50 μm, and the thickness of the intermediate layer 11 (σ3: 15 W/(m·° C.)) is changed. (2) In the substrate 100A, the thickness of the reflection layer 30 (σ1: 1 W/(m·° C.)) is changed to 50 μm or more to 1000 μm or less. (3) In the substrate 100B, the thickness of the reflection layer 30 (σ1: 1 W/(m·° C.)) is fixed to 50 μm, and the thickness of the thermal conduction layer 31 (σ2: 5 W/(m·° C.)) is changed.

The results of the test calculation of the temperature rises, which is performed by changing the insulating layer thickness in the same method as the above method, are represented by the graph in FIG. 7. In addition, the test calculation of the temperature rises is performed on an assumption that the input power to the light emitting element 6 is 0.30 W and the power loss in the light emitting element 6 is 50%, that is, the heat generation is 0.15 W.

As illustrated in FIGS. 6 and 7, in a case of the substrate 5A that has the intermediate layer 11, when the insulating layer thickness increases, the thermal resistance of the substrate 5A and the temperature rise of the substrate 5A slightly increase. Meanwhile, in a case of the substrate 100A, when the insulating layer thickness increases, the thermal resistance of the substrate 100A and the temperature rise of the substrate 100A rapidly increase. In a case of the substrate 100B, when the insulating layer thickness increases, the thermal resistance of the substrate 100B and the temperature rise of the substrate 100B gradually increase. That is, as for the substrate 100A and the substrate 100B, the ratios of the increases in the thermal resistances and the temperature rises to the increase in the insulating layer thickness are large compared to the substrate 5A. Accordingly, compared to the substrate 100A and the substrate 100B, the thickness of the intermediate layer 11 of the substrate 5A may be increased while the thermal resistance is maintained low. Thus, the substrate 5A may obtain desired dielectric strength with a low thermal resistance.

Here, the relationship between the dielectric strength and the thermal resistance of the substrate will be described below. The layer thickness of the insulating layer has to be thick in order to form the insulating layer on the metal substrate body and thereby to realize high dielectric strength. This is because the dielectric strength is generally proportional to the insulating layer thickness. Thus, for example, in the substrate 100A of comparison example 1, the thermal resistance increases as the insulating layer thickness increases. Accordingly, the thermal resistance of the substrate 100A is high in order to secure sufficient dielectric strength.

However, for example, in a case where the reflection layer 12 and the intermediate layer 11 are provided as in the substrate 5A and the intermediate layer 11 is formed by the thermal spraying of alumina onto the metal substrate body by the high velocity flame thermal spraying, the intermediate layer 11 becomes a fine alumina layer, and the dielectric strength performance thereof becomes 15 to 30 kV/mm. Here, even if the dielectric strength performance of the intermediate layer 11 is the lowest 15 kV/mm, dielectric strength of at least 4.5 kV may be secured in a case where the thickness of the intermediate layer 11 is 0.3 mm. Combining the intermediate layer 11 with a thickness of 0.3 mm and the reflection layer 12 with a thickness of 0.05 mm (50 μm) provides the insulating layer with a total thickness of 0.35 mm. Reading the values of the thermal resistance and the temperature rise of the substrate 5A that correspond to the insulating layer of 0.35 mm from FIGS. 6 and 7, the thermal resistance of the substrate 5A is 120° C./W, and the temperature rise of the substrate 5A is 18° C.

On the other hand, in a case of the substrate 100A whose insulating layer is the reflection layer 30 with a thickness of 0.35 mm, the thermal resistance of the substrate 100A is 391° C./W, and the temperature rise of the substrate 100A is 59° C.

In a case of the substrate 100B in which the thermal conduction layer 31 with a thickness of 0.3 mm and the reflection layer 30 with a thickness of 0.05 mm (50 μm) are combined and the insulating layer with a total thickness of 0.35 mm is thereby formed, the thermal resistance of the substrate 100B is 159° C./W, and the temperature rise of the substrate 100B is 24° C.

Here, assuming that the insulating layer of a single reflection layer of 0.05 mm (50 μm) is a reference substrate, the thermal resistance of the reference substrate is 102° C./W, and the temperature rise of the reference substrate is 15.3° C. When the reference substrate is compared to the substrate 5A, the substrate 100A, and the substrate 100B, the increases in the thermal resistances and the temperature rises compared to the reference substrate are 18% for the substrate 5A, 283% for the substrate 100A, and 56% for the substrate 100B.

Further, the dielectric strength performance of the reflection layer 30 and the thermal conduction layer 31 is often lower than the dielectric strength performance of the intermediate layer 11, and the reflection layer 30 and the thermal conduction layer 31 may stably realize dielectric strength performance of 7.5 to 15 kV/mm, which is only half the dielectric strength performance of the intermediate layer 11.

This is due to the following reasons. In a case where the glass-based insulating layer is formed by using the sol-gel method, for example, paint in which ceramic particles are mixed with a glass raw material in a sol state is coated or printed onto the substrate body, dried, and sintered to synthesize a vitreous material. Here, the ceramic particles are cured by using the synthesized vitreous material, and the glass-based insulating layer containing ceramics (the glass-based insulating layer containing alumina or the glass-based insulating layer containing zirconia, that is, the reflection layer 30 or the thermal conduction layer 31) is thereby formed on the aluminum substrate body 10. However, the vitreous material by such a fabrication method is porous before sintering, and pores may not completely be closed even after sintering. Thus, the dielectric strength performance of the glass-based insulating layer containing ceramics is lower than the dielectric strength performance of the ceramic layer (the intermediate layer 11) formed by the thermal spraying.

For example, in a case where the dielectric strength performance of the intermediate layer 11 in the substrate 5A is 15 kV/mm but the dielectric strength performance of the thermal conduction layer 31 in the substrate 100B is only 7.5 kV/mm, which is only half the dielectric strength performance of the intermediate layer 11, realizing the same dielectric strength of 4.5 kV as the intermediate layer 11 with a thickness of 300 μm of the substrate 5A requests 600 μm, which is the twice thickness. Reading the thermal resistances and the temperature rises of the substrate 100A and the substrate 100B that correspond to the insulating layer of 600 μm from FIGS. 6 and 7, as for the substrate 100A, the thermal resistance of the substrate 100A is 503° C./W, and the temperature rise of the substrate 100A is 76° C., and as for the substrate 100B, the thermal resistance of the substrate 100B is 181° C./W, and the temperature rise of the substrate 100B is 27° C.

When the reference substrate is compared to the substrate 100A and the substrate 100B in a similar manner to the above case, the increases in the thermal resistances and the temperature rises compared to the reference substrate are 403% for the substrate 100A and 81% for the substrate 100B.

The rises in the thermal resistance and the temperature of the substrate 5A compared to the reference substrate in a case where the same dielectric strength of 4.5 kV is obtained by the intermediate layer 11 of 300 μm is, as described above, only 18%. Accordingly, it is clear that using the intermediate layer 11 that has the alumina layer by the thermal spraying enables both of securing of sufficient dielectric strength and reduction in the thermal resistance of the substrate 5A to be secured.

Further, although lower in the thermal conductivity and the dielectric strength performance than the alumina layer by the thermal spraying, the glass-based insulating layer containing ceramics with high light reflectance, particularly the glass-based insulating layer containing zirconia (the reflection layer 12) with a minimum necessary thickness of 10 to 100 μm is formed on the intermediate layer 11, and the rise in the thermal resistance of the substrate 5A may thereby be suppressed to the minimum necessary amount.

In the above configuration, the present invention has succeeded for the first time in realizing an idealistic substrate for light emitting devices that simultaneously satisfies the three characteristics of high light reflectance, low thermal resistance (high heat dissipation), high electrical dielectric strength, which are necessary for a substrate for high luminescence light emitting devices.

Figure 14:
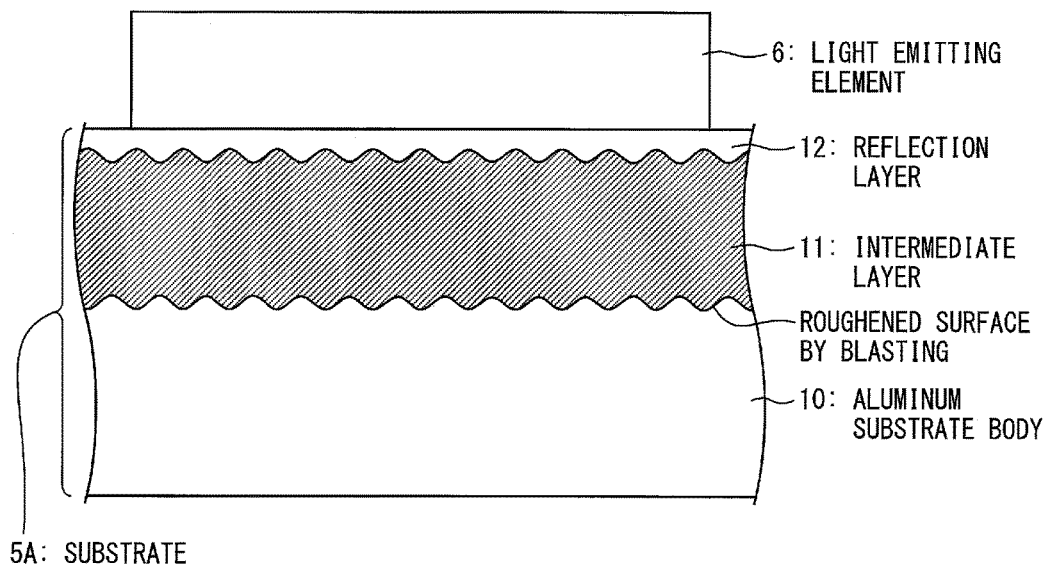
FIG. 14 is a schematic cross-sectional view of a substrate according to a fourth embodiment of the present invention.

In a case where the alumina layer is laminated by the thermal spraying, increasing the layer thickness may result in a rough surface. Further, in a case where the surface of the aluminum substrate body 10 is formed uneven by the blasting treatment for the purpose of enhancing the adhesion between the intermediate layer 11 and the aluminum substrate body 10 and the intermediate layer 11 is thereafter laminated by the thermal spraying, the influence of an uneven shape of the aluminum substrate body 10 remains on the surface of the laminated intermediate layer 11. In such a case, it may be considered that forming the reflection layer 12 on the upper surface of the intermediate layer 11 results in unevenness of the reflection layer 12, that is, of an installation surface on the substrate 5A for the light emitting element 6. Thus, for the purpose of smoothing the unevenness of the installation surface on the substrate 5A for the light emitting element 6, the reflection layer 12 may thickly be formed on the intermediate layer 11 as illustrated in FIG. 14, which will be described later in a fourth embodiment of the present invention. Specifically, the reflection layer 12 is formed to have a thickness of 60 to 150 μm, for example, on the intermediate layer 11.

As it is understood from the above description, in this embodiment, the substrate 5A is provided with the intermediate layer 11 that is formed of the ceramic layer formed by the thermal spraying between the aluminum substrate body 10 and the reflection layer 12, and the electrode pattern 20 is formed on the insulating layer formed with the intermediate layer 11 and the reflection layer 12. As a result, a substrate for light emitting devices that has long-term reliability with high reflectance, high heat dissipation, high dielectric strength, thermal resistance, and light resistance and is preferable for high luminance illumination may be obtained. Further, in this embodiment, such a substrate for light emitting devices may be provided in a form with high mass productivity.

[Modification Example 1 of First Embodiment]

Figure 20:
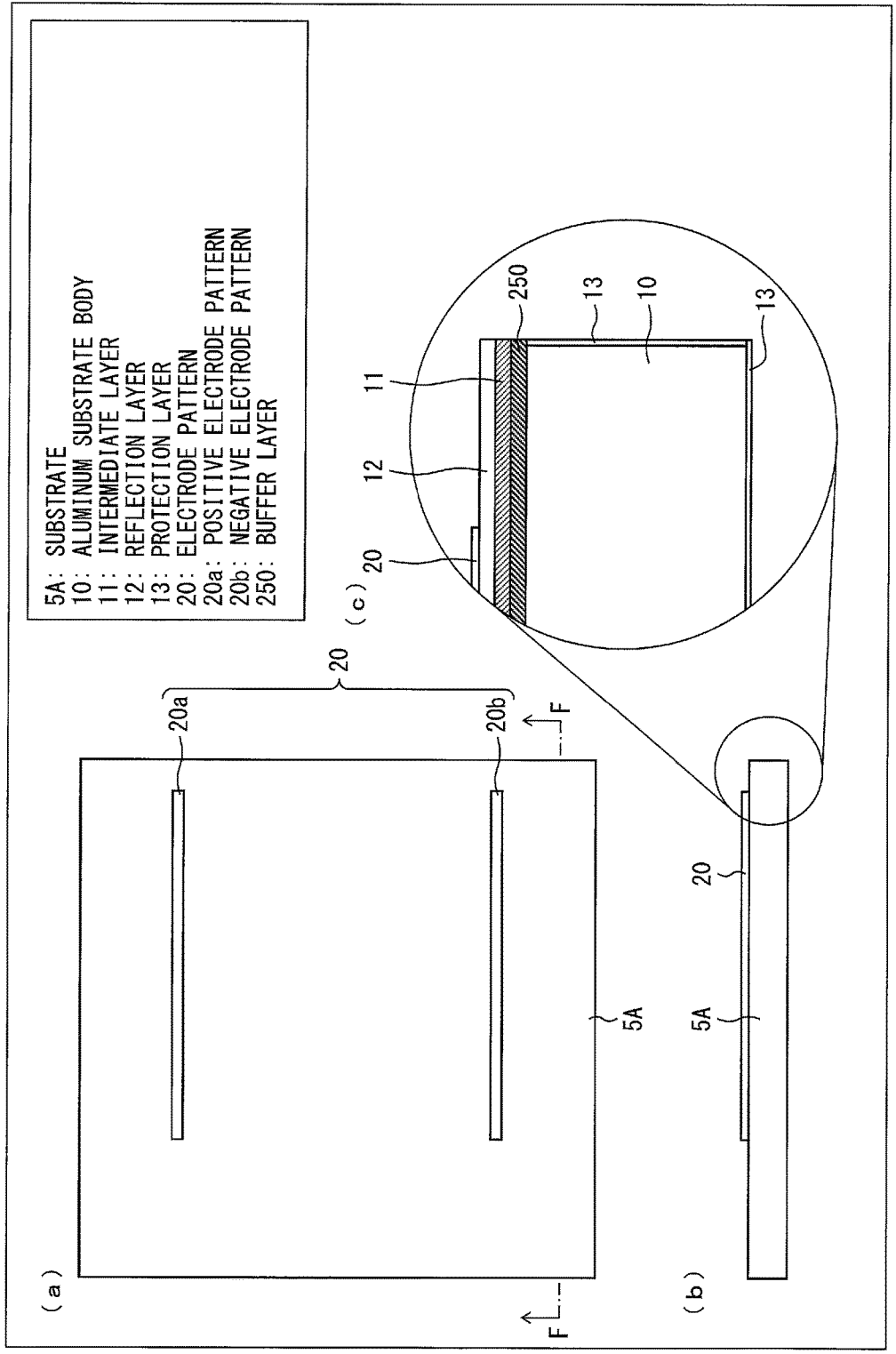

A modification example of the first embodiment of the present invention will be described below based on FIG. 20. FIG. 20 is a diagram that explains the modification example of the substrate 5A according to this embodiment, in which FIG. 20(*a*) is a plan view of the modification example of the substrate 5A, FIG. 20(*b*) is an arrow cross-sectional view of FIG. 20(*a*) taken along line F-F, and FIG. 20(*c*) is a partially enlarged view of FIG. 20(*b*).

As illustrated in FIG. 20(*c*), a different point from the first embodiment is a point that a buffer layer 250 is formed between the aluminum substrate body 10 (substrate body) and the intermediate layer 11 (second insulating layer). In the first embodiment, in a case where the intermediate layer 11 (second insulating layer) is formed on the aluminum substrate body 10 formed of metal to provide the substrate for light emitting devices, particularly a case where the substrate for light emitting devices is used as a substrate for high power output light emitting devices, the aluminum substrate body 10 formed of metal repeatedly expands and contracts due to an influence of the heat generated in the light emitting element 6 that is placed on the substrate 5A. Thus, the intermediate layer 11 (second insulating layer) formed on the aluminum substrate body 10 receives a mechanical load due to the difference in the linear expansion coefficient or the like between the intermediate layer 11 and the aluminum substrate body 10 and may thereby be detached or have decreased dielectric strength. Further, the light emitting element 6 itself placed on the substrate 5A is influenced by a thermal history due to the difference in the linear expansion coefficient or the like from the aluminum substrate body 10 and may thereby have a shorter life. Accordingly, in the modification example of the first embodiment, as illustrated in FIG. 20, the buffer layer 250 is formed between the aluminum substrate body 10 (substrate body) and the intermediate layer 11 (second insulating layer).

The buffer layer 250 is a membrane that is formed on one surface (hereinafter referred to as surface) of the aluminum substrate body 10 by the thermal spraying or an aerosol deposition method (AD method) and is formed of a substance with a lower linear expansion coefficient than the aluminum substrate body 10. In addition, the linear expansion coefficient of the buffer layer 250 is preferably higher than the linear expansion coefficient of the intermediate layer 11 (second insulating layer). Further, the thickness of the buffer layer 250 is preferably 10 μm or more to 100 μm or less and further between 20 and 30 μm.

The buffer layer 250 whose linear expansion coefficient is lower than the aluminum substrate body 10 and is close to the intermediate layer 11 (second insulating layer) is interposed, the transmission of the mechanical load due to thermal expansion and contraction of the aluminum substrate body 10 to the light emitting element 6 may thereby be significantly reduced. Accordingly, the lives of the light emitting element 6 and further the light emitting device 4 may be extended, and reliability of the products may be improved.

Further, the buffer layer 250 is preferably a metal or alloy layer. The material of the metal or alloy layer used for the buffer layer 250 preferably contains at least any one of metal with a low linear expansion coefficient such as Ni, Ti, Co, Fe, Nb, Mo, Ta, or W.

In the modification example of the first embodiment, aluminum is used as the material of the substrate body. However, the substrate body is not limited as long as the substrate body is formed of a material with high thermal conduction. For example, a substrate formed of metal that contains aluminum, copper, stainless steel, or iron as a material may be used.

Particularly, in a case of the aluminum substrate body 10 (in which the material of the substrate body is aluminum), the buffer layer 250 preferably contains at least any one of Ni, Ti, and Co as a material, and the buffer layer 250 particularly preferably contains Ni as a material.

In addition, in order to enhance the bondability to the aluminum substrate body 10, the buffer layer 250 is preferably an alloy of nickel (Ni) and aluminum. In a case where the buffer layer 250 is an alloy of nickel (Ni) and aluminum, the ratio of Ni is preferably increased as much as possible in order to make the linear expansion coefficient close to an almost middle value of the aluminum substrate body 10 and the intermediate layer 11 (second insulating layer), and the ratio of nickel in the buffer layer 250 is preferably 90% or more as a weight ratio. As described later, this is because the linear expansion ratio of nickel is $13.4 \times 10^{-6}/°$ C. and this value almost corresponds with an intermediate value of the linear expansion coefficient of $15 \times 10^{-6}/°$ C. between both of aluminum and alumina as a representative ceramic material. The ratio of nickel of the buffer layer 250 formed of an alloy of nickel and aluminum is set to 90% or more as a weight ratio, and the linear expansion coefficient of the buffer layer 250 may thereby be allowed to fall between 13 to $16 \times 10^{-6}/°$ C., which is close to the value of $15 \times 10^{-6}/°$ C.

Further, the melting point of Ni is relatively low among the above metal but is actually as high as 1455° C. Forming the alloy with aluminum and Ni reduces the melting point, and the temperature necessary for preparing a molten state or half-molten state is lowered. This is convenient for formation of the buffer layer 250 (nickel layer) formed of an alloy of aluminum and Ni by the thermal spraying, for example.

In addition, in a case where the aluminum substrate body 10 (in which the material of the substrate body is aluminum) is used and the material of the intermediate layer 11 (second insulating layer) is alumina, the linear expansion coefficient of Ni is almost in the middle of the aluminum and alumina, and nickel is thus appropriate for the buffer layer 250.

When the linear expansion coefficients of the above-described metal are compared to each other at room temperature, the linear expansion coefficient of aluminum is $23 \times 10^{-6}/°$ C., but the linear expansion coefficients of nickel (Ni), titanium (Ti), and cobalt (Co) are lower than that and $13.4 \times 10^{-6}/°$ C., $8.6 \times 10^{-6}/°$ C., and $13.0 \times 10^{-6}/°$ C., respectively. Meanwhile, the linear expansion coefficient of alumina as a representative ceramic material is 6 to $8 \times 10^{-6}/°$ C. and around $7 \times 10^{-6}/°$ C. Thus, compared to aluminum and alumina (ceramics), nickel (Ni) and cobalt (Co) have almost middle linear expansion coefficients and are further preferable as metal used for the buffer layer 250.

Incidentally, the linear expansion coefficient of glass is largely different in accordance with the composition but falls in 3 to $9 \times 10^{-6}/°$ C. and is the linear expansion coefficient relatively close to alumina.

The buffer layer 250 is formed by the thermal spraying or the aerosol deposition method (AD method).

The formation method by the thermal spraying is as described above. The AD method is a technique that aerosolizes a fine particle or ultra-fine particle raw material which is in advance prepared by another scheme by mixing the fine particle or ultra-fine particle raw material with gas, injects the aerosol onto the substrate body through a nozzle, and thereby forms a film.

In order to further improve the adhesion between the aluminum substrate body 10 and the buffer layer 250, surface roughening of the surface of the aluminum substrate body 10 is performed by the blasting treatment or the like prior to the formation of the buffer layer 250.

[Second Embodiment]

Figure 8:
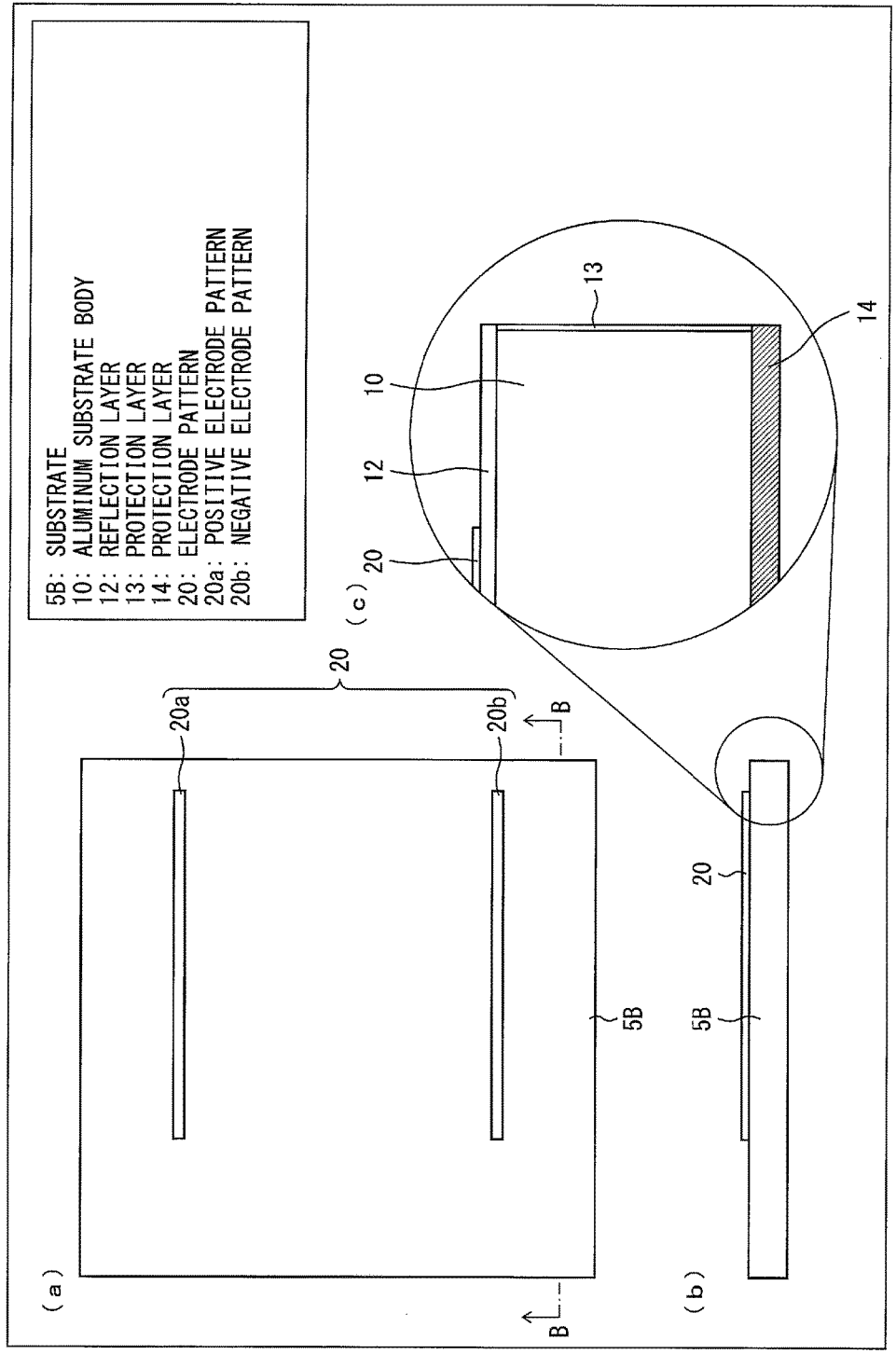
FIG. 8(a) is a plan view of a substrate according to a second embodiment of the present invention.
FIG. 8(b) is an arrow cross-sectional view thereof taken along line B-B.
FIG. 8(c) is a partially enlarged view of the cross section.
Figure 9:
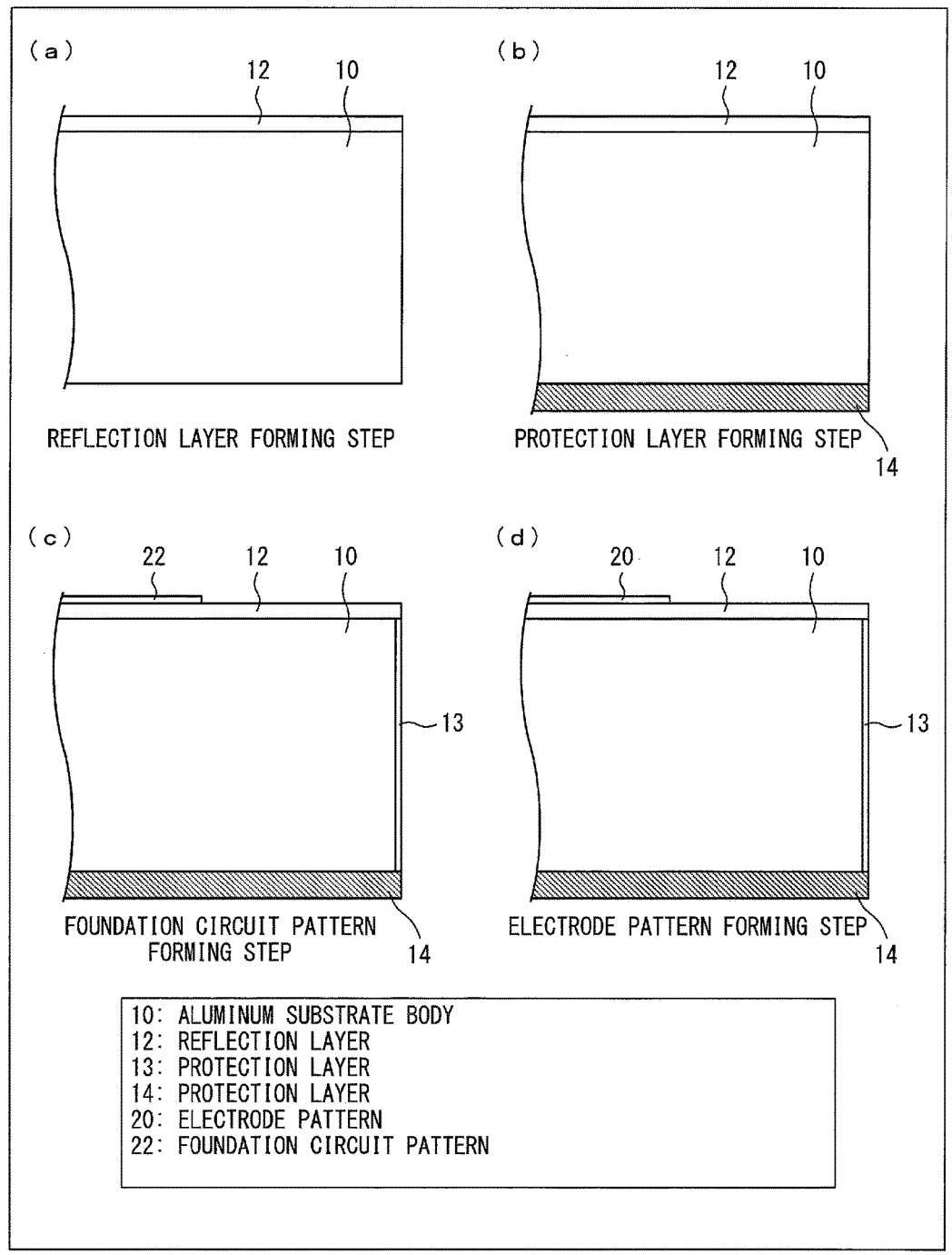
FIGS. 9(a) to 9(d) are schematic diagrams that explain producing steps of the substrate according to the second embodiment of the present invention.

A second embodiment of the present invention will be described below based on FIGS. 8 and 9.

For convenience of description, the same reference characters will be given to members that have the same functions as the members described in the first embodiment, and a description thereof will not be made.

In the first embodiment, the intermediate layer 11, the reflection layer 12, and the protection layer 13 are formed on the aluminum substrate body 10. The intermediate layer 11 is formed between the aluminum substrate body 10 and the reflection layer 12 by the thermal spraying and has high thermal conductivity.

Meanwhile, in the second embodiment, the reflection layer 12, the protection layer 13, and a protection layer 14 are formed on the aluminum substrate body 10. The reflection layer 12 is formed on the front surface (with FIG. 8(c) being a reference) of the aluminum substrate body 10. The protection layer 14 has the same material as the intermediate layer 11 described in the first embodiment and is formed on the back surface (the lower end surface) (with FIG. 8(c) being a reference) of the aluminum substrate body 10 by the thermal spraying. The protection layer 13 is the aluminum anodic oxide coating (anodized aluminum) and is formed on the side end surfaces (with FIG. 8(c) being a reference) of the aluminum substrate body 10. In the above configuration, the layer thickness of the protection layer 14 may be made sufficiently thicker than the intermediate layer 11. Accordingly, even in a case where desired dielectric strength may not be secured in the substrate 5A according to the first embodiment because the thickness of the intermediate layer 11 may not be increased, desired dielectric strength may be secured.

(Structure of Substrate 5B)

A structure of a substrate 5B according to the second embodiment will be described with reference to FIG. 8. FIG. 8(a) is a plan view of the substrate 5B (a substrate for light emitting devices) according to this embodiment, and FIG. 8(b) is an arrow cross-sectional view of FIG. 8(a) taken along line B-B. Further, FIG. 8(c) is a partially enlarged view of FIG. 8(b).

As illustrated in FIG. 8(c), in the substrate 5B, the reflection layer 12 is formed on the surface of the aluminum substrate body 10. The electrode pattern 20 is formed on the upper surface of the reflection layer 12.

The protection layer 14 (second insulating layer) is formed on the back surface of the aluminum substrate body 10. The protection layer 14 is formed on the aluminum substrate body 10, of the same material and by the same method as the intermediate layer 11 described in the first embodiment. That is, the protection layer 14 contains ceramics formed by the thermal spraying. The protection layer 13 is an anodic oxide coating (anodized aluminum) formed on the side end surfaces of the aluminum substrate body 10 by the anodic oxidation treatment. The intermediate layer 11 described in the first embodiment is not formed on the substrate 5B. In this embodiment, the protection layer 14 plays the role of the intermediate layer 11.

As the substrate 5A described in the first embodiment, in a structure in which the reflection layer 12 and the intermediate layer 11 are arranged immediately under the light emitting element 6 (see FIG. 16), the thermal resistances of the reflection layer 12 and the intermediate layer 11 largely influence the thermal resistance of whole the substrate 5A. In a case where the layer thickness of the intermediate layer 11 has to be made thicker than planned in order to obtain desired dielectric strength, a case is possible where the thermal resistance rises higher than planned. To avoid this, the protection layer 14 instead of the intermediate layer 11 may be formed on the lower end surface of the aluminum substrate body 10 that is separated from the light emitting element 6 (see FIG. 16) as the heat source.

The protection layer 14 whose thermal conductivity is low compared to the aluminum substrate body 10 is formed on the back surface of the aluminum substrate body 10, separately from the light emitting element 6 (see FIG. 16), and the thermal resistance of the protection layer 14 may be made lower than the intermediate layer 11 even if the protection layer 14 has the same thermal conductivity as the intermediate layer 11. The heat diffuses in the horizontal direction, which is parallel to the surface of the substrate 5B, before passing through the protection layer 14.

As described above, the contribution ratio of the thermal resistance provided by the protection layer 14 to the thermal resistance of whole the substrate 5B may be made very low compared to the contribution ratio of the thermal resistance provided by the intermediate layer 11 of the first embodiment. Thus, the thickness of the protection layer 14 may be made sufficiently thicker than a case where the layer is used as the intermediate layer 11, and the dielectric strength may thereby be enhanced. In this case, even if the thickness of the protection layer 14 is increased, the influence of the thermal resistance of the protection layer 14 on the thermal resistance of whole the substrate 5B is small. Thus, the substrate 5B may secure necessary dielectric strength while maintaining the low thermal resistance even in a case where an increase in the thickness of the protection layer 14 is necessary.

Specifically, in a case where the thickness of the intermediate layer 11 in the first embodiment exceeds 500 μm, for example, the thermal resistance for the light emitting element 6 (see FIG. 16) of the light emitting device 4 (see FIG. 16) becomes high. Accordingly, employment of this embodiment is particularly preferable. In a case where the heat dissipation has to have the highest priority even if the thickness of the intermediate layer 11 is 500 μm or less, the dielectric strength of the substrate 5B is preferably secured not by the intermediate layer 11 but by the protection layer 14.

Whether main dielectric strength is secured by the intermediate layer 11 formed on the surface of the aluminum substrate body 10 as in the first embodiment or secured by the protection layer 14 formed on the back surface of the aluminum substrate body 10 as in this embodiment depends on what kind of illumination device is used; therefore, the determination may not be made based only on the thermal resistance and the easiness of the method for producing. Either one of the first embodiment and this embodiment may be selected as a structure of the substrate for light emitting devices that is configured according to the present invention. In a case where a copper substrate body is used instead of the aluminum substrate body 10, this embodiment works similarly.

(Method for Producing Substrate 5B According to Second Embodiment)

A method for producing the substrate 5B according to the second embodiment will be described with reference to FIG. 9. FIGS. 9(a) to 9(d) are schematic diagrams that explain producing steps of the substrate 5B according to the second embodiment of the present invention.

As illustrated in FIG. 9(a), the reflection layer 12 is first formed on the surface of the aluminum substrate body 10 (reflection layer forming step). The formation method of the reflection layer 12 is the same as the formation method of the reflection layer 12 of the first embodiment.

As illustrated in FIG. 9(b), the protection layer 14 is thereafter formed on the back surface of the aluminum substrate body 10 (protection layer forming step). The formation method of the protection layer 14 is the same as the formation method of the intermediate layer 11 of the first embodiment. Here, the protection layer 14 is formed in a position separated from the light emitting element 6 (see FIG. 16), and the thermal resistance may thus be maintained low even if the thickness of the protection layer 14 is formed thicker than the thickness of the intermediate layer 11.

As illustrated in FIG. 9(c), after the protection layer 13 is formed on the side end surfaces of the aluminum substrate body 10, as illustrated in FIG. 9(c), the foundation circuit pattern 22 is next formed on the upper surface of the reflection layer 12, similarly to the first embodiment (foundation circuit pattern forming step). As illustrated in FIG. 9(d), the electrode pattern 20 is thereafter formed (electrode pattern forming step).

As described above, the intermediate layer 11 described in the first embodiment is not formed in this embodiment. Accordingly, the intermediate layer forming step may be omitted in this embodiment.

[Modification Example of Second Embodiment]

Figure 21:
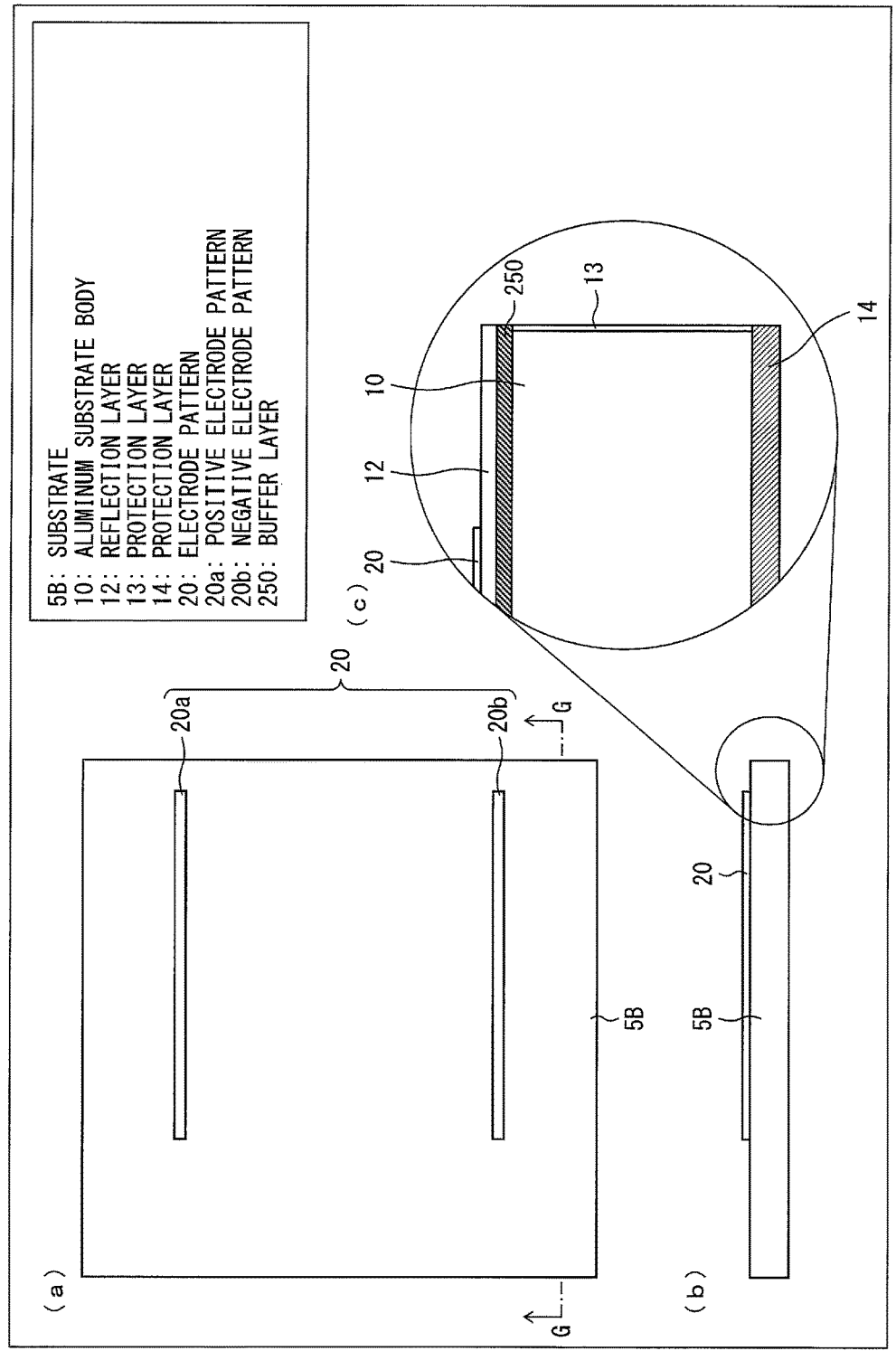

A modification example of the second embodiment of the present invention will be described below based on FIG. 21. FIG. 21 is a diagram that explains the modification example of the substrate 5B according to this embodiment, in which FIG. 21(a) is a plan view of the modification example of the substrate 5B, FIG. 21(b) is an arrow cross-sectional view of FIG. 21(a) taken along line G-G, and FIG. 21(c) is a partially enlarged view of FIG. 21(b).

As illustrated in FIG. 21(c), a different point from the second embodiment is a point that the buffer layer 250 is formed between the aluminum substrate body 10 (substrate body) and the reflection layer 12. In the second embodiment, in a case where the reflection layer 12 is formed on the aluminum substrate body 10 formed of metal to provide the substrate for light emitting devices, particularly a case where the substrate for light emitting devices is used as a substrate for high power output light emitting devices, the aluminum substrate body 10 formed of metal repeatedly expands and contracts due to an influence of the heat generated in the light emitting element 6 that is placed on the substrate 5B. Thus, the reflection layer 12 formed on the aluminum substrate body 10 receives a mechanical load due to the difference in the linear expansion coefficient or the like between the reflection layer 12 and the aluminum substrate body 10 and may thereby be detached or have decreased dielectric strength. Further, the light emitting element 6 itself placed on the substrate 5B is influenced by a thermal history due to the difference in the linear expansion coefficient or the like between the light emitting element 6 and the aluminum substrate body 10 and may thereby have a shorter life. Accordingly, in the modification example of the second embodiment, as illustrated in FIG. 21, the buffer layer 250 is formed between the aluminum substrate body 10 (substrate body) and the reflection layer 12.

The buffer layer 250 is similar to the buffer layer 250 described in the modification example of the first embodiment and is described in the modification example of the first embodiment. Thus, a description thereof will not be made here.

A similar buffer layer to the buffer layer 250 is further preferably formed between the aluminum substrate body 10 and the protection layer 14.

In the modification example of the second embodiment, aluminum is used as the material of the substrate body. However, the substrate body is not limited as long as the substrate body is formed of a material with high thermal conduction. For example, a substrate formed of metal that contains aluminum, copper, stainless steel, or iron as a material may be used.

[Third Embodiment]

Figure 10:
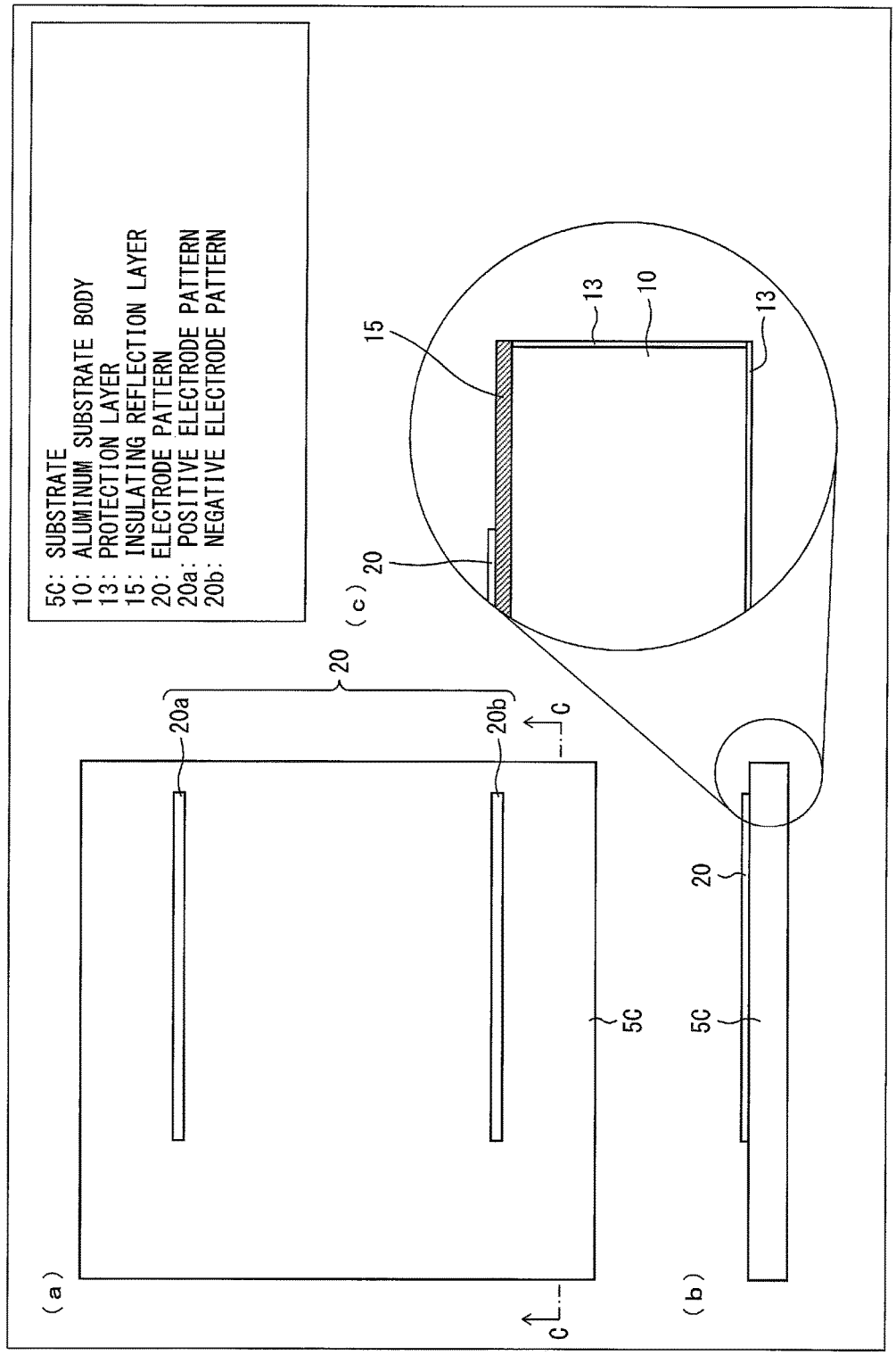
FIG. 10(a) is a plan view of a substrate according to a third embodiment of the present invention.
FIG. 10(b) is an arrow cross-sectional view thereof taken along line C-C.
FIG. 10(c) is a partially enlarged view of the cross section.
Figure 11:
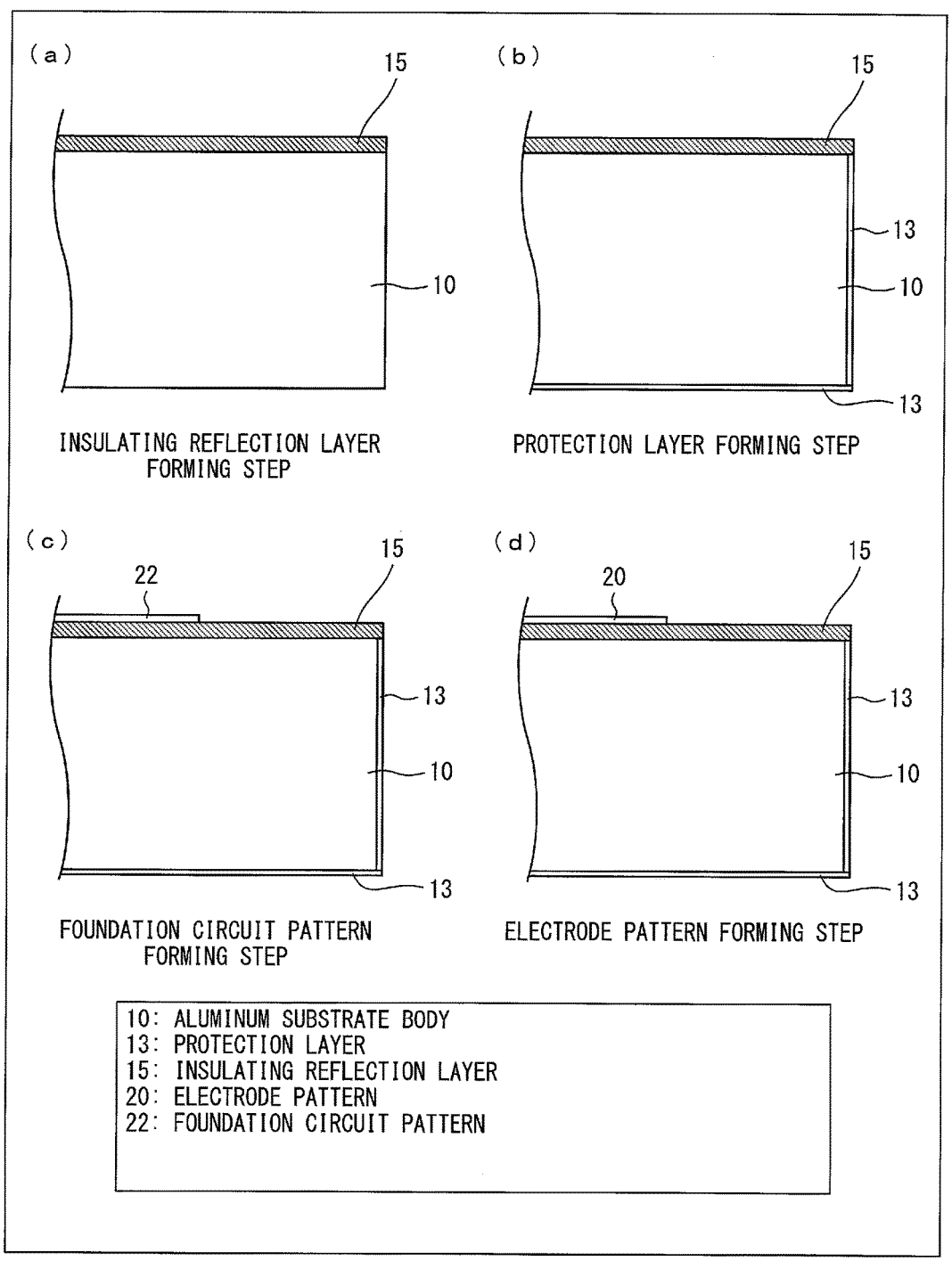
FIGS. 11(a) to 11(d) are schematic diagrams that explain producing steps of the substrate according to the third embodiment of the present invention.

A third embodiment of the present invention will be described below based on FIGS. 10 and 11.

For convenience of description, the same reference characters will be given to members that have the same functions as the members described in the first embodiment, and a description thereof will not be made.

In the first embodiment, the intermediate layer 11, the reflection layer 12, and the protection layer 13 are formed on the aluminum substrate body 10. The intermediate layer 11 is formed between the aluminum substrate body 10 and the reflection layer 12 by the thermal spraying and has high thermal conductivity.

Meanwhile, in the third embodiment, an insulating reflection layer 15 and the protection layer 13 are formed on the aluminum substrate body 10. The insulating reflection layer 15 is formed on the surface (upper end surface) (with FIG. 10(c) being a reference) of the aluminum substrate body 10. The insulating reflection layer 15 is the intermediate layer 11 in the first embodiment, whose reflection is enhanced.

In the above configuration, a substrate for light emitting devices that is suitable for high luminance illumination may be provided only by the insulating reflection layer 15.

(Structure of Substrate 5C)

A structure of a substrate 5C according to the third embodiment will be described with reference to FIG. 10. FIG. 10(a) is a plan view of the substrate 5C (a substrate for light emitting devices) according to this embodiment, and FIG. 10(b) is an arrow cross-sectional view of FIG. 10(a) taken along line C-C. Further, FIG. 10(c) is a partially enlarged view of FIG. 10(b).

As illustrated in FIG. 10(c), in the substrate 5C, the insulating reflection layer 15 (insulating layer) is formed on the surface of the aluminum substrate body 10. The electrode pattern 20 is formed on an upper surface of the insulating reflection layer 15.

In the first embodiment, alumina as ceramics with high thermal conductivity, for example, is formed as the intermediate layer 11 between the aluminum substrate body 10 and the reflection layer 12. However, only the intermediate layer 11 with high reflectance may provide a substrate for light emitting devices that is suitable for high luminance illumination, without the reflection layer 12.

However, the reflectance of the layer formed by the thermal spraying with alumina alone as the thermal spraying material is a maximum of 85%, and proper light reflectance is obtained. However, the reflectance that exceeds 90% to 95% and is used for high luminance illumination may not be obtained. In order to form a layer that has such high reflectance, an add-in material of an inorganic material to improve whiteness has to be added to alumina as a base.

Examples of the add-in materials may include titanium oxide, magnesium oxide, zinc oxide, barium sulfate, zinc sulfate, magnesium carbonate, calcium carbonate, wollastonite, and so forth as inorganic white materials. The thermal spraying is performed with the above add-in material, which is appropriately selected and mixed with alumina, as the thermal spraying material onto the aluminum substrate body 10. Accordingly, a layer may thereby be formed, which has the reflectance exceeding 90% to 95% which may not be achieved by the layer formed of alumina alone as the thermal spraying material. In this case, because each substance as the thermal spraying material has a different melting point, the high velocity flame thermal spraying (HVOF) that may handle a substance with a high melting point is preferable as a thermal spraying method of this embodiment. The plasma thermal spraying may handle a portion of the substances, but the high velocity flame thermal spraying that is capable of forming a fine and homogeneous layer is further preferable. The high velocity flame thermal spraying may form a fine mixed ceramic layer with homogeneous composition.

(Method for Producing Substrate 5C According to Third Embodiment)

A method for producing the substrate 5B according to the third embodiment will be described with reference to FIG. 11. FIGS. 11(a) to 11(d) are schematic diagrams that explain producing steps of the substrate 5C according to the third embodiment of the present invention.

As illustrated in FIG. 11(a), the insulating reflection layer 15 is first formed on the surface of the aluminum substrate body 10 (insulating reflection layer forming step). The formation method of the insulating reflection layer 15 is almost the same as the formation method of the intermediate layer 11 of the first embodiment, but the thermal spraying material for the thermal spraying onto the aluminum substrate body 10 is different. In the first embodiment, the thermal spraying is performed with alumina alone as the thermal spraying material. However, in this embodiment, the thermal spraying material is prepared by appropriately mixing alumina with the add-in material for increasing whiteness, and the thermal spraying is thereby performed. Further, as described above, the high velocity flame thermal spraying is preferably used as the thermal spraying method of this embodiment.

In this case, because the insulating reflection layer 15 has high reflectance, a substrate for light emitting devices that is suitable for high luminance illumination may be provided only by the insulating reflection layer 15, even without the reflection layer 12. Accordingly, the reflection layer forming step may be omitted.

As illustrated in FIG. 11(b), the protection layer 13 is thereafter formed to cover the back surface and the side end surfaces of the aluminum substrate body 10 (protection layer forming step). The formation method of the protection layer 13 is the same as the first embodiment.

As illustrated in FIG. 11(c), the foundation circuit pattern 22 is next formed on the upper surface of the insulating reflection layer 15 (foundation circuit pattern forming step). As illustrated in FIG. 11(d), the electrode pattern 20 is thereafter formed (electrode pattern forming step). The formation methods of the foundation circuit pattern 22 and the electrode pattern 20 are the same as the first embodiment.

[Modification Example 1 of Third Embodiment]

Figure 12:
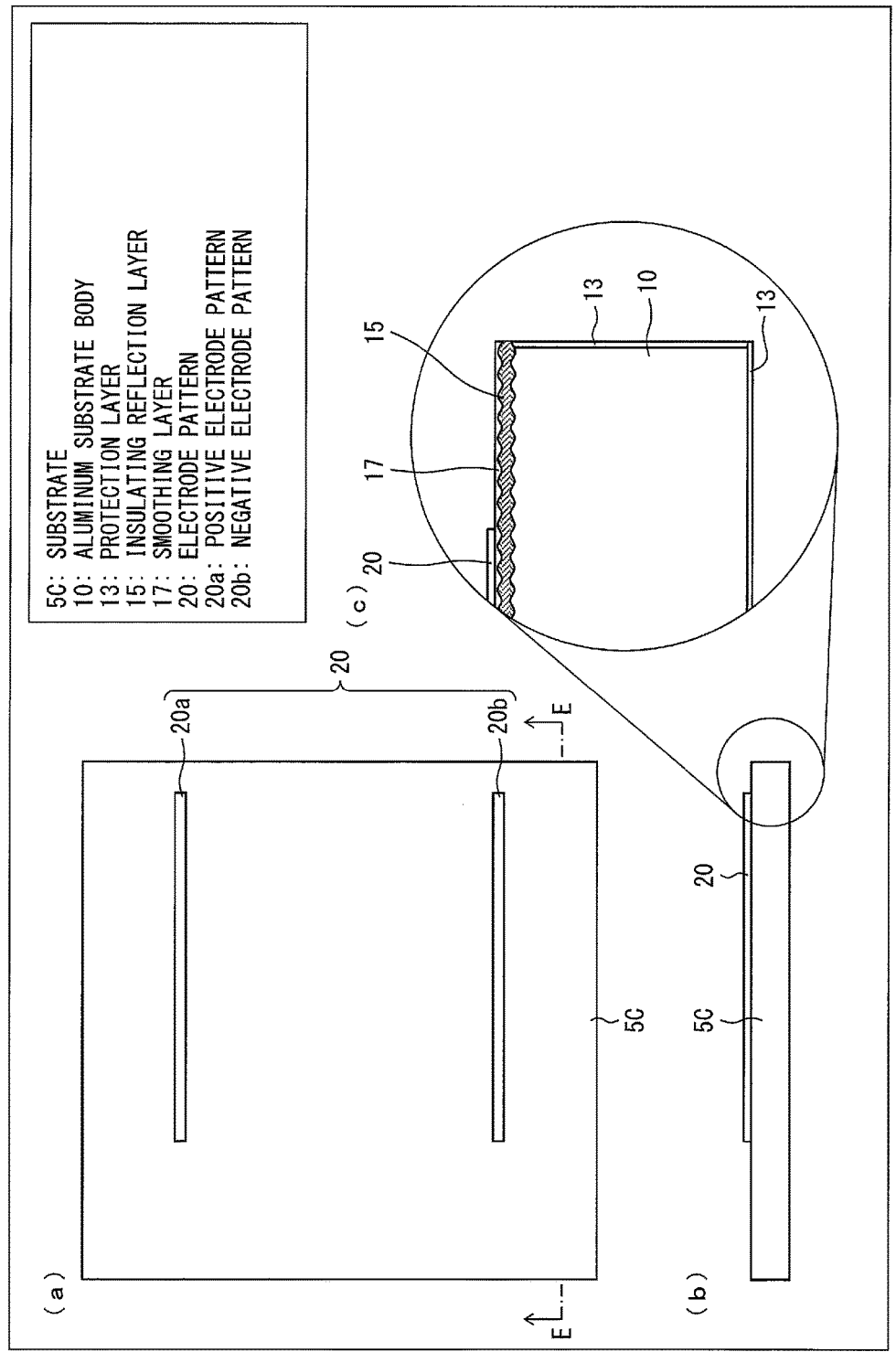

A modification example of the third embodiment of the present invention will be described below based on FIG. 12. FIG. 12 is a diagram that explains the modification example of the substrate 5C according to this embodiment, in which FIG. 12(a) is a plan view of the modification example of the substrate 5C, FIG. 12(b) is an arrow cross-sectional view of FIG. 12(a) taken along line E-E, and FIG. 12(c) is a partially enlarged view of FIG. 12(b).

In the above-described substrate 5C, the thermal spraying material is prepared by appropriately mixing alumina with the add-in material for increasing whiteness, and the insulating reflection layer 15 that is formed by the thermal spraying of the thermal spraying material onto the aluminum substrate body 10 realizes high reflectance, which is suitable for high luminance illumination. However, as already mentioned in the first embodiment, in a case where the alumina layer is laminated by the thermal spraying, increasing the layer thickness may result in a rough surface. Further, in a case where the surface of the aluminum substrate body 10 is formed uneven by the blasting treatment for the purpose of enhancing the adhesion between the insulating reflection layer 15 and the aluminum substrate body 10 and the insulating reflection layer 15 is thereafter laminated on the aluminum substrate body 10 by the thermal spraying, the influence of an uneven shape of the aluminum substrate body 10 remains on the surface of the laminated insulating reflection layer 15.

In a case where the foundation circuit pattern 22 is formed on the surface that has such an uneven shape, wire breaking occurs in the foundation circuit pattern 22. Further, it is possible that high resistance or the like occurs due to insufficient contact between the light emitting element 6 (see FIG. 16) and the insulating reflection layer 15 on which the light emitting element 6 is installed.

In such a case, the formation method of the reflection layer 12 described in the first embodiment may be applied without any change. That is, the reflection layer 12 with a minimum thickness that satisfies the purpose of smoothly covering the unevenness produced on the surface of the insulating reflection layer 15 may be formed on the upper surface of the insulating reflection layer 15. Specifically, in a case where the difference in the unevenness is 20 µm, the reflection layer 12 with a thickness slightly exceeding 20 µm from the bottom of a recess may be formed. In a case where the difference in the unevenness is 50 µm, the reflection layer 12 with a thickness slightly exceeding 50 µm from the bottom of the recess may be formed.

Because the insulating reflection layer 15 realizes high reflectance, the substrate 5C does not request obtainment of high reflectance by the reflection layer 12. Accordingly, the reflection layer 12 may have a minimum thickness that satisfies the purpose of smoothly covering the unevenness of the surface of the insulating reflection layer 15.

Further, in order to achieve the above-described purpose of smoothly covering the unevenness of the surface of the insulating reflection layer 15, only a glass-based binder that is not mixed with ceramic particles or a resin binder that has light resistance and heat resistance is cured by drying, firing, and so forth. As illustrated in FIG. 12(c), a transparent smoothing layer 17 may thereby be formed on the insulating reflection layer 15. In a case where the heat dissipation is important, inhibition of the reflectance of the insulating reflection layer 15 is avoided as much as possible, and ceramic particle with high thermal conductivity but with as low light absorption as possible is mixed with a glass-based binder or a resin binder and cured, and the transparent smoothing layer 17 may thereby be obtained. Further, the surface of the insulating reflection layer 15 on which the uneven shape is formed may be smoothed by mechanical polishing.

In the above configuration, the light emitting element 6 is installed on the smoothing layer 17 or a surface that is smoothed by mechanical polishing, and the smoothing layer 17 or the insulating reflection layer 15 makes surface contact with the light emitting element 6. Accordingly, detachment of the light emitting element 6 may be avoided, and the thermal resistance of the substrate 5C may be reduced in addition. Thus, the reliability of the light emitting device 4 (see FIG. 16) may be secured.

Similarly, the electrode pattern 20 is formed on a surface of the transparent smoothing layer 17 or the surface of the insulating reflection layer 15 that is smoothed by mechanical polishing, and the electrode pattern may thus avoid detachment.

In a case where contamination by polishing grains produced in the mechanical polishing on the surface of the insulating reflection layer 15, or damage or the like to the insulating reflection layer 15 causes a problem, the above-described method in which the unevenness of the surface of the insulating reflection layer 15 is smoothly covered by the reflection layer 12 or the transparent smoothing layer 17 is preferable.

[Modification Example 2 of Third Embodiment]

Figure 22:
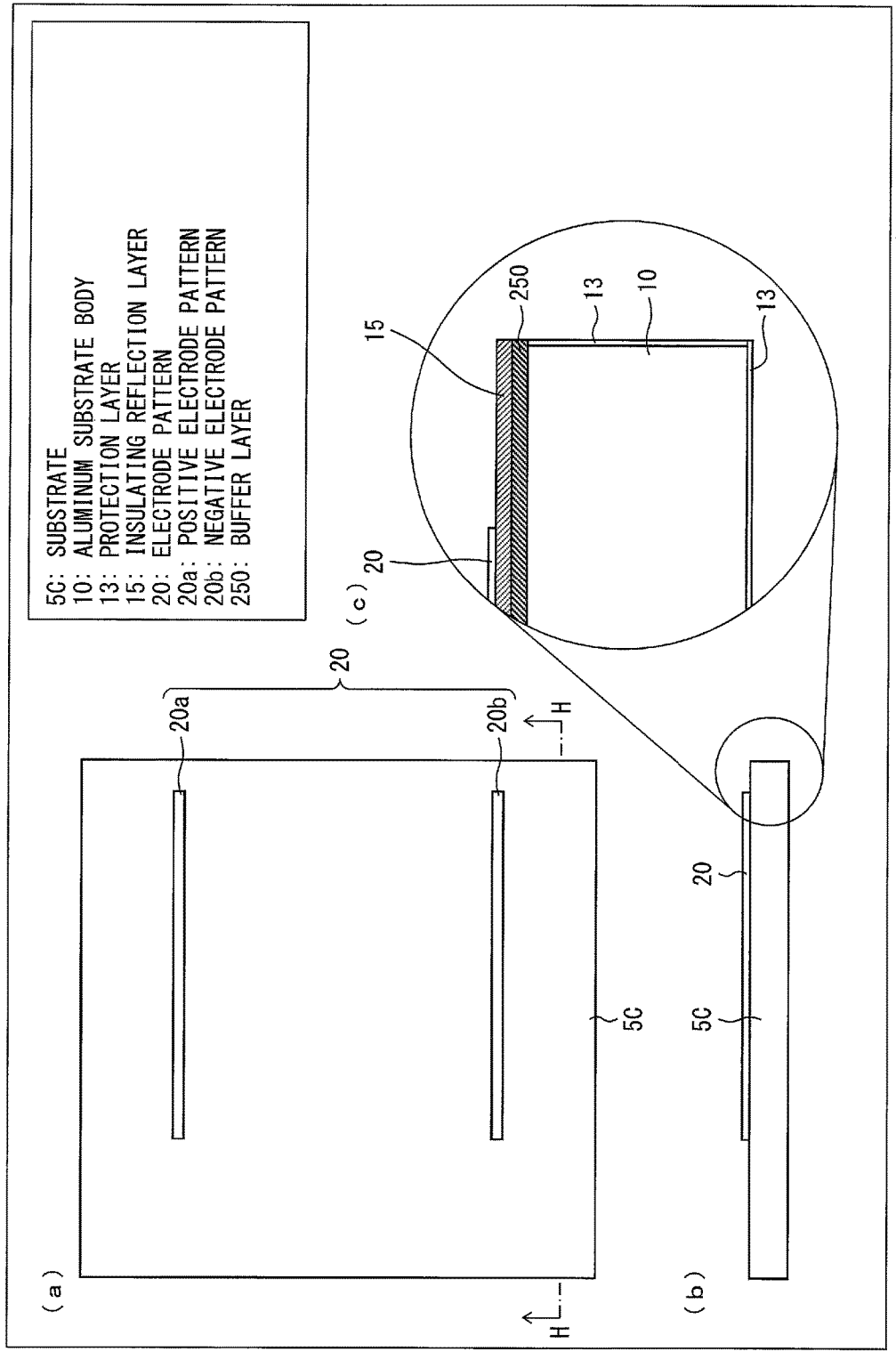

A modification example 2 of the third embodiment of the present invention will be described below based on FIG. 22. FIG. 22 is a diagram that explains the modification example 2 of the substrate 5C according to this embodiment, in which FIG. 22(*a*) is a plan view of the modification example 2 of the substrate 5C, FIG. 22(*b*) is an arrow cross-sectional view of FIG. 22(*a*) taken along line H-H, and FIG. 22(*c*) is a partially enlarged view of FIG. 22(*b*).

As illustrated in FIG. 22(*c*), a different point from the third embodiment is a point that the buffer layer 250 is formed between the aluminum substrate body 10 (substrate body) and the insulating reflection layer 15. In the third embodiment, in a case where the insulating reflection layer 15 is formed on the aluminum substrate body 10 formed of metal to provide the substrate for light emitting devices, particularly a case where the substrate for light emitting devices is used as a substrate for high power output light emitting devices, the aluminum substrate body 10 formed of metal repeatedly expands and contracts due to an influence of the heat generated in the light emitting element 6 that is placed on the substrate 5C. Thus, the insulating reflection layer 15 formed on the aluminum substrate body 10 receives a mechanical load due to the difference in the linear expansion coefficient or the like between the insulating reflection layer 15 and the aluminum substrate body 10 and may thereby be detached or have decreased dielectric strength. Further, the light emitting element 6 itself placed on the substrate 5C is influenced by a thermal history due to the difference in the linear expansion coefficient or the like between the light emitting element 6 and the aluminum substrate body 10 and may thereby have a shorter life. Accordingly, in the modification example 2 of the third embodiment, as illustrated in FIG. 22, the buffer layer 250 is formed between the aluminum substrate body 10 (substrate body) and the insulating reflection layer 15.

The buffer layer 250 is similar to the buffer layer described in the modification example of the first embodiment and is described in the modification example of the first embodiment. Thus, a description thereof will not be made here.

In the modification example 2 of the third embodiment, aluminum is used as the material of the substrate body. However, the substrate body is not limited as long as the substrate body is formed of a material with high thermal conduction. For example, a substrate formed of metal that contains aluminum, copper, stainless steel, or iron as a material may be used.

Figure 23:
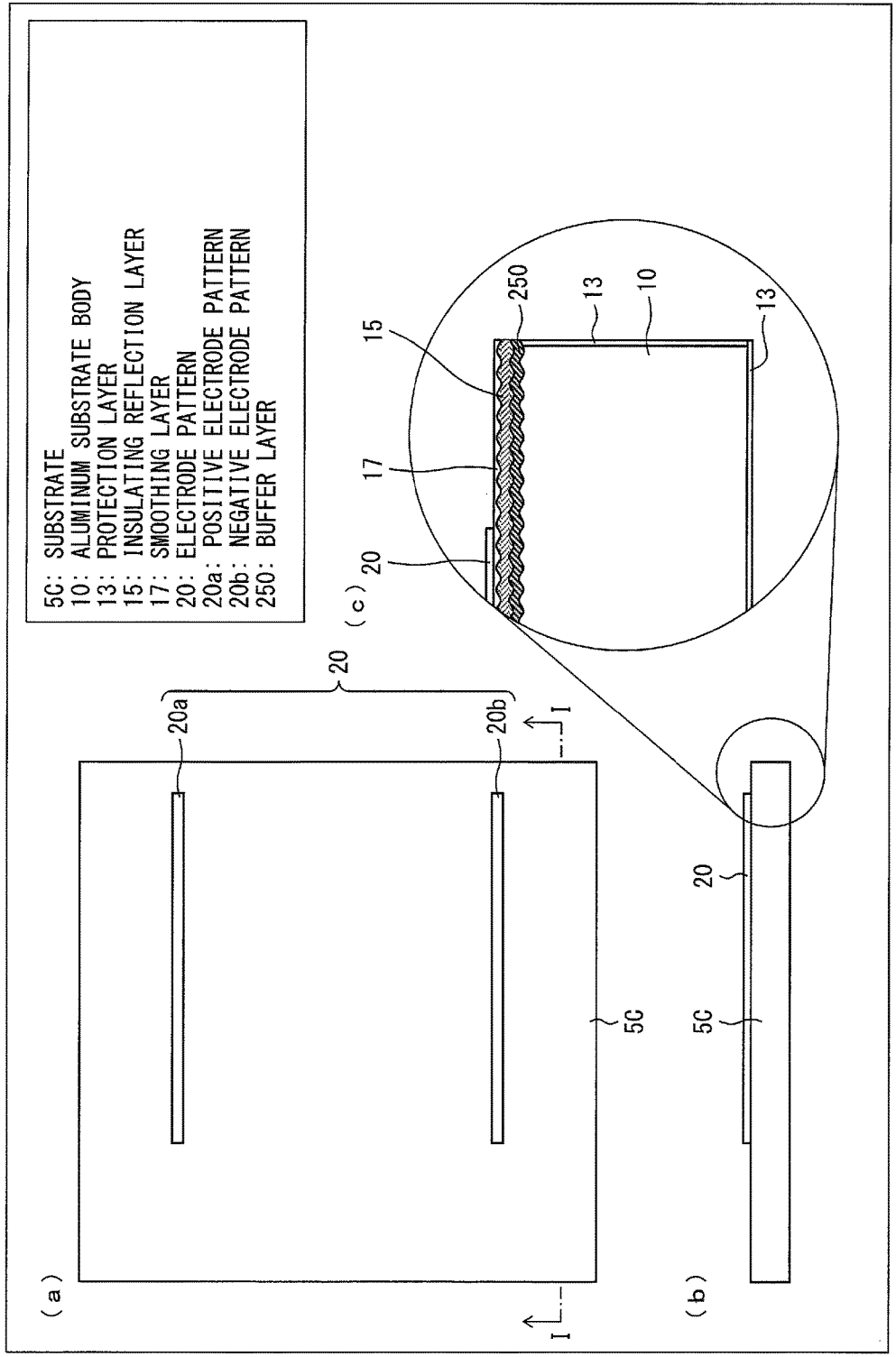

Further, as illustrated in FIG. 23, also in a structure described in the modification example 1 of the third embodiment, the buffer layer 250 is preferably formed between the aluminum substrate body 10 (substrate body) and the insulating reflection layer 15. FIG. 23 is a diagram that explains another example of the modification example 2 of the substrate 5C according to this embodiment, in which FIG. 23(*a*) is a plan view of the other example of the modification example 2 of the substrate 5C, FIG. 23(*b*) is an arrow cross-sectional view of FIG. 23(*a*) taken along line I-I, and FIG. 23(*c*) is a partially enlarged view of FIG. 23(*b*).

Specifically, discussing a case where an LED with a sapphire substrate is used for the light emitting element 6 and alumina is used for the insulating reflection layer 15, the linear expansion coefficient of the sapphire is $7 \times 10^{-6}/°$ C. and is almost the same of the alumina, and the thermal expansion and contraction synchronously occur. Thus, the mechanical load to the light emitting element 6 due to the thermal expansion and contraction of the insulating reflection layer 15 itself may generally be ignored. Further, the mechanical load due to the thermal expansion and contraction of the aluminum substrate body 10 with a linear expansion coefficient of $23 \times 10^{-6}/°$ C. is transmitted to the insulating reflection layer 15 while being reduced via the buffer layer 250 with a lower linear expansion coefficient than the aluminum substrate body 10 and is transmitted to the light emitting element 6 while being further reduced via the insulating reflection layer 15. Accordingly, the mechanical load to the light emitting element 6 is significantly reduced.

[Fourth Embodiment]

In this embodiment, an improvement in the adhesion between the aluminum substrate body 10 and the ceramic layer (the intermediate layer 11) formed by the thermal spraying will be described based on FIGS. 13 to 15.

In the substrate 5A according to the first embodiment, the intermediate layer 11 may be formed by the thermal spraying on the aluminum substrate body 10 itself without performing any treatment for the surface of the aluminum substrate body 10.

Differently, in the fourth embodiment, the blasting treatment is performed for the surface of the aluminum substrate body 10, and the intermediate layer 11 is thereafter formed by the thermal spraying on the aluminum substrate body 10. In the above configuration, the adhesion between the aluminum substrate body 10 and the intermediate layer 11 may be improved.

First, the improvement in the adhesion between the aluminum substrate body 10 and the intermediate layer 11 will be described with reference to FIG. 13. FIG. 13 is a diagram for explaining the improvement in the adhesion between the aluminum substrate body 10 and the intermediate layer 11.

Figure 13:
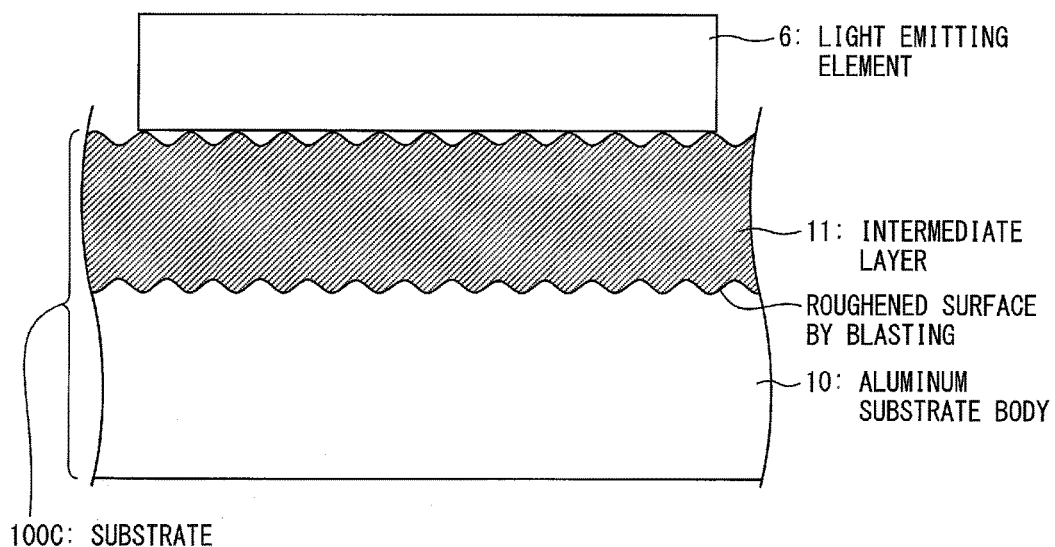
FIG. 13 is a diagram for explaining an improvement in adhesion between a substrate body and a ceramic layer formed on the substrate body by thermal spraying.

As illustrated in FIG. 13, in a substrate 100C, the intermediate layer 11 is formed on the surface of the aluminum substrate body 10. The light emitting element 6 is formed on the upper surface of the intermediate layer 11. In the substrate 100C, in order to improve the adhesion between the aluminum substrate body 10 and the intermediate layer 11, for example, the surface roughening by the blasting treatment is performed for the surface of the aluminum substrate body 10 before the intermediate layer 11 is formed on the aluminum substrate body 10 by the thermal spraying of alumina. The blasting treatment is performed by causing fine particles accelerated by carrier gas such as compressed air to spout out from a nozzle and to collide with the aluminum substrate body 10 at a high velocity and a high density, for example. In a case of performing the blasting treatment for metal, alumina is most commonly used as the fine particles. The intermediate layer 11 is next formed on the roughened surface of the aluminum substrate body 10 by the thermal spraying of alumina. As a result, the adhesion between the aluminum substrate body 10 and the intermediate layer 11 may be improved.

Meanwhile, in a case where the surface roughening by the blasting treatment is performed for the surface of the aluminum substrate body 10, the surface of the aluminum substrate body 10 has an uneven shape. Due to the influence of the uneven shape, the surface of the intermediate layer 11 formed on the surface of the aluminum substrate body 10 also has an uneven shape. In a case where the light emitting element 6 is installed on the surface of the intermediate layer 11 on which the uneven shape is formed, the intermediate layer 11 makes point contact with the light emitting element 6. This results in a problem that the heat dissipation of the substrate 100C degrades and the substrate 100C thereby has a high thermal resistance. Further, a problem occurs that the point contact may cause detachment of the light emitting element 6 in a temperature cycle test or the like.

Accordingly, to solve the above problems, in this embodiment, as illustrated in FIG. 14, the uneven shape of the intermediate layer 11 formed by the thermal spraying of alumina is covered and smoothed by the reflection layer 12. FIG. 14 is a schematic cross-sectional view of the substrate 5A according to this embodiment. In this case, the reflection layer 12 may thickly be formed to cover and smooth the uneven shape of the intermediate layer 11.

In the above configuration, the light emitting element 6 is installed on the smoothed surface of the reflection layer 12, and the reflection layer 12 thus makes surface contact with the light emitting element 6. As a result, detachment of the light emitting element 6 in the temperature cycle test or the like may be avoided. Further, the thermal resistance of the substrate 5A may be reduced, and the reliability of the light emitting device 4 (see FIG. 16) may thereby be secured. Similarly, the electrode pattern 20 (see FIG. 1) is formed on the smoothed surface of the reflection layer 12, and detachment of the electrode pattern 20 may thus be avoided.

As described above, the reflection layer 12 is a mixed layer of a vitreous material and the light reflective ceramics or a mixed layer of a resin and the light reflective ceramics and is thus formed of a glass layer (sol-gel paint) or a resin layer (thermosetting resin or thermoplastic resin), whose uncured raw material is in a liquid state and has fluidity or is at least plastic. Thus, the reflection layer 12 easily covers the uneven shape of the intermediate layer 11 and may thereby smooth the surface on which the light emitting element 6 is installed. It is sufficient that the thickness of the reflection layer 12 is a minimum necessary thickness that may realize desired reflectance and a minimum necessary thickness that may cover the uneven shape of the surface of the intermediate layer 11 and thereby smooth the surface on which the light emitting element 6 is installed.

Figure 15:
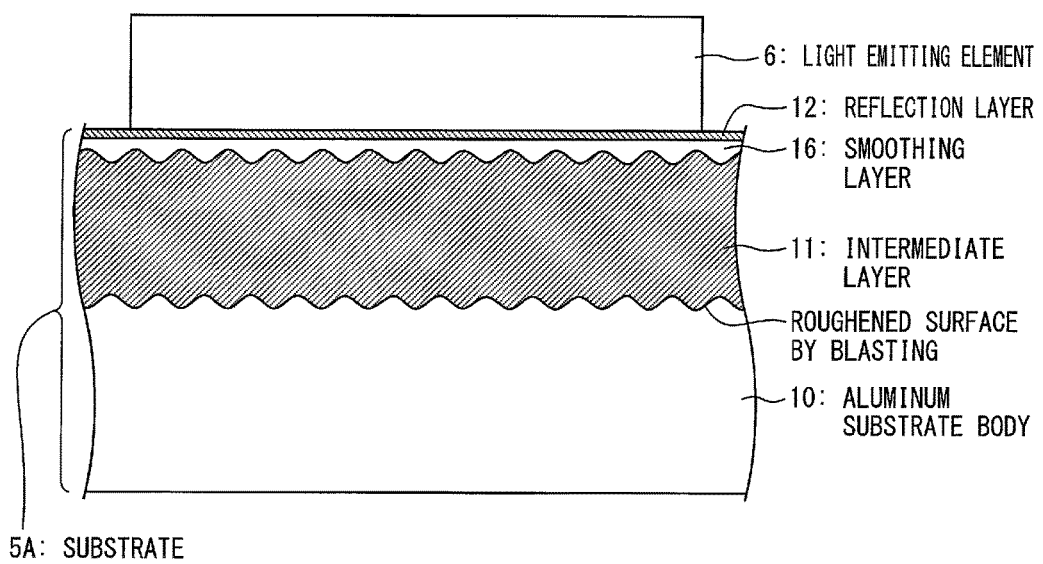
FIG. 15 is a schematic cross-sectional view that illustrates another example of the substrate according to the fourth embodiment of the present invention.

Further, in the substrate 5A according to the first embodiment, in a case where the blasting treatment is performed for the surface of the aluminum substrate body 10 and the adhesion between the aluminum substrate body 10 and the intermediate layer 11 is thereby improved, as illustrated in FIG. 15, the installation surface of the light emitting element 6 may be smoothed by providing a smoothing layer 16 between the reflection layer 12 and the intermediate layer 11. FIG. 15 is a schematic cross-sectional view that illustrates another example of the substrate 5A according to this embodiment. In this case, the smoothing layer 16 preferably has higher thermal conductivity than the reflection layer 12. The smoothing layer 16 with higher thermal conductivity than the reflection layer 12 is provided, and the thermal resistance of the substrate 5A may thereby be further reduced.

The smoothing layer 16 is a mixed layer of a vitreous material and ceramics or a mixed layer of a resin and ceramics. Ceramic particles with higher thermal conductivity than the ceramic particles contained in the reflection layer 12 is preferably selected as the ceramic particles contained in the smoothing layer 16. As the ceramic particles used for the smoothing layer 16, alumina, aluminum nitride, silicon nitride, silicon carbide, and so forth are preferable.

Here, the uneven shape formed on the surface of the intermediate layer 11 relates to the magnitude of diameter of ceramic particles used in the thermal spraying, other than the surface roughening by the blasting treatment of the surface of the aluminum substrate body 10.

For example, in a case where the intermediate layer 11 (alumina layer) of 200 μm is laminated by the plasma thermal spraying by using alumina particles whose particle diameter is 50 μm or less on the surface of the aluminum substrate body 10 for which the surface roughening by the blasting treatment is performed, the difference between the maximum height and the minimum height of the uneven shape of the surface of the intermediate layer 11 becomes 40 to 60 μm.

Differently, in a case where the intermediate layer 11 (alumina layer) of 200 μm is laminated by the plasma thermal spraying by using alumina particles whose particle diameter is 20 μm or less on the surface of the aluminum substrate body 10 for which the surface roughening by the blasting treatment is performed, the difference between the maximum height and the minimum height of the uneven shape of the surface of the intermediate layer 11 becomes 15 to 30 μm. As described above, the particle diameter of the ceramic particle used in the thermal spraying is reduced, and the difference between the maximum height and the minimum height of the uneven shape of the surface of the intermediate layer 11 may thereby be reduced.

Here, a method of smoothing the unevenness produced on the surface of the intermediate layer 11 due to the blasting treatment will be described. However, an uneven surface to which the smoothing scheme is applied is not limited to a surface due to the blasting treatment, but it should be noted that the scheme may widely be applied as a scheme for smoothing unevenness produced on the surface of the intermediate layer 11. For example, in order to smooth the ceramic layer for which the blasting treatment is not performed and which is formed by the thermal spraying, the scheme of the fourth embodiment described based on FIGS. 13 to 15 may be applied.

[Modification Example of Fourth Embodiment]

Figure 24:
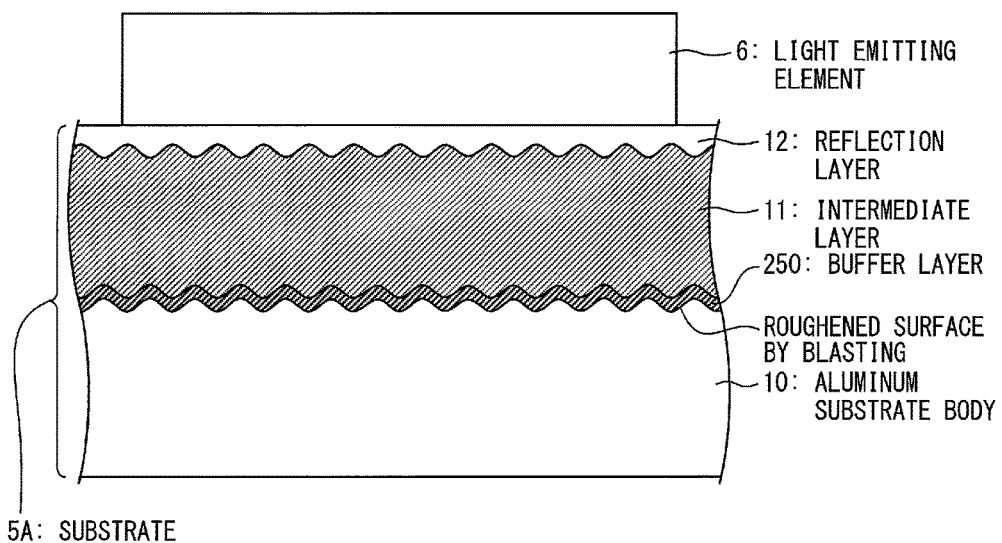
FIG. 24 is a schematic cross-sectional view of a modification example of the substrate according to the fourth embodiment of the present invention.

A modification example of the fourth embodiment of the present invention will be described below based on FIGS. 24 and 25. FIG. 24 is a schematic cross-sectional view of the modification example of the substrate 5A based on FIG. 14 of this embodiment, and FIG. 25 is a schematic cross-sectional view of another example of a modification example of the other example of the substrate 5A based on FIG. 15 of this embodiment.

Figure 25:
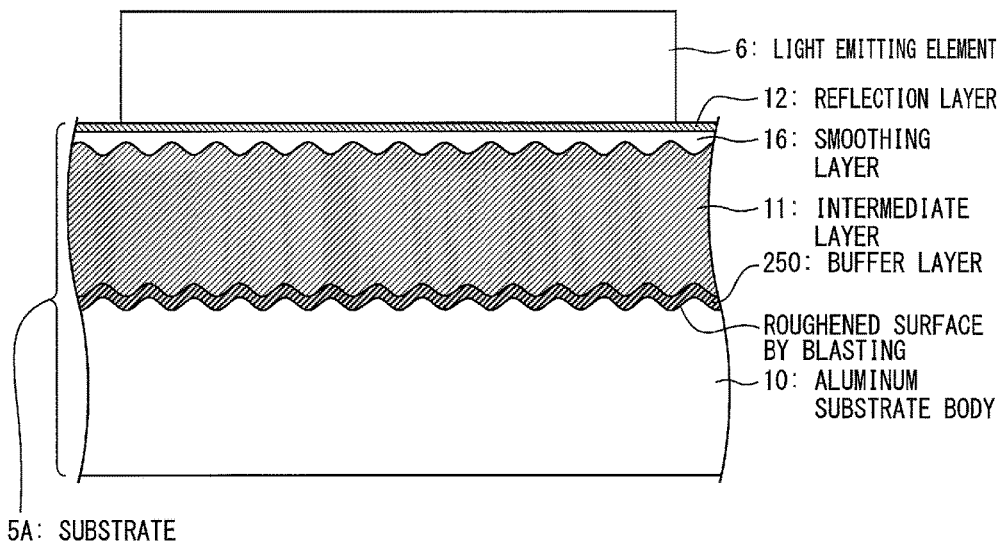
FIG. 25 is a schematic cross-sectional view that illustrates another example of the modification example of the substrate according to the fourth embodiment of the present invention.

As illustrated in FIGS. 24 and 25, a different point from the fourth embodiment is a point that the buffer layer 250 is formed between the aluminum substrate body 10 (substrate body) and the intermediate layer 11. In FIGS. 14 and 15 of the fourth embodiment, in a case where the intermediate layer 11 is formed on the aluminum substrate body 10 formed of metal to provide the substrate for light emitting devices, particularly a case where the substrate for light emitting devices is used as a substrate for high power output light emitting devices, the aluminum substrate body 10 formed of metal repeatedly expands and contracts due to an influence of the heat generated in the light emitting element 6 that is placed on the substrate 5A. Thus, the intermediate layer 11 formed on the aluminum substrate body 10 receives a mechanical load due to the difference in the linear expansion coefficient or the like between the intermediate layer 11 and the aluminum substrate body 10 and may thereby be detached or have decreased dielectric strength. Further, the light emitting element 6 itself placed on the substrate 5A is influenced by a thermal history due to the difference in the linear expansion coefficient or the like between the light emitting element 6 and the aluminum substrate body 10 and may thereby have a shorter life. Accordingly, in the modification example of the fourth embodiment, as illustrated in FIGS. 24 and 25, the buffer layer 250 is formed between the aluminum substrate body 10 (substrate body) and the intermediate layer 11.

The buffer layer 250 is similar to the buffer layer described in the modification example of the first embodiment and is described in the modification example of the first embodiment. Thus, a description thereof will not be made here.

In the modification example of the fourth embodiment, aluminum is used as the material of the substrate body. However, the substrate body is not limited as long as the substrate is formed of a material with high thermal conduction. For example, a substrate formed of metal that contains aluminum, copper, stainless steel, or iron as a material may be used.

[Fifth Embodiment]

The buffer layer 250 used for the substrate for light emitting devices, which is described in the first to fourth embodiments, is not limited to metal or alloys. A resin processed into a sheet shape or a resin in a paste state may instead be used as the buffer layer 250.

In this case, an additive may appropriately be added in order to adjust the physical properties such as the thermal conductivity and the linear expansion coefficient of the buffer layer 250. Ceramic particles, glass fibers, metal particles, and so forth are raised as additives.

The resin that configures the buffer layer 250 may be configured with epoxy resin, silicone resin, polyimide resin or fluororesin, which have high heat resistance. More specifically, a commercially available insulating sheet for a heat-dissipating substrate may be used as the buffer layer 250.

The linear expansion coefficient of the commercially available insulating sheet for a heat-dissipating substrate is $10 \times 10^{-6}/°C$. to $15 \times 10^{-6}/°C$. and exhibits an intermediate linear expansion coefficient between a linear expansion coefficient $23 \times 10^{-6}/°C$. of aluminum and a linear expansion coefficient $7 \times 10^{-6}/°C$. of alumina as a representative ceramic material in a case where an epoxy-based resin is used as a binder for ceramic particles. Further, the thermal conductivity of 5 W/(m·K) and the dielectric strength of 5 kV or more for a thickness of 100 μm exhibit high thermal conduction and dielectric strength.

As described above, in a case of using a resin layer for the buffer layer 250, the reflection layer 12 that contains ceramic particles with a resin binder is preferably used. In a case of using a resin layer for the buffer layer 250, in order to use a glass-based binder for the reflection layer 12, damage due to the heat received by the resin layer containing the buffer layer 250 has to be reduced by setting drying and firing temperatures to 300° C. or less and preferably 250° C. or less.

[Sixth Embodiment]

In this embodiment, a description will be made about the light emitting device 4 that is made by using the substrate 5A described in the first embodiment. This embodiment is applicable to the substrate 5A, the substrate 5B, and the substrate 5C according to the first to fifth embodiments. FIG. 16(a) is a plan view of the light emitting device 4 according to this embodiment, and FIG. 16(b) is an arrow cross-sectional view of FIG. 16(a) taken along line D-D. In the drawing, a large number of the light emitting elements 6 are omitted for convenience and simplification of the description.

The light emitting device 4 is a light emitting device of a chip on board (COB) type, in which plural light emitting elements 6 such as LED elements or EL elements are implemented on the substrate 5A.

A frame body 8 that is provided in a circumference of a sealing resin 7 and surrounds a periphery of the plural light emitting elements 6 is provided on the substrate 5A. An internal portion of the frame body 8 is filled with the sealing resin 7, and the light emitting elements 6 are thereby sealed. The sealing resin 7 contains a phosphor that is excited by emission light from the light emitting elements 6 and converts the emission light into light at a different wavelength. In this configuration, the light emitting elements 6 perform surface light emission on a surface of the sealing resin 7.

Figure 17:
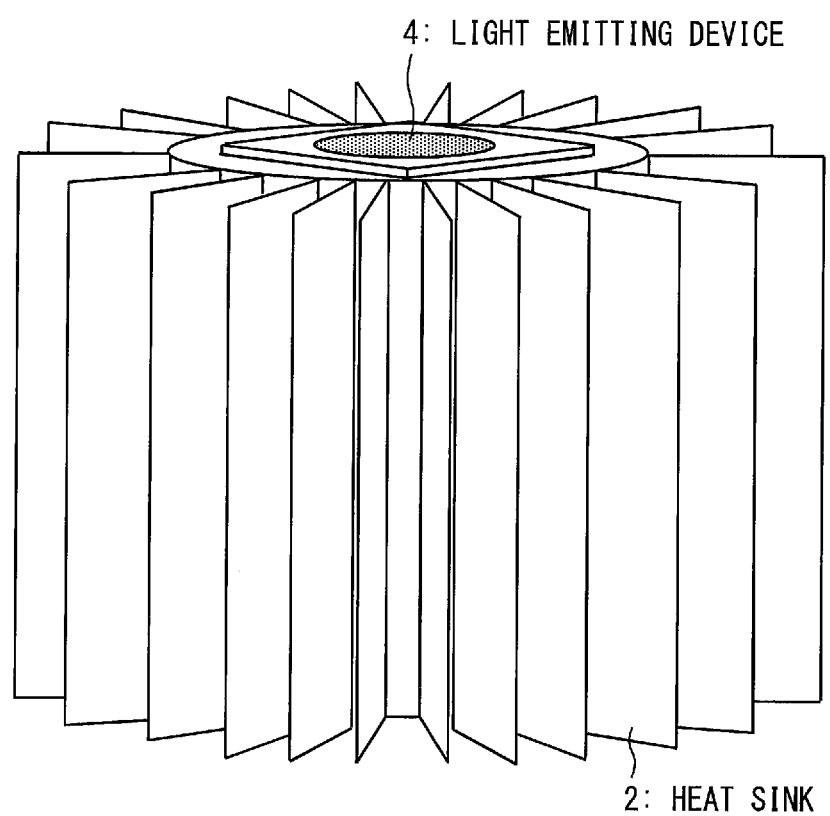
FIG. 17 is a bird's-eye view of the light emitting device according to the sixth embodiment of the present invention, which is mounted on a heat sink.

Because a large number of the light emitting elements 6 are integrated, input power of 10, 50, 100, 100 W or more, or the like to the light emitting device 4 is used, and high luminance emission light may thereby be obtained. For example, in order to integrate medium-sized light emitting elements 6 of approximately 500 μm×800 μm on the substrate 5A and realize a high-output light emitting device 4 with input power of approximately 100 W, a large number such as approximately 300 to 400 of the light emitting elements 6 have to be integrated. Because a large number of the light emitting elements 6 are integrated and the heat generation by the light emitting device 4 becomes high, as illustrated in FIG. 17, high heat dissipation may be secured by the heat sink 2 with a very large volume compared to the light emitting device 4. FIG. 17 is a bird's-eye view of the light emitting device 4 that is mounted on the heat sink.

Examples of the light emitting element 6 to be used may include blue LEDs, violet LEDs, ultra-violet LEDs, and so forth. Examples of the phosphor that fills the sealing resin 7 may include phosphors that emit light in any one color of blue, green, yellow, orange, and red or arbitrary combinations of plural phosphors. Those enable emission light in desired color to be emitted from the light emitting device 4. While the phosphor of the sealing resin 7 is omitted, the light emitting elements 6 of three colors of blue, green, and red, which have different light emission wavelengths, may be aligned on the substrate 5A. An arbitrary combination of two colors or a single color may be used.

The light emitting elements 6 are connected with the positive electrode pattern 20a and the negative electrode pattern 20b. The positive electrode pattern 20a is connected with a positive electrode connector 21a for connecting the light emitting elements 6 with external wiring or an external device via the positive electrode pattern 20a. The negative electrode pattern 20b is connected with a negative electrode connector 21b for connecting the light emitting elements 6 with external wiring or an external device via the negative electrode pattern 20b. The positive electrode connector 21a and the negative electrode connector 21b are configured with lands, and the positive electrode pattern 20a and the negative electrode pattern 20b may be connected with external wiring or an external device by soldering.

In a case where the positive electrode pattern 20a and the negative electrode pattern 20b are connected with external wiring or an external device by the positive electrode connector 21a and the negative electrode connector 21b, the lands are provided for the positive electrode pattern 20a and the negative electrode pattern 20b, and the positive electrode pattern 20a and the negative electrode pattern 20b may thereby be connected with the positive electrode connector 21a and the negative electrode connector 21b, respectively, via the lands.

Figure 18:
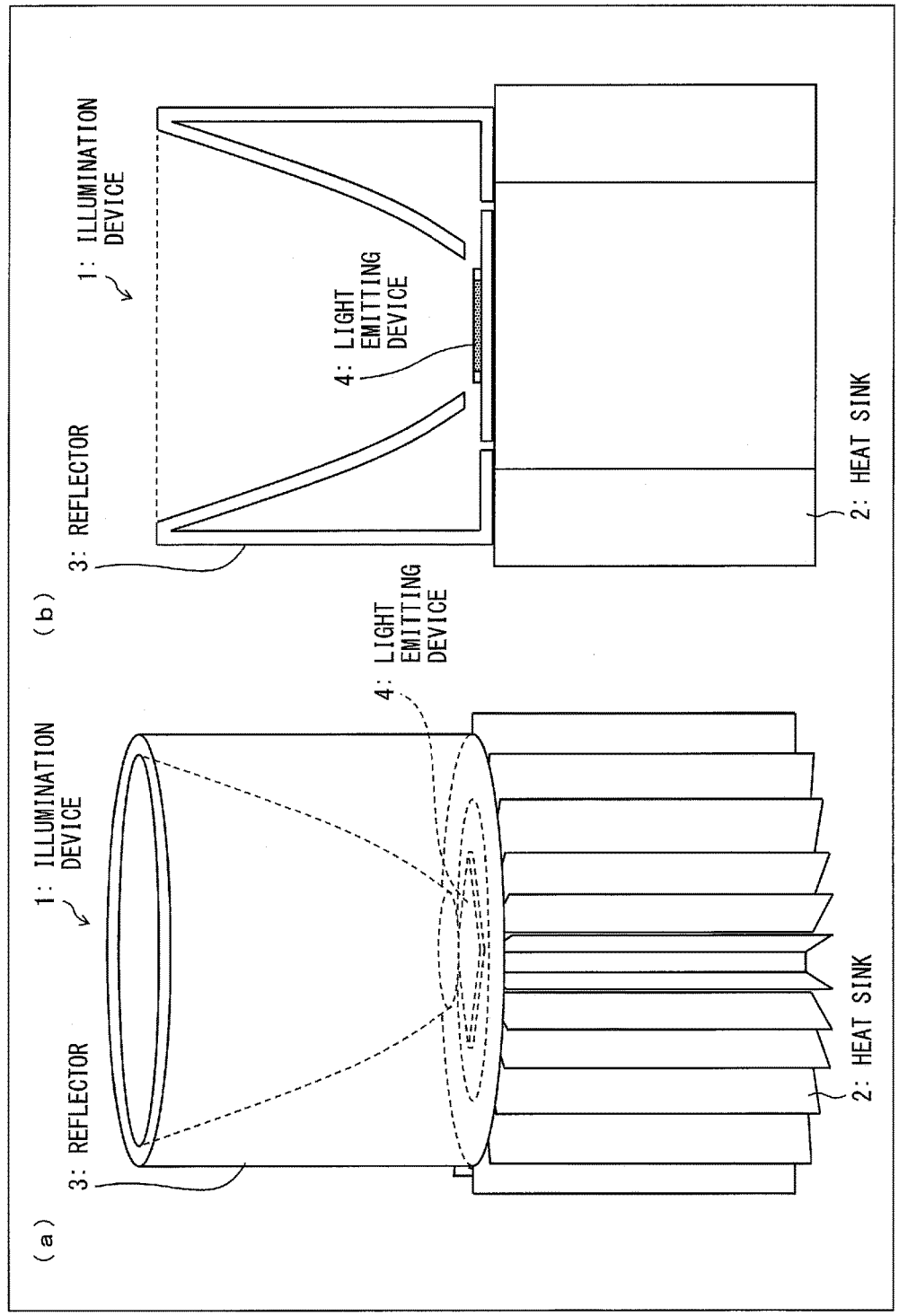
FIG. 18(a) is a bird's-eye view of an illumination device to which the light emitting device according to the sixth embodiment of the present invention is applied.
FIG. 18(b) is a cross-sectional view thereof.
Figure 19:
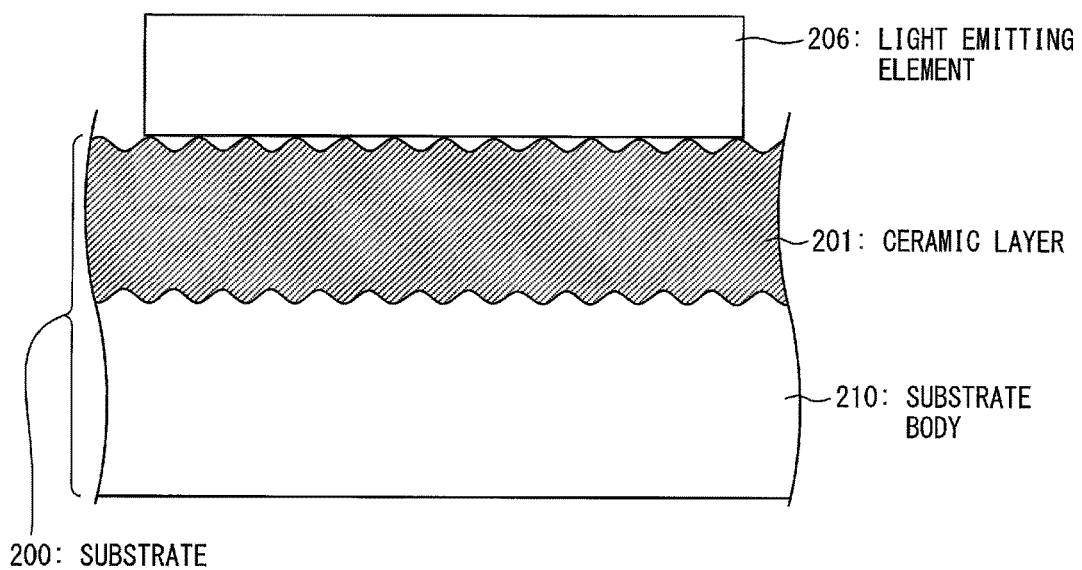
FIG. 19 is a schematic cross-sectional view of a substrate in related art.

Further, the light emitting device 4 may be applied to an illumination device 1 illustrated in FIG. 18, for example. FIG. 18(*a*) is a bird's-eye view of the illumination device 1 to which the light emitting device 4 according to the sixth embodiment is applied, and FIG. 18(*b*) is a cross-sectional view of FIG. 18(*a*). The illumination device 1 includes the light emitting device 4, the heat sink 2 for heat dissipation of the heat generated by the light emitting device 4, and a reflector 3 that reflects light emitted from the light emitting device 4.

[Additional Matters]

In the first to sixth embodiment, in a case where the light emitting element 6 is formed with a sapphire substrate, a high quality and fine ceramic layer formed by the thermal spraying, for example, an alumina layer is interposed between the light emitting element 6 and the aluminum substrate body 10, and the ceramic layer whose linear expansion coefficient is close to the light emitting element 6 thereby works as a buffer layer. Thus, shortening of life of the light emitting element 6 due to expansion and contraction of the aluminum substrate body 10 does not occur. Accordingly, even if a load due to a temperature cycle is applied, an output decrease, that is, shortening of life of the light emitting element 6 does not occur.

[Conclusion]

A substrate (substrate 5A or 5B) for light emitting devices according to a first aspect of the present invention includes: a substrate body (aluminum substrate body 10) that is formed of a metal material; a first insulating layer (reflection layer 12) that is formed between an electrode pattern (20) which obtains electrical connection with a light emitting element (6) and the substrate body and that contains first ceramics which reflect light from the light emitting element; and a second insulating layer (intermediate layer 11 or protection layer 14) that contains second ceramics which are formed by thermal spraying and reinforces dielectric strength performance of the first insulating layer. Further, a substrate (substrate 5A or 5B) for light emitting de vices according to a fist aspect of the present invention includes: a substrate body (aluminum substrate body 10) that is formed of a metal material; a first insulating layer (reflection layer 12) that is formed between an electrode pattern (20) which obtains electrical connection with a light emitting element (6) and the substrate body and that contains first ceramics which reflect light from the light emitting element; a second insulating layer (intermediate layer 11) that is formed of thermally sprayed second ceramics and reinforces dielectric strength performance of the first insulating layer, the second insulating layer covering a portion of the substrate body; and a protection layer (13) that covers a remaining portion of or whole the substrate body.

In the above configuration, the substrate for light emitting devices includes the first insulating layer that contains the first ceramics which reflect light from the light emitting element. Thus, the substrate for light emitting devices has high reflectance, heat resistance, and light resistance. Further, the second insulating layer contains the second ceramics and is formed by the thermal spraying. Accordingly, the second insulating layer may be formed as a fine ceramic layer and thus may stably secure high dielectric strength characteristics and high thermal conductivity. In addition, the second insulating layer may have an increased thickness while the thermal resistance is maintained low. Thus, the dielectric strength performance of the first insulating layer may be reinforced while the thermal resistance is maintained low. As a result, a substrate for light emitting devices that has long-term reliability with high reflectance, high heat dissipation, high dielectric strength, thermal resistance, and light resistance and further with high mass productivity may be provided.

According to a second aspect of the present invention, in the substrate (substrate 5A or 5B) for light emitting devices of the first aspect, the first insulating layer (reflection layer 12) may be a mixed layer of the first ceramics and a vitreous material or a mixed layer of the first ceramics and a resin, and the thermal conductivity of the second insulating layer (intermediate layer 11 or protection layer 14) may be higher than the thermal conductivity of the first insulating layer.

In the above configuration, because the first insulating layer is a mixed layer of the first ceramics and a vitreous material or a mixed layer of the first ceramics and a resin, the first insulating layer may be formed by the sol-gel reaction or a curing reaction. Further, the thermal conductivity of the second insulating layer is higher than the thermal conductivity of the first insulating layer. Thus, the thermal conductivity of the second insulating layer may be increased compared to the first insulating layer while high dielectric strength is maintained.

According to a third aspect of the present invention, in the substrate (substrate 5A or 5B) for light emitting devices of the first aspect, the substrate body (aluminum substrate body 10) may include an aluminum material or a copper material.

In the above configuration, the substrate body may include an aluminum material or a copper material. Thus, a material with a light weight, high processability, and high thermal conductivity may be used as a material of the substrate body.

According to a fourth aspect of the present invention, in the substrate (substrate 5A) for light emitting devices of the first aspect, the substrate body (aluminum substrate body 10) may include an aluminum material, the second insulating layer (intermediate layer 11) may cover a portion of the substrate body, and the substrate for light emitting devices may further include an anodized aluminum layer (protection layer 13) that covers a remaining portion of or whole the substrate body.

In the above configuration, the substrate body may be covered by the second insulating layer and the anodized aluminum layer. Thus, in producing steps of the substrate, the second insulating layer and the anodized aluminum layer protect the substrate body from a plating solution in a plating treatment necessary for forming the electrode pattern and simultaneously function as protection layers that reduce deposition of extra plating. After the substrate is completed, corrosion due to oxidation may be avoided.

According to a fifth aspect of the present invention, in the substrate (substrate 5A) for light emitting devices of the first aspect, the second insulating layer (intermediate layer 11) may be formed between the first insulating layer (reflection layer 12) and the substrate body (aluminum substrate body 10).

In the above configuration, the second insulating layer is formed between the first insulating layer and the substrate body. Thus, the dielectric strength performance of the first insulating layer may be reinforced by the second insulating layer formed between the first insulating layer and the substrate body.

According to a sixth aspect of the present invention, in the substrate (substrate 5A) for light emitting devices of the fifth aspect, the thickness of the second insulating layer (intermediate layer 11) may be 50 µm or more and 500 µm or less, and the thickness of the first insulating layer (reflection layer 12) may be 10 µm or more and 100 µm or less.

In the above configuration, the second insulating layer may preferably reinforce the dielectric strength performance of the first insulating layer, and the first insulating layer may preferably reflect light from the light emitting element.

According to a seventh aspect of the present invention, in the substrate (substrate 5B) for light emitting devices of the first aspect, the second insulating layer (protection layer 14) may be formed on a surface of the substrate body (aluminum substrate body 10) on the opposite side from the first insulating layer (reflection layer 12) side.

In the above configuration, in the substrate for light emitting devices, the second insulating layer with low thermal conductivity compared to the substrate body is arranged in a separated position from the light emitting element 6. Thus, the heat diffuses in the horizontal direction, which is parallel to the surface of the substrate for light emitting devices, before passing through the second insulating layer. As a result, the thermal resistance of the second insulating layer may be reduced even if the thickness and thermal conductivity are the same as the second insulating layer in the fifth aspect.

According to an eighth aspect of the present invention, in the substrate (substrate 5B) for light emitting devices of the seventh aspect, the thickness of the second insulating layer (protection layer 14) may be 50 μm or more, and the thickness of the first insulating layer (reflection layer 12) may be 10 μm or more and 100 μm or less.

In the above configuration, the second insulating layer may preferably reinforce the dielectric strength performance of the first insulating layer, and the first insulating layer may preferably reflect light from the light emitting element.

According to a ninth aspect of the present invention, in the substrate (substrate 5A or 5B) for light emitting devices of the first aspect, the second insulating layer (intermediate layer 11 or protection layer 14) may include an alumina layer, and the first insulating layer (reflection layer 12) may be formed by covering any of zirconia particles, titanium oxide particles, alumina particles, or aluminum nitride particles by a vitreous material.

In the above configuration, the second insulating layer includes the alumina layer. Thus, the second insulating layer has high thermal conductive characteristics and dielectric strength performance. Further, the first insulating layer is formed by covering any of zirconia particles, titanium oxide particles, alumina particles, or aluminum nitride particles by a vitreous material. Thus, the first insulating layer has high reflectance, high dielectric strength performance, and high thermal conductivity. Further, the first insulating layer has a vitreous material and thus has high heat resistance and light resistance and enhanced dielectric strength.

According to a tenth aspect of the present invention, in the substrate (substrate 5A or 5B) for light emitting devices of the first aspect, the second insulating layer (intermediate layer 11 or protection layer 14) may include an alumina layer, the first insulating layer (reflection layer 12) may include a resin that contains any of zirconia particles, titanium oxide particles, alumina particles, or aluminum nitride particles, and the resin may be silicone resin, fluororesin, or epoxy resin.

In the above configuration, the second insulating layer includes the alumina layer. Thus, the second insulating layer has high thermal conductive characteristics and dielectric strength performance. Further, the first insulating layer includes silicone resin, fluororesin, or epoxy resin that contains any of zirconia particles, titanium oxide particles, alumina particles, or aluminum nitride particles. Thus, the first insulating layer has high reflectance and high dielectric strength performance. Further, because the curing temperature of the resin is low, formation is easy in a case where the resin is used as a binder for formation of the first insulating layer compared to a case where a vitreous material is formed by using the sol-gel reaction.

A light emitting device (4) according to an eleventh aspect of the present invention may include: the substrate (substrate 5A or 5B) for light emitting devices according to the first aspect; the light emitting element (6); a land or a connector (positive electrode connector 21a and negative electrode connector 21b) that connects the light emitting element (6) with external wiring or an external device via the electrode pattern (20); a frame body (8) that is formed to surround the light emitting element; and a sealing resin (7) that seals the light emitting element which is surrounded by the frame body.

The above configuration may provide a light emitting device that provides a similar effect to the substrate for light emitting devices according to the first aspect.

A method for producing a substrate for light emitting devices according to a twelfth aspect of the present invention is the method for producing the substrate for light emitting devices according to the fifth aspect, and the method may include: forming the second insulating layer (intermediate layer 11) on the substrate body by the thermal spraying; forming the first insulating layer (reflection layer 12) on the second insulating layer; and forming the electrode pattern (20) on the first insulating layer. Further, a method for producing a substrate for light emitting devices according to a twelfth aspect of the present invention is a method for producing a substrate for light emitting devices, the substrate including a substrate body (aluminum substrate body 10) that is formed of a metal material, the method including: forming an insulating layer (intermediate layer 11) by thermal spraying so as to cover a portion of the substrate body; forming another insulating layer (reflection layer 12) on the insulating layer, the another insulating layer containing ceramics which reflect light from a light emitting element (6); forming a protection layer (13) so as to cover a remaining portion of or whole the substrate body; and forming an electrode pattern (20) on the another insulating layer to obtain electrical connection with the light emitting element.

The above configuration provides a similar effect to the effect of the substrate for light emitting devices according to the fifth aspect.

According to a thirteenth aspect of the present invention, in the method for producing a substrate for light emitting devices of the twelfth aspect, the second insulating layer (intermediate layer 11) may include an alumina layer, and the alumina layer may be formed by the thermal spraying of alumina.

In the above configuration, the second insulating layer includes the alumina layer. Thus, the second insulating layer has high thermal conductive characteristics and dielectric strength performance. Further, the second insulating layer is formed by the thermal spraying. Accordingly, the second insulating layer is formed as a fine alumina layer and thus may stably secure high dielectric strength characteristics and high thermal conductivity.

According to a fourteenth aspect of the present invention, in the method for producing a substrate for light emitting devices of the twelfth aspect, the first insulating layer (reflection layer 12) may be a mixed layer of the first ceramics and a vitreous material, and the vitreous material may be formed by the sol-gel reaction of a glass raw material.

In the above configuration, the first insulating layer is a mixed layer of the first ceramics and a vitreous material. Thus, the first insulating layer has the first ceramics and thus has high reflectance, high dielectric strength performance, and high thermal conductivity. Further, the first insulating layer has a vitreous material and thus has high heat resistance and light resistance and enhanced dielectric strength.

According to a fifteenth aspect of the present invention, in the method for producing a substrate for light emitting devices of the twelfth aspect, the second insulating layer (intermediate layer 11) may include an alumina layer, the first insulating layer (reflection layer 12) may be a mixed layer of the first ceramics and a vitreous material, the alumina layer may be formed by the thermal spraying of alumina, and the vitreous material may be formed by the sol-gel reaction of a glass raw material.

In the above configuration, the second insulating layer includes the alumina layer. Thus, the second insulating layer has high thermal conductive characteristics and dielectric strength performance. Further, the second insulating layer is formed by the thermal spraying. Accordingly, the second insulating layer is formed as a fine alumina layer and thus may stably secure high dielectric strength characteristics and high thermal conductivity. In addition, the first insulating layer is a mixed layer of the first ceramics and a vitreous material. Thus, the first insulating layer has the first ceramics and thus has high reflectance, high dielectric strength performance, and high thermal conductivity. Further, the first insulating layer has a vitreous material and thus has high heat resistance and light resistance and enhanced dielectric strength.

According to a sixteenth aspect of the present invention, in the method for producing a substrate for light emitting devices of the twelfth aspect, the second insulating layer (intermediate layer 11) may include an alumina layer, the first insulating layer (reflection layer 12) may be a mixed layer of the first ceramics and a vitreous material, the alumina layer may be formed by the thermal spraying of alumina, and the vitreous material may be formed by melting and curing glass particles.

In the above configuration, the second insulating layer includes the alumina layer. Thus, the second insulating layer has high thermal conductive characteristics and dielectric strength performance. Further, the second insulating layer is formed by the thermal spraying. Accordingly, the second insulating layer is formed as a fine alumina layer and thus may stably secure high dielectric strength characteristics and high thermal conductivity. In addition, the first insulating layer is a mixed layer of the first ceramics and a vitreous material. Thus, the first insulating layer has the first ceramics and thus has high reflectance, high dielectric strength performance, and high thermal conductivity. Further, the first insulating layer has a vitreous material and thus has high heat resistance and light resistance and enhanced dielectric strength.

A method for producing a substrate for light emitting devices according to a seventeenth aspect of the present invention is a method for producing the substrate (substrate 5B) for light emitting devices according to the seventh aspect, and the method may include: forming the first insulating layer (reflection layer 12) on the substrate body (aluminum substrate body 10); forming the second insulating layer (protection layer 14) on a surface of the substrate body on the opposite side from the first insulating layer side; and forming the electrode pattern on the first insulating layer.

The above configuration provides a similar effect to the effect of the substrate for light emitting devices according to the seventh aspect.

A substrate (substrate 5C) for light emitting devices according to an eighteenth aspect of the present invention includes: a substrate body (aluminum substrate body 10) that is formed of a metal material; and an insulating layer (insulating reflection layer 15) that contains ceramics which are formed by thermal spraying and a white inorganic material which enhances whiteness of the ceramics and is formed between the electrode pattern (20) and the substrate body to obtain electrical connection with a light emitting element (6).

In the above configuration, the substrate for light emitting devices includes the insulating layer that contains the ceramics formed by the thermal spraying. Accordingly, the insulating layer may be formed as a fine ceramic layer and thus may stably secure high dielectric strength characteristics and high thermal conductivity. Further, the substrate for light emitting devices contains the white inorganic material that enhances the whiteness of the ceramics. Thus, the substrate for light emitting devices may reflect light from the light emitting element and has high reflectance, heat resistance, and light resistance. In addition, the substrate for light emitting devices may reinforce the dielectric strength performance by the insulating layer while the thermal resistance is maintained low. As a result, a substrate for light emitting devices that has long-term reliability with high reflectance, high heat dissipation, high dielectric strength, thermal resistance, and light resistance and further with high mass productivity may be provided.

According to a nineteenth aspect of the present invention, in the substrate (substrate 5A) for light emitting devices of the first aspect, a buffer layer (250) that is formed of a substance with a lower linear expansion coefficient than the substrate body may be formed between the substrate body (aluminum substrate body 10) and the second insulating layer (intermediate layer 11).

In the above configuration, in the substrate for light emitting devices, the buffer layer with a lower linear expansion coefficient than the substrate body is formed between the substrate body and the second insulating layer. Thus, the transmission of a mechanical load due to thermal expansion and contraction of the substrate body to the light emitting element may be significantly reduced. Accordingly, the lives of the light emitting element and further the light emitting device may be extended, and reliability may be improved.

In addition, the buffer layer 250 may be formed of a substance with a lower linear expansion coefficient than the substrate body but with a higher linear expansion coefficient than the second insulating layer (intermediate layer 11). Further a substrate (substrate 5C) for light emitting devices according to a twentieth aspect of the present invention includes: a substrate body (aluminum substrate body 10) that is formed of a metal material; and an insulating layer (insulating reflection layer 15) that contains thermally sprayed ceramics and a white inorganic material which enhances whiteness of the ceramics and is formed between an electrode pattern (20) and the substrate body to obtain electrical connection with a light emitting element (6). According to a twenty first aspect of the present invention, in the substrate (substrate 5C) for light emitting devices of the twentieth aspect of the present invention, a buffer layer (250) that is formed of a substance with a lower linear expansion coefficient than the substrate body (aluminum substrate body 10) may be formed between the substrate body and the insulating layer (insulating reflection layer 15).

According to a twenty second aspect of the present invention, the substrate (substrate 5C) for light emitting devices of the twentieth aspect of the present invention may be such that the insulating layer (insulating reflection layer 15) covers a portion of the substrate body (aluminum substrate body 10), and the substrate further includes a protection layer (13) that covers a remaining portion of or whole the substrate body. According to a twenty third aspect of the present invention, in the substrate (substrate 5C) for light emitting devices of the twentieth aspect of the present invention, the substrate body (aluminum substrate body 10) includes an aluminum material, and the protection layer (13) may be an anodized aluminum layer.

The present invention is not limited to the above-described embodiments. Various modifications are possible in the scope recited in claims, and embodiments that are obtained by appropriately combining technical means that are disclosed in the different embodiments are included in the technical scope of the present invention. In addition, new technical features may be formed by combining technical means that are disclosed in the embodiments.

INDUSTRIAL APPLICABILITY

The substrate for light emitting devices according to the present invention is usable as a substrate for various kinds of light emitting devices. The light emitting device according to the present invention may particularly be used as a high luminance LED light emitting device. The method for producing a substrate for light emitting devices according to the present invention enables a substrate for light emitting device with high dielectric strength and heat dissipation to be produced in a method with high mass productivity.

REFERENCE SIGNS LIST 1 illumination device
2 heat sink
4 light emitting device
5A, 5B, 5C substrate (substrate for light emitting devices)
6 light emitting element
7 sealing resin
8 frame body
10 aluminum substrate body (substrate body)
11 intermediate layer (second insulating layer)
12 reflection layer (first insulating layer)
13 protection layer (anodized aluminum layer)
14 protection layer (second insulating layer)
15 insulating reflection layer (insulating layer)
20 electrode pattern
21a positive electrode connector (connector)
21b negative electrode connector (connector)
250 buffer layer

The invention claimed is:

1. A substrate for light emitting devices, the substrate comprising:
   a substrate body that is made of a metal material and includes an upper surface, a lower surface, and lateral side surfaces;
   a first insulating layer that is between an electrode pattern that electrically connects to a light emitting element and the substrate body, and that contains first ceramics which reflect light from the light emitting element;
   a second insulating layer that includes thermally sprayed second ceramics and reinforces dielectric strength performance of the first insulating layer, the second insulating layer covering a first portion of the substrate body; and
   a protection layer that covers a second portion of the substrate body that is not covered by the second insulating layer, the second portion of the substrate body including at least a portion of one of the lateral side surfaces of the substrate body, wherein
   the second insulating layer is between the first insulating layer and the substrate body, and
   the upper surface of the substrate body has an uneven shape defined by a blasting treatment so that an interface between the substrate body and the second insulating layer has an uneven shape.

2. The substrate for light emitting devices according to claim 1, wherein a buffer layer that is made of a substance with a lower linear expansion coefficient than the substrate body is between the substrate body and the second insulating layer.

3. The substrate for light emitting devices according to claim 1, wherein
   the first insulating layer is a mixed layer of the first ceramics and a vitreous material or a mixed layer of the first ceramics and a resin, and
   a thermal conductivity of the second insulating layer is higher than a thermal conductivity of the first insulating layer.

4. The substrate for light emitting devices according to claim 1, wherein
   a thickness of the second insulating layer is 50 µm or more and 500 µm or less, and
   a thickness of the first insulating layer is 10 µm or more and 100 µm or less.

5. The substrate for light emitting devices according to claim 1, wherein
   the second insulating layer includes an alumina layer, and
   the first insulating layer includes any of zirconia particles, titanium oxide particles, alumina particles, or aluminum nitride particles covered by a vitreous material.

6. The substrate for light emitting devices according to claim 1, wherein
   the second insulating layer includes an alumina layer,
   the first insulating layer includes a resin that contains any of zirconia particles, titanium oxide particles, alumina particles, or aluminum nitride particles, and
   the resin is silicone resin, fluororesin, or epoxy resin.

7. The substrate for light emitting devices according to claim 1, wherein
   the substrate body includes an aluminum material, and
   the protection layer is an anodized aluminum layer.

8. A substrate for light emitting devices, the substrate comprising:
   a substrate body that is made of a metal material and includes an upper surface, a lower surface, and lateral side surfaces;
   an insulating layer that covers a first portion of the substrate body and includes thermally sprayed ceramics and a white inorganic material which enhances whiteness of the ceramics and is between an electrode pattern and the substrate body to electrically connect to a light emitting element; and
   a protection layer that covers a second portion of the substrate body that is not covered by the insulating layer, the second portion of the substrate body including at least a portion of one of the lateral side surfaces of the substrate body, wherein the upper surface of the substrate body has an uneven shape defined by a blasting treatment so that an interface between the substrate body and the insulating layer has an uneven shape.

9. The substrate for light emitting devices according to claim 8, wherein a buffer layer that is made of a substance with a lower linear expansion coefficient than the substrate body is between the substrate body and the insulating layer.

10. The substrate for light emitting devices according to claim 8, wherein
the substrate body includes an aluminum material, and
the protection layer is an anodized aluminum layer.

11. A light emitting device comprising:
the substrate for light emitting devices according to claim 1;
the light emitting element;
a land or a connector that connects the light emitting element with external wiring or an external device via the electrode pattern;
a frame body that surrounds the light emitting element; and
a sealing resin that seals the light emitting element which is surrounded by the frame body.

12. A light emitting device comprising:
the substrate for light emitting devices according to claim 8;
the light emitting element;
a land or a connector that connects the light emitting element with external wiring or an external device via the electrode pattern;
a frame body that surrounds the light emitting element; and
a sealing resin that seals the light emitting element which is surrounded by the frame body.

13. The substrate for light emitting devices according to claim 1, further comprising a smoothing layer between the first insulating layer and the second insulating layer, the smoothing layer smooths an installation surface of the light emitting element.

14. The substrate for light emitting devices according to claim 8, further comprising a smoothing layer between the electrode pattern and the insulating layer, the smoothing layer smooths an installation surface of the light emitting element.

* * * * *